(12) United States Patent
Choi et al.

(10) Patent No.: US 10,490,741 B2
(45) Date of Patent: *Nov. 26, 2019

(54) ELECTRONIC DEVICE AND METHOD FOR FABRICATING THE SAME

(71) Applicant: SK hynix Inc., Icheon-Si (KR)

(72) Inventors: Won-Joon Choi, Icheon-si (KR);
Ki-Seon Park, Icheon-si (KR);
Cha-Deok Dong, Icheon-si (KR);
Bo-Mi Lee, Icheon-si (KR);
Guk-Cheon Kim, Icheon-si (KR);
Seung-Mo Noh, Icheon-si (KR);
Min-Suk Lee, Icheon-si (KR);
Chan-Sik Park, Icheon-si (KR);
Jae-Heon Kim, Icheon-si (KR);
Choi-Dong Kim, Icheon-si (KR);
Jae-Hong Kim, Icheon-si (KR);
Yang-Kon Kim, Icheon-si (KR);
Jong-Koo Lim, Icheon-si (KR)

(73) Assignee: SK hynix Inc., Icheon-si (KR)

(\*) Notice: Subject to any disclaimer, the term of this patent is extended or adjusted under 35 U.S.C. 154(b) by 192 days.

This patent is subject to a terminal disclaimer.

(21) Appl. No.: 15/353,683

(22) Filed: Nov. 16, 2016

(65) Prior Publication Data

US 2017/0062712 A1    Mar. 2, 2017

Related U.S. Application Data

(63) Continuation-in-part of application No. 14/846,812, filed on Sep. 6, 2015, now Pat. No. 9,865,319, and a
(Continued)

(30) Foreign Application Priority Data

Jun. 5, 2013   (KR) .................. 10-2013-0064700
Sep. 30, 2013  (KR) .................. 10-2013-0116109
(Continued)

(51) Int. Cl.
 *G11C 11/00* (2006.01)
 *H01L 45/00* (2006.01)
 (Continued)

(52) U.S. Cl.
 CPC ........ *H01L 45/1233* (2013.01); *G11C 11/161* (2013.01); *H01L 43/02* (2013.01);
 (Continued)

(58) Field of Classification Search
 CPC ..... H01L 45/1233; H01L 43/02; H01L 43/08; H01L 43/10; H01L 43/12; G11C 11/161
 (Continued)

(56) References Cited

U.S. PATENT DOCUMENTS 6,114,719 A    9/2000 Dill
7,046,489 B2   5/2006 Camiguchi et al.
(Continued)

FOREIGN PATENT DOCUMENTS

JP   2007243115 A    9/2007
JP   2012019105 A    1/2012
(Continued)

OTHER PUBLICATIONS

USPTO Non-Final Office Action for U.S. Appl. No. 14/295,229, dated Sep. 27, 2017 (24 pages).
(Continued)

*Primary Examiner* — Vu A Le
(74) *Attorney, Agent, or Firm* — Perkins Coie LLP

(57) ABSTRACT

Methods, systems, and devices are disclosed for implementing semiconductor memory using variable resistance ele-
(Continued)

ments for storing data. In one aspect, an electronic device is provided to comprise a semiconductor memory unit including: a substrate; an interlayer dielectric layer disposed over the substrate; and a variable resistance element including a seed layer formed over the interlayer dielectric layer, a first magnetic layer formed over the seed layer, a tunnel barrier layer formed over the first magnetic layer, and a second magnetic layer formed over the tunnel barrier layer, wherein the seed layer includes a conductive material having a metallic property and an oxygen content of 1% to approximately 10%.

7 Claims, 32 Drawing Sheets

Related U.S. Application Data continuation-in-part of application No. 14/621,646, filed on Feb. 13, 2015, now Pat. No. 9,786,840, and a continuation-in-part of application No. 14/295,229, filed on Jun. 3, 2014, now Pat. No. 10,205,089, said application No. 14/621,646 is a continuation of application No. 14/229,745, filed on Mar. 28, 2014, now Pat. No. 8,959,250, and a continuation-in-part of application No. 14/158,702, filed on Jan. 17, 2014, now Pat. No. 9,502,639.

(30) Foreign Application Priority Data

Feb. 28, 2014 (KR) .................. 10-2014-0024029
Dec. 17, 2014 (KR) .................. 10-2014-0182542

(51) Int. Cl.
| | |
|---|---|
| H01L 43/12 | (2006.01) |
| H01L 43/02 | (2006.01) |
| H01L 43/08 | (2006.01) |
| H01L 43/10 | (2006.01) |
| G11C 11/16 | (2006.01) |

(52) U.S. Cl.
CPC .............. *H01L 43/08* (2013.01); *H01L 43/10* (2013.01); *H01L 43/12* (2013.01); *H01L 45/06* (2013.01); *H01L 45/141* (2013.01); *H01L 45/146* (2013.01); *H01L 45/16* (2013.01)

(58) Field of Classification Search
USPC ...................................................... 365/171
See application file for complete search history.

(56) References Cited

U.S. PATENT DOCUMENTS

| | | | |
|---|---|---|---|
| 8,084,835 | B2 | 12/2011 | Ranjan et al. |
| 9,130,155 | B2 | 9/2015 | Chepulskyy et al. |
| 9,865,806 | B2 | 1/2018 | Choi et al. |
| 2002/0146895 | A1 | 10/2002 | Ramdani et al. |
| 2004/0063223 | A1 | 4/2004 | Costrini et al. |
| 2006/0098354 | A1 | 5/2006 | Parkin |
| 2006/0261425 | A1 | 11/2006 | Suemitsu et al. |
| 2007/0076471 | A1 | 4/2007 | Kano et al. |
| 2007/0187785 | A1 | 8/2007 | Hung et al. |
| 2007/0297220 | A1 | 12/2007 | Yoshikawa et al. |
| 2010/0074092 | A1 | 3/2010 | Zhu et al. |
| 2010/0080048 | A1 | 4/2010 | Liu et al. |
| 2010/0085824 | A1 | 4/2010 | Nagata |
| 2011/0089507 | A1 | 4/2011 | Mao |
| 2011/0140217 | A1 | 6/2011 | Nguyen et al. |
| 2011/0198756 | A1 | 8/2011 | Thenappan et al. |
| 2011/0228223 | A1 | 9/2011 | Jiao et al. |
| 2011/0248235 | A1 | 10/2011 | Jeong et al. |
| 2011/0297646 | A1 | 12/2011 | deVillers et al. |
| 2012/0092923 | A1 | 4/2012 | Bedeschi et al. |
| 2012/0246353 | A1 | 9/2012 | Lim |
| 2012/0326252 | A1 | 12/2012 | Yamakawa et al. |
| 2013/0005151 | A1 | 1/2013 | Chen et al. |
| 2013/0015915 | A1 | 1/2013 | Komatsu et al. |
| 2013/0043530 | A1 | 2/2013 | Kim et al. |
| 2013/0052826 | A1 | 2/2013 | Nepomnishy et al. |
| 2013/0119494 | A1 | 5/2013 | Li et al. |
| 2013/0134534 | A1 | 5/2013 | Sbiaa et al. |
| 2013/0161768 | A1 | 6/2013 | Khvalkovskiy et al. |
| 2013/0248798 | A1 | 9/2013 | Yi et al. |
| 2013/0258763 | A1 | 10/2013 | Ranjan et al. |
| 2014/0099735 | A1 | 4/2014 | Horng et al. |
| 2014/0242418 | A1 | 8/2014 | Shukh |
| 2014/0247648 | A1 | 9/2014 | Yoon |
| 2014/0327095 | A1 | 11/2014 | Kim et al. |
| 2014/0365688 | A1 | 12/2014 | Lee et al. |
| 2015/0092480 | A1 | 4/2015 | Choi et al. |
| 2015/0162526 | A1 | 6/2015 | Lee et al. |
| 2015/0249206 | A1 | 9/2015 | Kim et al. |
| 2015/0287915 | A1* | 10/2015 | Chang ................ H01L 45/06 257/4 |
| 2015/0357557 | A1 | 12/2015 | Kim et al. |
| 2016/0157715 | A1 | 6/2016 | De Boer et al. |
| 2016/0180905 | A1 | 6/2016 | Kim et al. |
| 2016/0181514 | A1 | 6/2016 | Kim et al. |
| 2016/0308121 | A1 | 10/2016 | Kim |
| 2017/0062712 | A1 | 3/2017 | Choi et al. |
| 2017/0069837 | A1 | 3/2017 | Choi et al. |

FOREIGN PATENT DOCUMENTS

| | | |
|---|---|---|
| KR | 10-2003-0000137 A | 1/2003 |
| KR | 10-2003-0054175 A | 7/2003 |
| KR | 10-2004-0005472 A | 1/2004 |
| KR | 10-2006-0000878 A | 1/2006 |
| KR | 10-0641500 B1 | 10/2006 |
| KR | 10-2006-0118311 A | 11/2006 |
| KR | 10-2007-0036704 A | 4/2007 |
| KR | 10-2007-0054551 A | 5/2007 |
| KR | 20080030384 A | 4/2008 |
| KR | 10-2009-0038809 A | 4/2009 |
| KR | 10-2010-0005449 A | 1/2010 |
| KR | 10-2010-0030054 A | 3/2010 |
| KR | 10-2010-0128219 A | 12/2010 |
| KR | 10-1055595 B1 | 8/2011 |
| KR | 10-1073132 B1 | 10/2011 |
| KR | 10-2012-0047356 A | 5/2012 |
| KR | 10-2012-0058113 A | 6/2012 |
| KR | 10-2012-0078631 A | 7/2012 |
| KR | 10-1171387 B1 | 8/2012 |
| KR | 20120086363 A | 8/2012 |
| KR | 10-1209328 B1 | 12/2012 |
| KR | 10-2013-0069097 A | 6/2013 |
| KR | 10-2014-0011138 A | 1/2014 |
| KR | 10-2014-0025165 A | 3/2014 |
| WO | 2011024455 A1 | 3/2011 |

OTHER PUBLICATIONS

USPTO Notice of Allowance for U.S. Appl. No. 14/846,812, dated Sep. 21, 2017 (20 pages).
Non-Final Office Action dated May 3, 2017 in U.S. Appl. No. 14/846,812, 50 pages.
Non-Final Office Action dated Jan. 28, 2019 in U.S. Appl. No. 15/686,816 for Lee, filed Aug. 25, 2017, 21 pages.
Office Action dated Feb. 12, 2019 in Korean Patent Application No. 10-2013-0064700, 16 pages.
USPTO Final Office Action issued for U.S. Appl. No. 14/158,702, dated Dec. 23, 2015 (10 pages).
USPTO Non-Final Office Action issued for U.S. Appl. No. 14/158,702, dated Jul. 17, 2015 (16 pages).
USPTO Notice of Allowance and Fees Due for U.S. Appl. No. 14/229,745, dated Oct. 3, 2014 (12 pages).
USPTO Non-Final Office Action issued for U.S. Appl. No. 14/295,229, dated May 22, 2015 (14 pages).

(56) References Cited

OTHER PUBLICATIONS

USPTO Non-Final Office Action issued for U.S. Appl. No. 14/621,646, dated Sep. 15, 2016 (10 pages).
USPTO Non-Final Office Action issued for U.S. Appl. No. 14/295,229, dated Oct. 11, 2016 (23 pages).
USPTO Final Office Action issued for U.S. Appl. No. 14/295,229, dated May 3, 2018 (18 pages).
USPTO Final Office Action in U.S. Appl. No. 14/295,229, dated May 4, 2017 (25 pages).

* cited by examiner

ELECTRONIC DEVICE AND METHOD FOR FABRICATING THE SAME

CROSS REFERENCE TO RELATED APPLICATIONS

This patent document is a continuation-in-part of, and claims the benefits and priorities of the following four pending patent applications:

1. U.S. patent application Ser. No. 14/158,702, filed on Jan. 17, 2014, which claims the benefit of priority of Korean Patent Application No. 10-2013-0116109, filed on Sep. 30, 2013;

2. U.S. patent application Ser. No. 14/621,646, filed on Feb. 13, 2015, which is a continuation of U.S. patent application Ser. No. 14/229,745, filed on Mar. 28, 2014, now U.S. Pat. No. 8,959,250, which claims the benefit of priority of Korean Patent Application No. 10-2013-0064700, filed on Jun. 5, 2013;

3. U.S. patent application Ser. No. 14/295,229, filed on Jun. 3, 2014, which claims the benefit of priority of Korean Patent Application No. 10-2014-0024029, filed on Feb. 28, 2014; and 4. U.S. patent application Ser. No. 14/846,812, filed on Sep. 6, 2015, which claims the benefit of priority of Korean Patent Application No. 10-2014-0182542, filed on Dec. 17, 2014.

The entire contents of the before-mentioned patent applications are incorporated by reference as part of the disclosure of this application.

TECHNICAL FIELD

This patent document relate to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic that switched between different resistance states according to an applied voltage or current, and can be implemented in various configurations, for example, a resistive random access memory (RRAM), a phase-change random access memory (PRAM), a ferroelectric random access memory (FRAM), a magnetic random access memory (MRAM), an E-fuse, etc.

SUMMARY

The disclosed technology in this patent document includes memory circuits or devices and their applications in electronic devices or systems and various implementations based on data storage in variable resistance elements.

The subject matter described in this patent document can be implemented in specific ways that provide one or more of the following features.

In an implementation, there is provided an electronic device including a semiconductor memory. The semiconductor memory may include: a substrate; an interlayer dielectric layer disposed over the substrate and having a recess; a contact formed in the recess; and a variable resistance element including a seed layer formed over the interlayer dielectric layer, a first magnetic layer formed over the seed layer, a tunnel barrier layer formed over the first magnetic layer, and a second magnetic layer formed over the tunnel barrier layer, wherein the seed layer to improve the anisotropy energy of the first magnetic layer includes a conductive material having a metallic property and an oxygen content of 1% to approximately 10%.

Implementations of the above electronic device may include one or more the following.

The seed layer includes conductive hafnium silicate. The variable resistance element further includes a bottom layer formed within the interlayer dielectric layer. The bottom layer includes first and second material layers and a barrier layer interposed between the first and second material layers and the barrier layer has a dual phase structure. The first material layer including HfN, TiN, MoN, ZrN, or MgO and the second material layer including AlN, AgI, ZnO, CdS, CdSe, a-SiC, GaN, or BN. The semiconductor memory further includes: a spacer formed on a sidewall of the variable resistance element. The spacer including a metal having a higher electron affinity than a component included in the tunnel barrier layer, the first magnetic layer and second magnetic layer.

In another implementation, there is provided an electronic device including a semiconductor memory. The semiconductor memory may include: a substrate; an interlayer dielectric layer disposed over the substrate and having a recess; a contact formed in a lower portion of the recess; and a variable resistance element including a bottom layer having at least a portion formed in an upper portion of the recess within the interlayer dielectric layer, a first magnetic layer formed over the bottom layer, a tunnel barrier layer formed over the first magnetic layer and a second magnetic layer formed over the tunnel barrier layer, wherein the bottom layer has a width greater than the contact, and the bottom layer includes a first material including HfN, TiN, MoN, ZrN, or MgO and a second material including AlN, AgI, ZnO, CdS, CdSe, a-SiC, GaN, or BN.

Implementations of the above electronic device may include one or more the following.

The variable resistance element further includes a seed layer including conductive hafnium silicate. The semiconductor memory further includes: a spacer formed on a sidewall of the remaining structure of the variable resistance element. The spacer including a metal having a higher electron affinity than a component included in the tunnel barrier layer, the first magnetic layer and second magnetic layer. The bottom layer includes a first part which is filled in the recess and a second part which protrudes out of the interlayer dielectric layer. The bottom layer further includes a barrier layer interposed between the first and second metal layers and the barrier layer has a dual phase structure.

In another implementation, there is provided an electronic device including a semiconductor memory. The semiconductor memory may include: a substrate; an interlayer dielectric layer disposed over the substrate and having a recess; a contact formed in the recess; and a variable resistance element including a first part disposed over the contact in the interlayer dielectric layer, a second part disposed over the first part and protruding over the interlayer dielectric layer and a spacer formed over a sidewall of the second part, wherein the spacer including a metal having a higher electron affinity than a component included in the second part of the variable resistance element, wherein the second part of the variable resistance element includes a first magnetic layer formed over the first part; a tunnel barrier layer formed over the first magnetic layer; and a second magnetic layer formed over the tunnel barrier layer.

Implementations of the above electronic device may include one or more the following.

The first part includes a first metal having a higher electron affinity than a component included in the second part. The variable resistance element further includes a seed layer including conductive hafnium silicate. The first part of the variable resistance element includes first and second metal layers and a barrier layer interposed between the first and second metal layers and the barrier layer has a dual phase structure.

The above and other features, and their implementations are described in detail in the drawings, the description and the claims.

DETAILED DESCRIPTION

Figure 1:
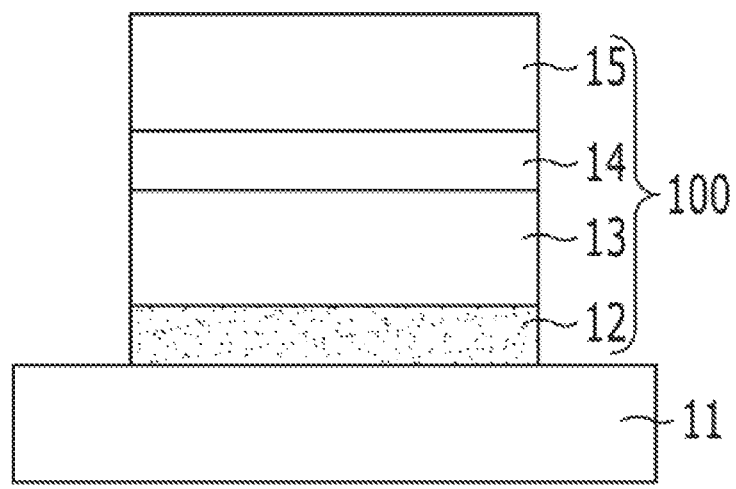
FIG. 1 is a cross-sectional view of a variable resistance element in accordance with one implementation of the disclosed technology in the present disclosure.

This disclosure provides features in electronic devices or systems having semiconductor memory using variable resistance elements to store data in different resistance states and operations and fabrications of such semiconductor memory. Various examples and implementations of the disclosed technology are described below in detail with reference to the accompanying drawings. In various applications, an array of memory cells may be formed in semiconductor layers over a substrate to include variable resistance elements as a semiconductor memory device. Each variable resistance element exhibits different resistance values for storing data and can be changed from one resistance value to another different resistance value by applying a voltage or current above a certain threshold level in a write operation.

As a specific example, a variable resistance element can include a Magnetic Tunnel Junction (MTJ) structure to store data. Each MTJ structure includes a free magnetic layer having a changeable magnetization direction, a pinned magnetic layer having a fixed magnetization direction and a tunnel barrier layer between the two magnetic layers. The tunnel barrier layer is formed of an electrical insulation material that electrically insulates the magnetic layers by prohibiting conduction of electrons between the magnetic layer but is structured to allow tunneling of electrons between the magnetic layers when a voltage or current is applied to the MTJ structure. The MTJ structure is configured so that the tunneling of electrons according to the voltage or current applied to the MTJ structure can cause the magnetization of the free magnetic layer to change when the applied voltage or current is at or greater than a threshold switching voltage or current. Such a MTJ structure can exhibit different resistance states based on different relative directions between the magnetization directions of the free and pinned magnetic layers and such different resistance states can be used to store data. In reading data stored in a MTJ structure, the resistance of the MTJ structure can be measured for readout by applying a read voltage or current across the MTJ structure with an amplitude less than the threshold switching voltage or current.

Various features of MTJ structures are described below and the disclosed features may be selectively combined to form certain MTJ structures with desired properties to meet various needs.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Section 1: Seed Layer Including Conductive Hafnium Silicate

Some implementations of the disclosed technology provide a semiconductor device including a variable resistance element capable of improving device characteristics and increasing integration level, and a method for fabricating the same. The variable resistance element has a stacked structure of magnetic layers with a tunnel barrier layer interposed therebetween, and may include a seed layer formed under the magnetic layer so as to improve the anisotropy energy of the magnetic layer. Typically, the seed layer is formed of the same material as the tunnel barrier layer, for example, magnesium oxide (MgO). However, due to a crystallinity difference between MgO and the magnetic layers, an incoherent tunneling effect may occur. Furthermore, tunnel magneto-resistance may be decreased by parasitic resistance, and resistance may be increased. In recognition of the above, the examples of semiconductor devices disclosed below provide a variable resistance element with a seed layer including a conductive hafnium silicate, thereby improving a low resistance characteristic, a TMR (tunneling magnetoresistance) characteristic, and a retention characteristic.

FIG. 1 is a cross-sectional view of an example of a variable resistance element as part of a semiconductor memory.

As illustrated in FIG. 1, the variable resistance element 100 may have a stacked structure of a seed layer 12, a first magnetic layer 13, a tunnel barrier layer 14, and a second magnetic layer 15. The seed layer is formed over a substrate 11 and includes conductive hafnium silicate. Furthermore, although not illustrated, the variable resistance element 100 may include an electrode for applying a bias to the variable resistance element 100. The substrate 11 may include a switching element (not illustrated) and a contact plug (not illustrated) for connecting a junction region of the switching element to the variable resistance element 100.

The variable resistance element 100 having a stacked structure of the seed layer 12, the first magnetic layer 13, the tunnel barrier layer 14, and the second magnetic layer 15 is referred to as a magnetic tunnel junction (MTJ). The variable resistance element 100 having the two magnetic layers 13 and 15 with the tunnel barrier layer 14 interposed therebetween may have a characteristic of switching between different resistance states according to the magnetization directions of the two magnetic layers 13 and 15. For example, when the magnetization directions of the two magnetic layers 13 and 15 are identical to each other (or parallel to each other), the variable resistance element may have a low resistance state, and when the magnetization directions of the two magnetic layers 13 and 15 are different from each other (or anti-parallel to each other), the variable resistance element may have a high resistance state.

The seed layer 12 serves to improve the anisotropy energy of the magnetic layers, and includes amorphous hafnium silicate exhibiting electrical conductivity. Since the conductive hafnium silicate has a metallic property, the conductive hafnium silicate can improve the TMR characteristic while securing low resistance. The conductive hafnium silicate containing oxygen improves the anisotropic characteristic of the subsequent magnetic layer, thereby improving a retention characteristic and a switching characteristic. At this time, the oxygen content of the conductive hafnium silicate may be controlled to range from approximately 1% to approximately 10%. In one embodiment, the conductive hafnium silicate may be formed in an amorphous state. In this case, since a subsequent magnetic layer may also be formed in an amorphous state, the thickness of the magnetic layer may be increased.

The tunnel barrier layer 14 may include a dielectric material, for example, aluminum oxide (AlO) or MgO.

Any one of the first and second magnetic layers 13 and 15 may include a pinned ferroelectric layer of which the magnetization direction is pinned, and the other may include a free ferroelectric layer of which the magnetization direction is varied according to the direction of a current applied to the variable resistance element 100. The magnetic layer may have perpendicular magnetic anisotropy, and may be formed of an amorphous material, for example, CoFeB.

As the seed layer 12 including the amorphous conductive hafnium silicate is formed before the first magnetic layer 13 is formed, the anisotropy energy of the first magnetic layer 13 may be improved to enhance the retention characteristic and the switching characteristic. Furthermore, the conductive hafnium silicate may be applied to secure lower resistance and higher TMR than a similar structure based on an insulating seed layer formed on the substrate. Furthermore, since the amorphous conductive hafnium silicate is applied, the amorphous first magnetic layer 13 can be easily formed, and the thickness of the first magnetic layer 13 can be increased.

Figure 2:
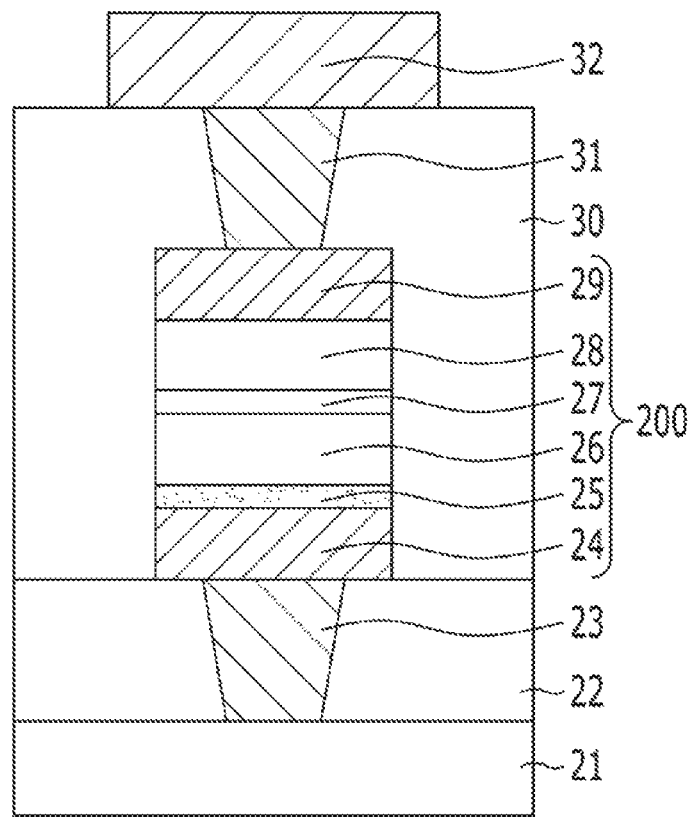
FIG. 2 is a cross-sectional view of a semiconductor device including a variable resistance element in accordance with one implementation of the disclosed technology in the present disclosure.

FIG. 2 is a cross-sectional view of a semiconductor device including a variable resistance element.

As illustrated in FIG. 2, the semiconductor device includes a substrate 21, a first interlayer dielectric layer 22, a first contact plug 23, a variable resistance element 200, a second interlayer dielectric layer 30, a conductive line 32, and a second contact plug 31. The substrate 21 includes a switching element (not illustrated). The first contact plug 23 is connected to the substrate 21 by penetrating the first interlayer dielectric layer 22. The variable resistance element 200 is connected to the first contact plug 23. The second interlayer dielectric layer 30 is buried between the variable resistance elements 200. The conductive line 32 is formed over the second interlayer dielectric layer 30. The second contact plug 31 connects the conductive line 32 with the variable resistance element 200. Furthermore, although not illustrated, the semiconductor device may further include a template layer and a coupling layer for improving the characteristic of the magnetic layers in the variable resistance element 200.

The variable resistance element 200 may have a stacked structure of a first electrode 24, a seed layer 25 containing conductive hafnium silicate, a first magnetic layer 26, a tunnel barrier layer 27, a second magnetic layer 28, and a second electrode 29. The seed layer 25, the first magnetic layer 26, the tunnel barrier layer 27, and the second magnetic layer 28 may have the same structure as the variable resistance element 100 of FIG. 1.

The first electrode 24, the second electrode 29, and the conductive line 32 may include a metallic layer. The metallic layer includes a conductive layer containing a metal element, and may include metal, metal oxide, metal nitride, metal oxynitride, metal silicide and the like.

The first electrode 24 may serve as a bottom electrode of the variable resistance element 200, and the second electrode 29 may serve as a top electrode of the variable resistance element 200. Furthermore, the second electrode 29 may serve to protect lower layers of the variable resistance element 200 during processes and serve as an etch barrier for patterning the lower layers. The second electrode 29 may be formed to a sufficient thickness to prevent a defective contact with the conductive line 32.

The semiconductor device in accordance with the implementation may further include the substrate 21 having a predetermined structure, for example, a switching element formed therein, the first interlayer dielectric layer 22 formed over the substrate 21, and the first contact plug 23 electrically connecting one end of the switching element to the variable resistance element 200 by penetrating the first interlayer dielectric layer 22. The variable resistance element may be formed over the first interlayer dielectric layer 22. Furthermore, the semiconductor device may further include the second interlayer dielectric layer 30 buried between the variable resistance elements 200, the conductive line 32 formed over the second interlayer dielectric layer 30, and the second contact plug 31 electrically connecting the variable resistance element 200 to the conductive line 32 by penetrating the second interlayer dielectric layer 30 over the variable resistance element 200.

The switching element serves to select a specific unit cell in the semiconductor device including a plurality of unit cells. The switching element may be provided in each of the unit cells, and may include a transistor, a diode and the like. One of the switching element may be electrically connected to the first contact plug 23, and the other end of the switching element may be electrically connected to a wiring (not illustrated), for example, a source line.

The first contact plug 23 and the second contact plug 30 may include a semiconductor layer or metallic layer, and the variable resistance element 200 may have a critical dimension (CD) or area greater than the first contact plug 23 and the second contact plug 30.

FIGS. 3A to 3E are cross-sectional view illustrating a method for fabricating a semiconductor device including a variable resistance element.

Figure 3A:
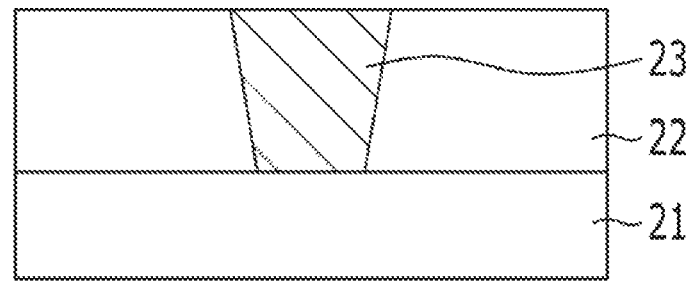
FIGS. 3A to 3E are cross-sectional view illustrating a method for fabricating a semiconductor device including a variable resistance element in accordance with one implementation of the disclosed technology in the present disclosure.

Referring to FIG. 3A, a substrate 21 having a predetermined structure, for example, a switching element (not illustrated) is provided. The switching element for selecting a specific unit cell in a semiconductor device including a plurality of unit cells may include a transistor, a diode and the like. One end of the switching element may be electrically connected to a first contact plug 23, and the other end of the switching element may be electrically connected to a wiring (not illustrated), for example a source line.

A first interlayer dielectric layer 22 is formed over the substrate 21. The first interlayer dielectric layer 22 may include a monolayer including oxide, nitride, and oxynitride or a stacked layer thereof.

A first contact plug 23 is formed to be electrically connected to one end of a switching element (not illustrated) by penetrating the first interlayer dielectric layer 22. The first contact plug 23 may serve to electrically connect the switching element and a variable resistance element to be formed through a subsequent process, and serve as an electrode for the variable resistance element, for example, a bottom electrode. The first contact plug 23 may be formed of a semiconductor layer or metallic layer. The semiconductor layer may include silicon. The metallic layer is a material layer containing a metal element, and may include metal, metal oxide, metal nitride, metal oxynitride, metal silicide and the like.

The first contact plug 23 may be formed through the following series of processes: the first interlayer dielectric layer 22 is selectively etched to form a contact hole exposing one end of the switching element, a conductive material is formed on the entire surface of the resultant structure so as to fill the contact hole, and an isolation process is performed to electrically isolate the adjacent first contact plugs 23. The isolation process may be performed by etching or polishing the conductive material formed on the entire surface of the resultant structure through a blanket etch process (for example, etch-back process) or chemical mechanical polishing (CMP) process, until the first interlayer dielectric layer 22 is exposed.

Figure 3B:
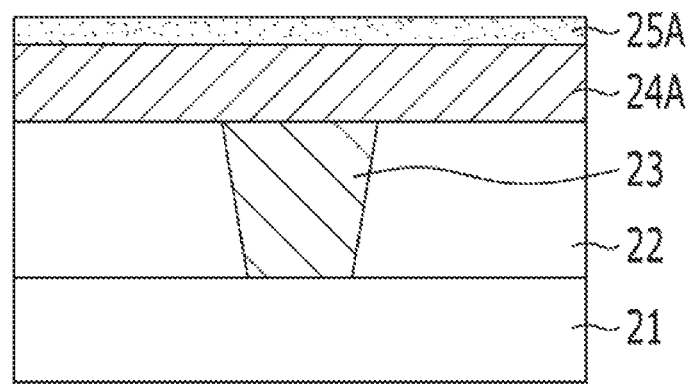

Referring to FIG. 3B, a conductive layer 24A is formed over the first interlayer dielectric layer 22 including the first contact plug 23. The conductive layer 24A may serve as a first electrode, for example, a bottom electrode, of a variable resistance element to be formed through a subsequent process, and may be formed of a metallic layer.

Then, a seed layer 25A containing conductive hafnium silicate is formed over the conductive layer 24A. The conductive hafnium silicate may be formed in an amorphous state. The conductive hafnium silicate may be formed to contain oxygen therein in order to improve the anisotropy energy of subsequent magnetic layers. At this time, the oxygen content of the conductive hafnium silicate may be controlled to range from 1% to 10%.

In one embodiment, the conductive hafnium silicate may be formed through a series of processes of forming a silicon containing layer, forming a hafnium containing layer, and performing a heat treatment. At this time, the silicon containing layer may include any one silicon containing layer including Si, SiB, SiO, or SiBO. The hafnium containing layer may include any one hafnium containing layer including Hf, HfO, or HfB.

In another implementation, the conductive hafnium silicate may be formed by forming hafnium silicide and then performing an oxidation process on the hafnium silicide. The hafnium silicide may include $Hf_xSi_y$ or $Hf_xSi_yB_z$ where x, y, and z are a composition ratio and a natural number, and may be formed through a co-sputtering method.

Furthermore, the oxidation process may include any one oxidation process including natural oxidation, radical oxidation, or plasma oxidation.

The conductive hafnium silicate in accordance with the implementation is formed in an amorphous state. The conductive hafnium silicate may not be crystallized even at a high temperature of about 500° C., but may maintain an amorphous state. Thus, a magnetic layer to be formed through a subsequent process may also be formed to have an amorphous structure, and may prevent horizontal magnetic anisotropy from varying depending on crystallizability. Furthermore, the conductive hafnium silicate layer may suppress the crystallization of the magnetic layer, thereby increasing the thickness of the magnetic layer. Furthermore, even during a subsequent process, the conductive hafnium silicate may not be crystallized but still maintain a metallic state. Thus, lower resistance and higher TMR can be obtained as compared to the variable resistance element having the seed layer formed of an insulator. Since lower resistance is maintained during processes, it possible to improve the reliability of the element.

Figure 3C:
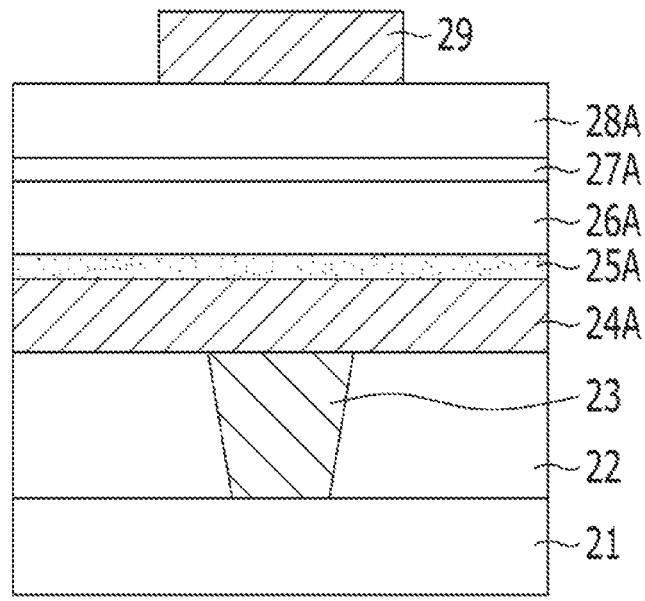

Referring to FIG. 3C, a first magnetic layer 26A, a tunnel barrier layer 27A, and a second magnetic layer 28A are stacked over the seed layer 25A containing the conductive hafnium silicate.

Any one of the first and second magnetic layers 26A and 28A may include a pinned ferroelectric layer of which the magnetization direction is pinned, and the other may include a free ferroelectric layer of which the magnetization direction is varied according to the direction of a current applied to the variable resistance element 200. The first and second magnetic layers 26A and 28A may include a monolayer or multilayer containing a ferromagnetic material, including, for example, Fe—Pt alloy, Fe—Pd alloy, Co—Pd alloy, Co—Pt alloy, Co—Fe alloy, Fe—Ni—Pt alloy, Co—Fe—Pt alloy, or Co—Ni—Pt alloy. The first and second magnetic layers 26A and 28A may further include impurities such as boron (B), but other implementations are possible.

In examples described herein, the first magnetic layer 26A is assumed to be a free magnetic layer. The first magnetic layer 26A may be formed to have an amorphous structure through the amorphous seed layer 25A, and the crystallization thereof may be suppressed as much as possible. Thus, the thickness of the first magnetic layer 26A may be increased so long as perpendicular magnetic anisotropy is maintained. Thus, the retention characteristic may be improved in proportion to the volume of the magnetic layer. Furthermore, when supposing that the first magnetic layer 26A contains CoFeB, oxygen within the seed layer 25A containing the conductive hafnium silicate layer and iron (Fe) of the first magnetic layer 26A may be coupled to each other at the interface therebetween, thereby reducing a damping constant. Thus, a switching current can be reduced.

The tunnel barrier layer 27A interposed between the two magnetic layers 26A and 28A may include a dielectric material, for example, metal oxide. The tunnel barrier layer 27A may change the magnetization direction of the free magnetic layer through electron tunneling. The tunnel barrier layer 27A may include a monolayer or multilayer containing a dielectric material, for example, oxide such as Al2O3, MgO, CaO, SrO, TiO, VO, NbO or the like. Other implementations are possible. The tunnel barrier layer 27A may be formed through physical vapor deposition or atomic layer deposition. The physical vapor deposition may include, for example, RF sputtering or reactive sputtering.

A second electrode 29 is formed over the second magnetic layer 28A. The second electrode 29 may be formed by forming a conductive layer over the second magnetic layer 28A and patterning the conductive layer through a mask pattern. In one implementation, a dry etch process may be performed.

The second electrode 29 may serve as a top electrode of a variable resistance element to be formed through a subsequent process, and may be formed of a metallic layer. Furthermore, the second electrode 29 may serve as an etch barrier for forming the variable resistance element.

Figure 3D:
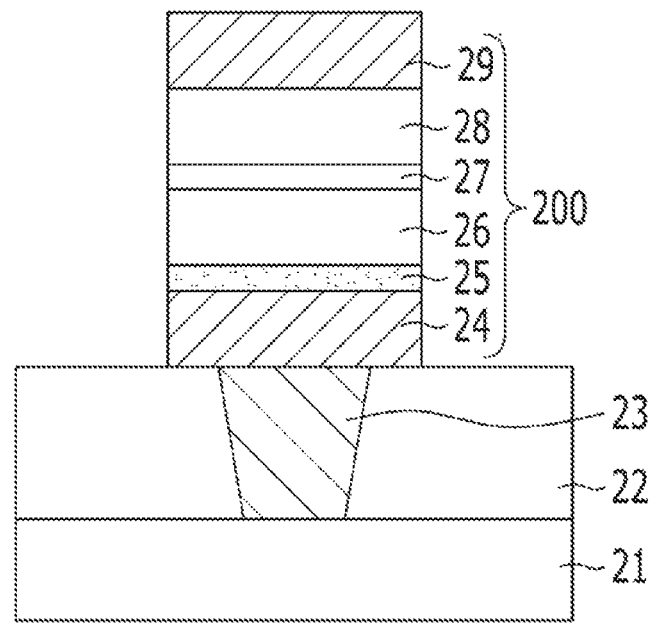

Referring to FIG. 3D, the second electrode 29 is used as an etch barrier to sequentially etch the second magnetic layer 28A, the tunnel barrier layer 27A, the first magnetic layer 26A, the seed layer 25A containing conductive hafnium silicate, and the conductive layer 24A. In other implementations, a mask pattern which is used for forming the second electrode 29 is not be removed and used as an etch barrier for forming the variable resistance element.

Then, the variable resistance element 200 is formed to have a stacked structure of the first electrode 24, the seed layer 25 containing conductive hafnium silicate, the first magnetic layer 26, the tunnel barrier layer 27, the second magnetic layer 28, and the second electrode 29. The variable resistance element 200 may be formed in a line shape extending in a direction where a conductive line extends, which will be formed in a subsequent process. Alternatively, a plurality of pillar-type variable resistance elements 200 may be arranged and spaced at a predetermined interval apart from one another in a direction where a conductive line extends. Furthermore, the variable resistance element 200 may be formed to have a CD or area sufficient to cover the first contact plug 23.

Although not illustrated, a spacer may be formed on sidewalls of the variable resistance element 200.

Figure 3E:
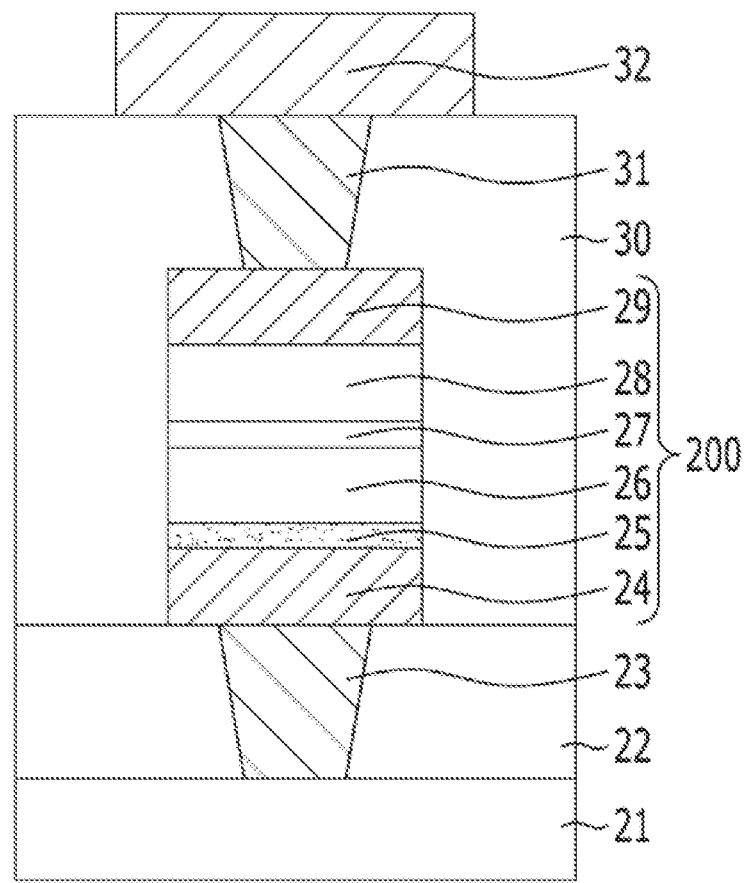

Referring to FIG. 3E, a second interlayer dielectric layer 30 is formed over the first interlayer dielectric layer 22. The second interlayer dielectric layer 30 may be formed to have a sufficient thickness to fill the space between the variable resistance elements 200. For example, the second interlayer dielectric layer 30 may be formed to have a thickness that the top surface thereof is positioned at a higher level than the top surface of the variable resistance element 200. The second interlayer dielectric layer 30 may be formed of the same material as the first interlayer dielectric layer 22. The second interlayer dielectric layer 30 may have a monolayer structure including oxide, nitride, or oxynitride or a stacked structure thereof.

Then, a second contact plug 31 is formed to be electrically connected to the variable resistance element 200 by penetrating the second interlayer dielectric layer 30 over the variable resistance element 200. The second contact plug 31 may serve to electrically connect the variable resistance element 200 to a conductive line to be formed in a subsequent process, and may serve as an electrode, for example, a top electrode, for the variable resistance element. The second contact plug 31 may be formed of a semiconductor layer or metallic layer. The semiconductor layer may include silicon, and the metallic layer is a material layer containing a metal element and may include metal, metal oxide, metal nitride, metal oxynitride, metal silicide or the like.

The second contact plug 31 may be formed through the following series of processes:

the second interlayer dielectric layer 30 is selectively etched to form a contact hole exposing one end of the variable resistance element 200, a conductive material is formed on the entire surface of the resultant structure so as to fill the contact hole, and an isolation process is performed to electrically isolate the adjacent second contact plugs 31.

The isolation process may be performed by etching or polishing the conductive material formed on the entire surface of the resultant structure through a blanket etch process (for example, etch-back process) or chemical mechanical polishing (CMP) process, until the second interlayer dielectric layer 30 is exposed.

Then, a conductive line 32 is formed over the second interlayer dielectric layer 30. The conductive line 32 is connected to the second contact plug 31, and electrically connected to the variable resistance element 200 through the second contact plug 31.

Section 2: Bottom Layer Formed Under Magnetic Tunnel Junction

Figure 4:
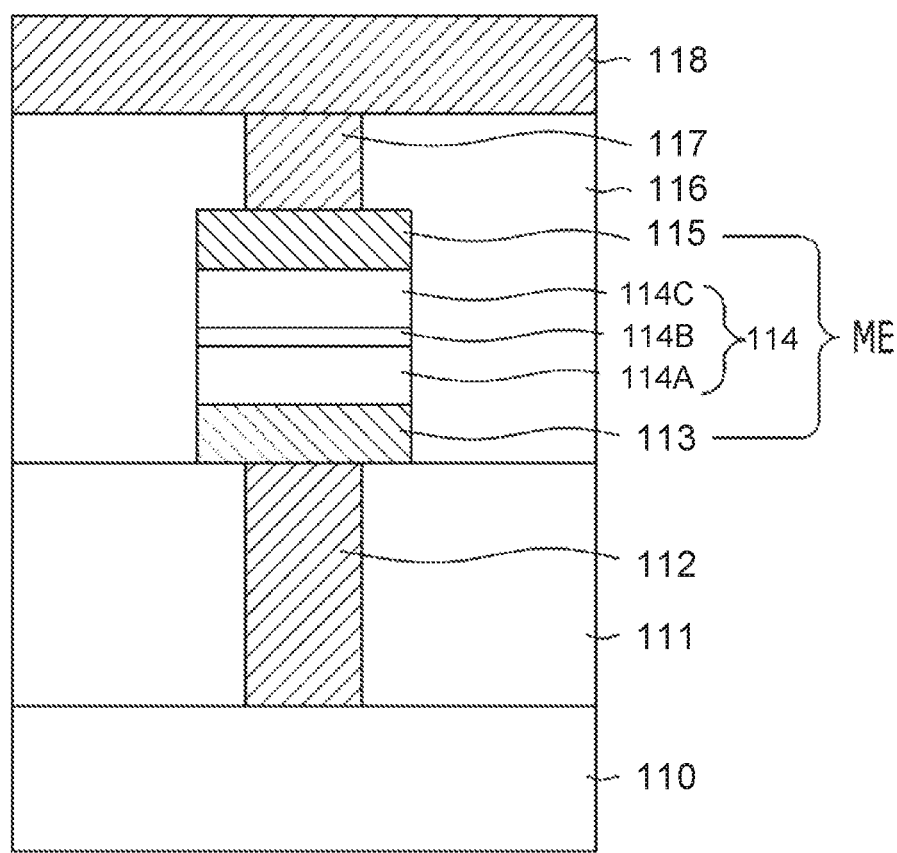
FIG. 4 is a cross-sectional view illustrating a comparative example of a semiconductor device.

Some implementations of the disclosed technology provide an electronic device capable of simplifying a fabrication process and improving a characteristic of the electronic device. FIG. 4 is a cross-sectional view illustrating an example of a semiconductor device in which a bottom layer is formed over a first interlayer dielectric layer. In FIG. 4, the semiconductor device includes a resistance variable element switched between different resistance states according to an applied voltage or current. The resistance variable element may be a magnetic resistance element which operates based on a magnetic resistance variation.

Referring to FIG. 4, the semiconductor device includes a magnetic resistance element ME which is interposed between a bottom contact 112 and a top contact 117.

A substrate 110 is provided with a predetermined structure including a switching element (not shown). The end of the predetermined structure, for example, a switching element may be connected with the bottom contact 112 and the other end of the switching element may be connected with, for example, a source line (not shown). The top contact 117 may be connected with, for example, a bit line 118. The magnetic resistance element ME may include an MTJ (magnetic tunnel junction) structure 114 in which a bottom magnetic layer 114A, a tunnel barrier layer 114B and a top magnetic layer 114C are sequentially stacked. A bottom layer 113 is disposed under the MTJ structure 114 to connect the bottom contact 112 with the MTJ structure 114, thereby improving the characteristic of the MTJ structure 114. A top layer 115 is disposed over the MTJ structure 114 to connect the top contact 117 with the MTJ structure 114 and serve as a hard mask for patterning the MTJ structure 114. Reference numerals 111 and 116 denote interlayer dielectric layers.

In one example fabrication process to fabricate this semiconductor device, a series of processes are performed as follows.

An interlayer dielectric layer 111 is formed on the substrate 110, and then the bottom contact 112 is formed to pass through the interlayer dielectric layer 111. Next, a conductive layer for forming the bottom layer 113 and a material layer (for example, a magnetic layer/a dielectric layer/a magnetic layer, for forming the MTJ structure 114) are formed on a resultant structure. After forming the top layer 115 in a way as to be patterned on the material layer, by etching the material layer and the conductive layer using the top layer 115 as an etch barrier, the MTJ structure 114 and the bottom layer 113, which are patterned in the same manner as the top layer 115, are formed. Then, processes for forming the interlayer dielectric layer 116, the top contact 117 and the bit line 118 are performed.

As described above, the magnetic resistance element ME basically has a multi-layered structure. In order to satisfy a recently required characteristic of the magnetic resistance element ME, the number of layers and the thickness of each layer included in the magnetic resistance element ME tends to continuously increase. At the same time, the trend for desiring a higher degree of integration of a semiconductor device tends to require the distance between magnetic resistance elements ME to be decreased.

In fabrication of the semiconductor device of FIG. 4 when the top layer 115 is used as a hard mask during the fabrication, the margin of the hard mask becomes insufficient to pattern the MTJ structure 114 and the bottom layer 113 under an increased degree of integration and increased number of layers and the thickness of each layer in the ME. In order to secure the margin of the hard mask, the thickness of the bottom layer 113 may need to decrease. However, if the thickness of the bottom layer 113 is deceased, the following problems may occur.

In the semiconductor device of FIG. 4, the bottom layer 113 has a planarized surface by depositing a conductive layer and performing a planarization process. The planarization process is performed to avoid the degradation of characteristics of the MTJ structure 114. If the tunnel barrier layer 114B of the MTJ structure 114 is formed on a surface with poor flatness and thus warps, the characteristic of the MTJ structure 114 may be degraded due to a Neel coupling phenomenon. However, if the thickness of the bottom layer 113 is decreased for patterning of the bottom layer 113, it becomes difficult to control the planarization process.

The technology disclosed here provides device structures and fabrication techniques that provide various advantages and can be implemented in specific ways to solve the problems in the semiconductor device of FIG. 4 Detailed description of the present device structures and fabrication techniques and examples of implementations will be given below.

FIGS. 5A to 5F are cross-sectional views explaining a semiconductor device and an example of a method for fabricating the same in accordance with an implementation of the disclosed technology in the present disclosure. As an example, a resistance variable element is included as a magnetic resistance element. However, other implementations are also possible for the magnetic resistance element.

Figure 5A:
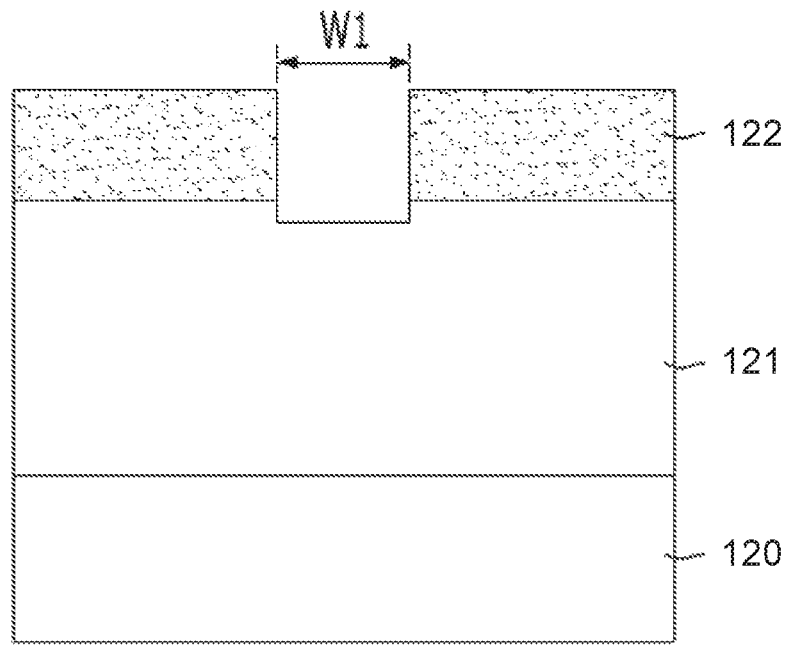
FIGS. 5A to 5F are cross-sectional views explaining a structure of an example of a semiconductor device and an example of a method for fabricating the same in accordance with an implementation of the disclosed technology in the present disclosure.

Referring to FIG. 5A, a substrate 120, which is formed with a desired predetermined structure, for example, a switching element (not shown), is provided. The switching element is to select a memory cell, and may be, for example, a transistor, a diode or the like. One end of the switching element may be electrically connected with a bottom contact which will be described later, and the other end of the switching element may be electrically connected with an wiring line (not shown), for example, a source line.

An interlayer dielectric layer 121 is formed on the substrate 120. The interlayer dielectric layer 121 may be formed using various dielectric materials such as a silicon oxide and so forth.

A first hard mask pattern 122 is formed on the interlayer dielectric layer 121 to have an opening which exposes a region where the bottom contact will be formed. The width of the opening of the first hard mask pattern 122 is denoted by the reference symbol W1. The width W1 of the opening may be substantially the same as a desired bottom width of the bottom contact.

The first hard mask pattern 122 may be formed as a layer with an etching selectivity with respect to the interlayer dielectric layer 121, for example, a photoresist layer, an amorphous carbon layer or a nitride layer. When performing etching to form the first hard mask pattern 122, a portion of the interlayer dielectric layer 121 which is exposed through the first hard mask pattern 122 may be also etched due to over-etching.

Figure 5B:
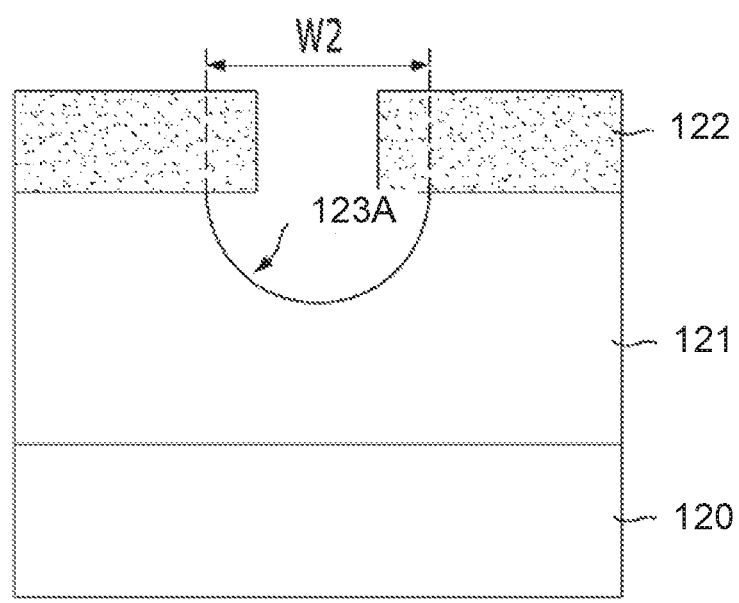

Referring to FIG. 5B, an isotropic etching is performed in etching the portion of the interlayer dielectric layer 121 which is exposed through the first hard mask pattern 122, and thus, a top recess 123A is formed in the interlayer dielectric layer 121. The top end of the top recess 123A has a width W2 greater than the width W1 of the opening of the first hard mask pattern 122. The isotropic etching may be performed as wet etching or dry etching with active chemical reaction.

Figure 5C:
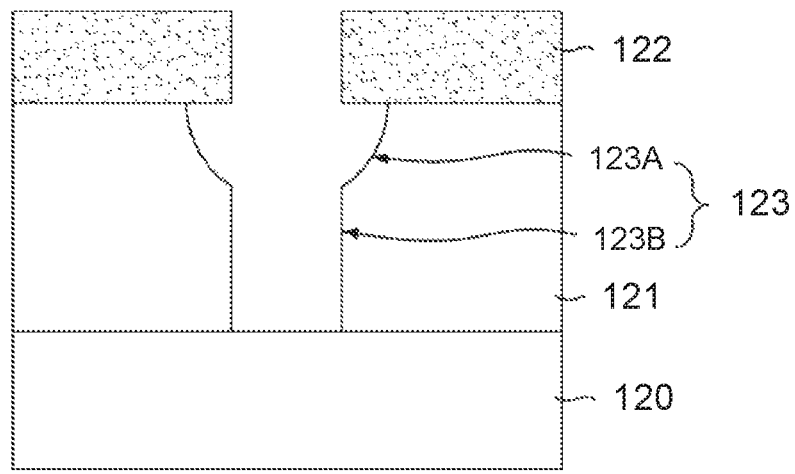

Referring to FIG. 5C, an unisotropic etching is performed in etching the portion of the interlayer dielectric layer 121 which is exposed through the first hard mask pattern 122, and thus, a bottom recess 123B is formed. The bottom recess 123B is formed under the top recess 123A and integrally communicates with the top recess 123A. The unisotropic etching may be performed as dry etching.

The top recess 123A and the bottom recess 123B will be collectively referred to as a recess 123. The recess 123 may have a wine glass shape when viewed in its entirety and provide a space for forming the bottom contact and a portion of a magnetic resistance element. The width W2 of the top end of the recess 123 may be greater than the width of the bottom end of the recess 123 and may be greater than the width W1 of the opening of the first hard mask pattern 122. The width of the bottom end of the recess 123 may be substantially the same as the width W1 of the opening of the first hard mask pattern 122. The order of performing the processes of FIGS. 5B and 5C can be reversed.

Although the recess 123 is described to have a wine glass shape in FIGS. 5A to 5C, various configurations can be made for the shape of the recess 123, which will be described later with reference to FIGS. 5A to 5F.

Figure 5D:
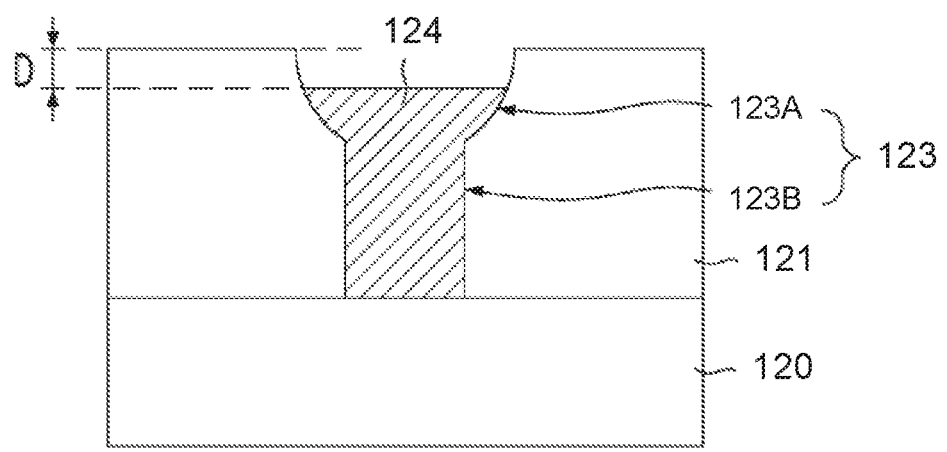

Referring to FIG. 5D, after removing the first hard mask pattern 122, a bottom contact 124 is formed to partially fill the recess 123.

The bottom contact 124 may be formed by depositing a conductive material on the resultant structure obtained after removing the first hard mask pattern 122 and then etching back the conductive material such that the top surface of the bottom contact 124 is lower than the top end of the recess 123 by a predetermined height D. The predetermined height D may be determined based on the thickness of the patternable portion of the magnetic resistance element. For example, the predetermined height D may be not less than a value obtained by subtracting a patternable thickness from the total thickness of a magnetic resistance element.

The conductive material for forming the bottom contact 124 may be a conductive material with an excellent gapfill characteristic and high electrical conductivity, for example, tungsten (W) or a titanium nitride (TiN). The deposition of the conductive material may be performed through CVD (chemical vapor deposition).

Figure 5E:
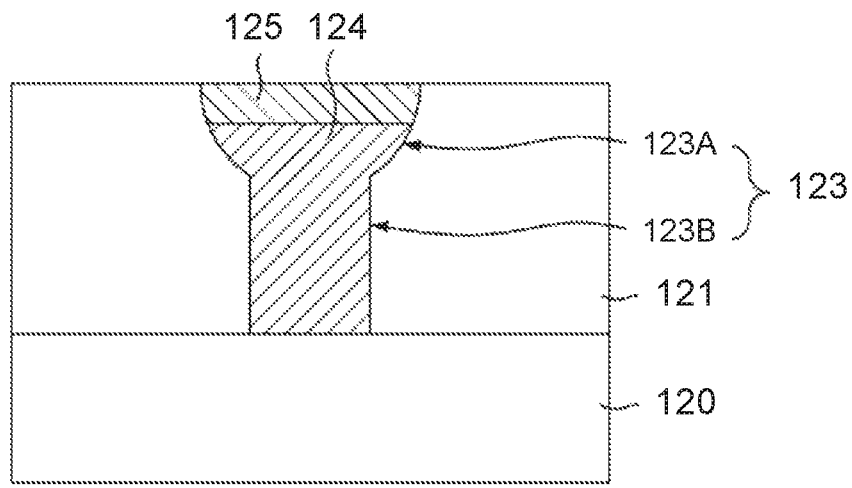

Referring to FIG. 5E, a bottom layer 125 is formed on the bottom contact 124 in such a way as to fill the remainder of the recess 123.

The bottom layer 125 as a part of the magnetic resistance element may include a conductive material different from the bottom contact 124. The bottom layer 125 may be interposed between the bottom contact 124 and an MTJ structure and perform various functions for improving the characteristics or fabrication process of the magnetic resistance element. The bottom layer 125 may be a single layer or a multi-layer. For example, the bottom layer 125 may serve as a barrier layer for preventing the abnormal growth of a metal included in the bottom magnetic layer of the MTJ structure. The bottom layer 125 may be a double layer which is formed up and down. The upper layer of the double layer may be a layer which controls the crystallinity of the bottom magnetic layer of the MTJ structure and controls a TMR (tunneling magneto resistance) value. The lower layer of the double layer may be a layer which may serve as a buffer layer capable of increasing adhesion to the bottom contact 124 and improve the film quality or roughness of the upper layer. The bottom layer 125 may include a magnetic correction layer which has a magnetization direction opposite to a magnetic layer functioning as a pinned layer in the MTJ structure and offset the influence of the magnetic field applied to a free layer by the pinned layer. Such a magnetic correction layer may be a single layer or a multi-layer including a ferromagnetic material, for example, a Co metal, a Fe metal, a Fe—Pt alloy, a Fe—Pd alloy, a Co—Pd alloy, a Co—Pt alloy, a Fe—Ni—Pt alloy, a Co—Fe—Pt alloy or a Co—Ni—Pt alloy. When the magnetic correction layer is a multi-layer including at least two ferromagnetic material layers, a noble metal layer such as of platinum (Pt) or palladium (Pd) may be interposed between the ferromagnetic material layers. For example, the magnetic correction layer may have the stack structure of a ferromagnetic material layer, a noble metal layer, and a ferromagnetic material layer. However, other implementations are also possible. For example, in order to satisfy desired characteristics of a semiconductor device including a magnetic resistance element, the bottom layer 125 may be designed to perform various functions. While the bottom layer 125 may include, for example, a metal such as Ti, Hf, Zr, Mn, Cr, Zn, Mg, Al, W and Ta, a nitride of the metal, or an oxide of the metal, other implementations are also possible. For example, the bottom layer may be a single layer or a multi-layer including various materials.

The bottom layer 125 may be formed to have a thickness sufficiently filling the recess 123 by depositing a conductive material on the resultant structure with the bottom contact 124 and then perform a planarization process, for example, CMP (chemical mechanical polishing) or etch-back, until the surface of the interlayer dielectric layer 121 is exposed.

Since the bottom layer 125 is formed in the upper part of the recess 123, the width of the top surface of the bottom layer 125 has a value that corresponds to the width W2 of the top end of the recess 123. Further, because the thickness D (see FIG. 5D) of the bottom layer 125 need not be small and rather may have a value equal to or larger than a thickness that is difficult to pattern in a magnetic resistance element, the present formation of the bottom layer 125 allows an easier control of the planarization process of the bottom layer 125.

Figure 5F:
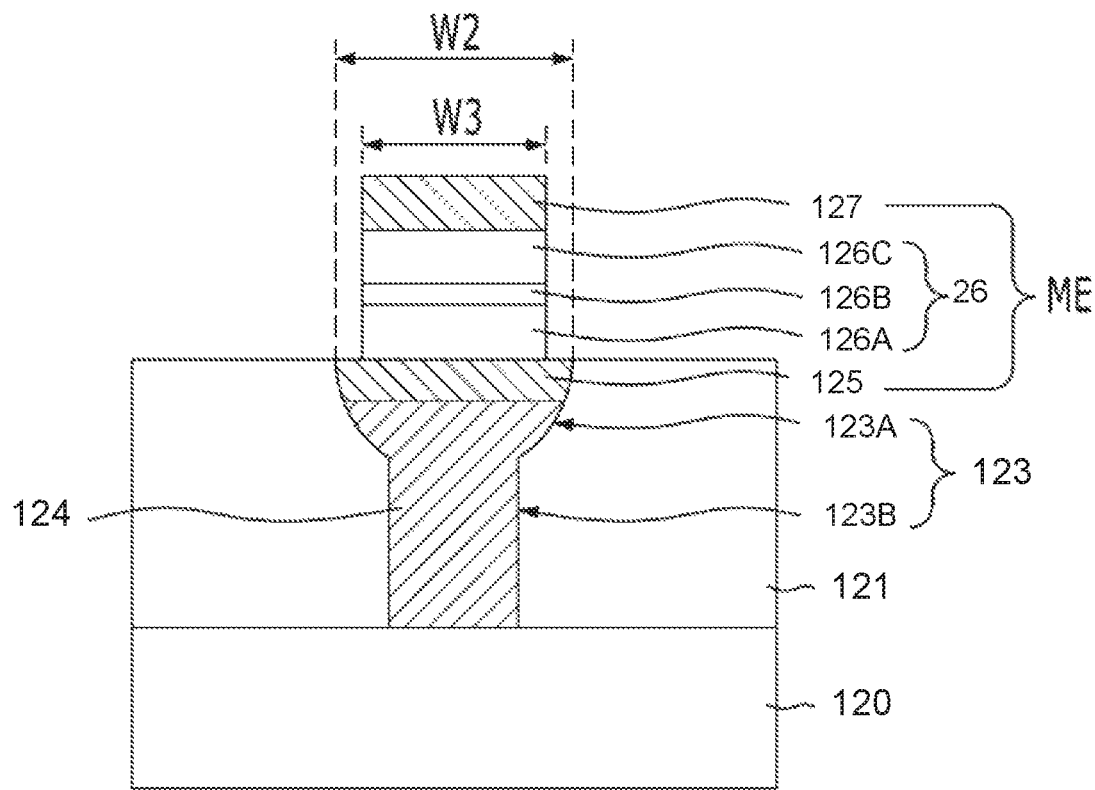

FIG. 5F illustrates and explains how the remaining layers of the magnetic resistance element, for example, the stack structure of an MTJ structure 126 and a top layer 127 are formed on the bottom layer 125.

Material layers for forming the MTJ structure 126 are formed on the resultant structure of FIG. 5E. Next, the top layer 127 is formed on the material layers and patterned in order to pattern the magnetic resistance element. The MTJ structure 126 is formed by etching the material layers using the top layer 127 as an etch barrier. The etching for forming the MTJ structure 126 may be performed as physical etching such as IBE (ion beam etching).

The MTJ structure 126 may include, for example, a bottom magnetic layer 126A, a tunnel barrier layer 126B and a top magnetic layer 126C which are sequentially stacked. One of the bottom magnetic layer 126A and the top magnetic layer 126C may be a pinned layer of which magnetization direction is pinned, and the other thereof may be a free layer of which magnetization direction is changeable. Each of the bottom magnetic layer 126A and the top magnetic layer 126C may be a single layer or a multi-layer including a ferromagnetic material, for example, a Fe—Pt alloy, a Fe—Pd alloy, a Co—Pd alloy, a Co—Pt alloy, a Fe—Ni—Pt alloy, a Co—Fe—Pt alloy or a Co—Ni—Pt alloy. Other implementations are also possible. The tunnel barrier layer 126B may function as an electron tunnel and change the magnetization direction of the bottom magnetic layer 126A or the top magnetic layer 126C. The tunnel barrier layer 126B may be a single layer or a multi-layer including, for example, an oxide such as MgO, CaO, SrO, TiO, VO and NbO. Other implementations are also possible.

In the above example, the MTJ structure 126 includes the tunnel barrier layer 126B interposed between the two magnetic layers 126A and 126C. Other configurations for the MTJ structure 126 are possible. For example, the MTJ structure 126 may further include layers which perform various functions. For example, while not shown, an anti-ferromagnetic material may be additionally formed which pins the magnetization direction of the pinned layer and performs the same function as the above-described magnetic correction layer. The anti-ferromagnetic material may be, for example, a single layer or a multi-layer including FeMN, NiMn, PtMn, PdMn, PtPdMn, RuMn, OsMn, IrMn or CrPtMn. Such additional layer may be formed over or under the bottom magnetic layer 126A or the top magnetic layer 126C which serves as the pinned layer.

The top layer 127 may be a single layer or a multi-layer including a metal or a metal nitride as a conductive material. However, other implementations are also possible.

The top layer 127 may fully overlap with the bottom layer 125, and may have a width W3 that is equal to or smaller than the width W2 of the top surface of the bottom layer 125. Accordingly, the MTJ structure 126 may be present on only the bottom layer 125 and the entire bottom surface of the MTJ structure 126 may overlap with the bottom layer 125.

As a result of this process, a magnetic resistance element ME in which the bottom layer 125, the MTJ structure 126 and the top layer 127 are sequentially stacked may be formed.

While not shown in the present drawing, a dielectric layer which covers the top layer 127 and the MTJ structure 126 may be formed and then subsequent processes may be performed to form a top contact which is connected with the top layer 127 through the dielectric layer. Further, a bit line may be formed on the dielectric layer and connected with the top contact.

The semiconductor device of FIG. 5F includes the interlayer dielectric layer 121 which is disposed on the substrate 120 and has the recess 123, the bottom contact 124 which partially fills the recess 123, the bottom layer 125 of the magnetic resistance element ME which fills the remainder of the recess 123 on the bottom contact 124, and the remaining layers of the magnetic resistance element ME, for example, the MTJ structure 126 and the top layer 127, which are disposed on the bottom layer 125.

The recess 123 has the wine glass shape when viewed in its entirety. Accordingly, the top surface of the bottom layer 125 has a greater width than the lower part of the recess. The entire bottom surface of the MTJ structure 126 may be present on only the bottom layer 125.

In the semiconductor device as described above, data may be stored using a characteristic that the resistance value of the magnetic resistance element ME varies according to the magnetization directions of the bottom magnetic layer 126A and the top magnetic layer 126C. For example, according to the current supplied through the bottom contact 124 and the top contact (not shown), the magnetization directions of the bottom magnetic layer 126A and the top magnetic layer 126C become parallel or anti-parallel to each other. When the magnetization directions are parallel to each other, the magnetic resistance element ME may exhibit a low resistant state and store data '0', and, when the magnetization directions are anti-parallel to each other, the magnetic resistance element ME may exhibit a high resistant state and store data '1'.

The above implementations may be used to achieve one or more following advantages.

First, because the bottom layer 125 as a part of the magnetic resistance element ME is filled in the recess 123 together with the bottom contact 124, etching is not required to form the bottom layer 125. Therefore, a process margin may be increased when patterning the magnetic resistance element ME.

Also, due to the fact that the bottom layer 125 has the shape which is filled in the recess 123, since it is not necessary to decrease the thickness of the bottom layer 125, the planarization process may be easily performed. Namely, the flatness of the top surface of the bottom layer 125 may be secured.

Further, because the width of the top surface of the bottom layer 125 is increased by increasing the width W2 of the top end of the recess 123, an alignment margin may be increased, and thus, it is easy to form the MTJ structure 126 in such a manner that the MTJ structure 126 entirely overlaps with the top surface of the bottom layer 125. Since the flatness of the top surface of the bottom layer 125 is excellent as described above, when the MTJ structure 126 entirely overlaps with the top surface of the bottom layer 125, it is possible to prevent the tunnel barrier layer 126B of the MTJ structure 126 from warping and secure the characteristic of the magnetic resistance element ME. If the MTJ structure 126 is larger than the bottom layer 125 or is misaligned to overlap with also a portion of the interlayer dielectric layer 121, an unevenness may be caused in the tunnel barrier layer 126B of the MTJ structure 126 due to a step which may occur at the boundary between the bottom layer 125 and the interlayer dielectric layer 121 in spite of the planarization process. Such a problem may be solved by the present implementation of the present disclosure.

FIGS. 6A to 6D are cross-sectional views explaining a semiconductor device and an example of a method for fabricating the same in accordance with another implementation of the present disclosure.

Figure 6A:
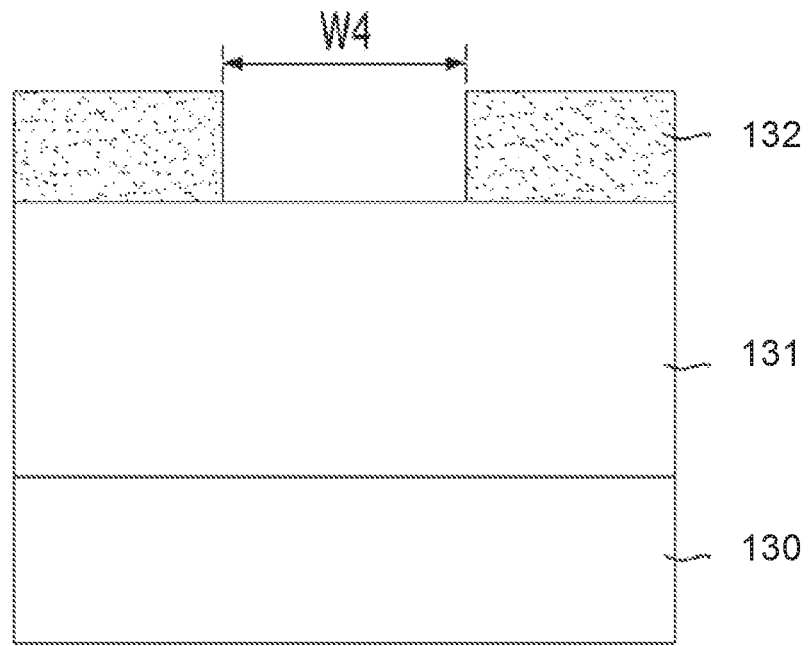
FIGS. 6A to 6D are cross-sectional views explaining a semiconductor device and an example of a method for fabricating the same in accordance with another implementation of the disclosed technology in the present disclosure.

Referring to FIG. 6A, an interlayer dielectric layer 131 is formed on a substrate 130 with a desired predetermined structure, for example, a switching element (not shown).

A first hard mask pattern 132 is formed on the interlayer dielectric layer 131 to have an opening which exposes a region where a bottom contact will be formed. A width W4 of the opening of the first hard mask pattern 132 may be greater than a desired bottom width of the bottom contact, and may correspond to a desired width of the top surface of a bottom layer which will be described later.

Figure 6B:
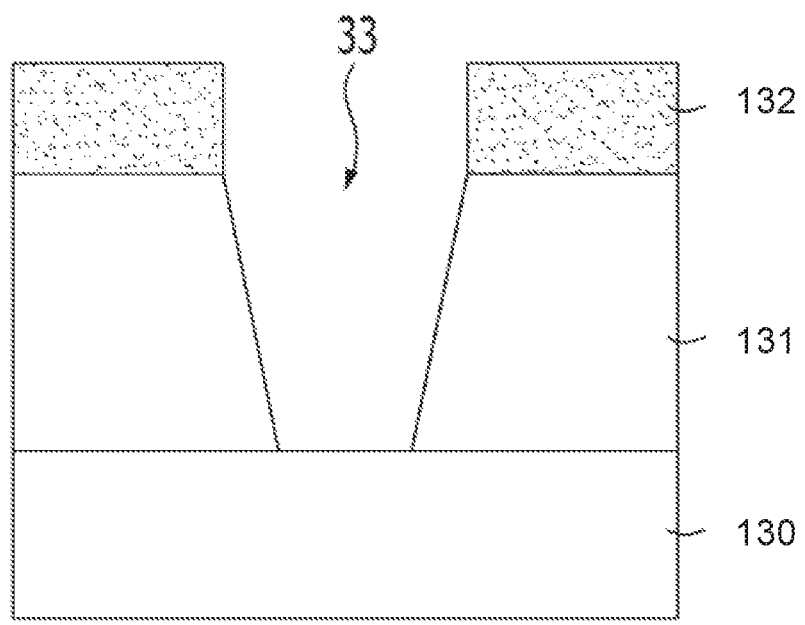

Referring to FIG. 6B, a recess 133 is formed to expose the substrate 130 by etching the interlayer dielectric layer 131 which is exposed through the first hard mask pattern 132. The sloped etching is performed for forming the interlayer dielectric layer 31 and the width of the recess 133 may gradually decrease from the top to the bottom. The sloped etching may be performed such that the width of the bottom of the recess 133 has the desired bottom width of the bottom contact.

Figure 6C:
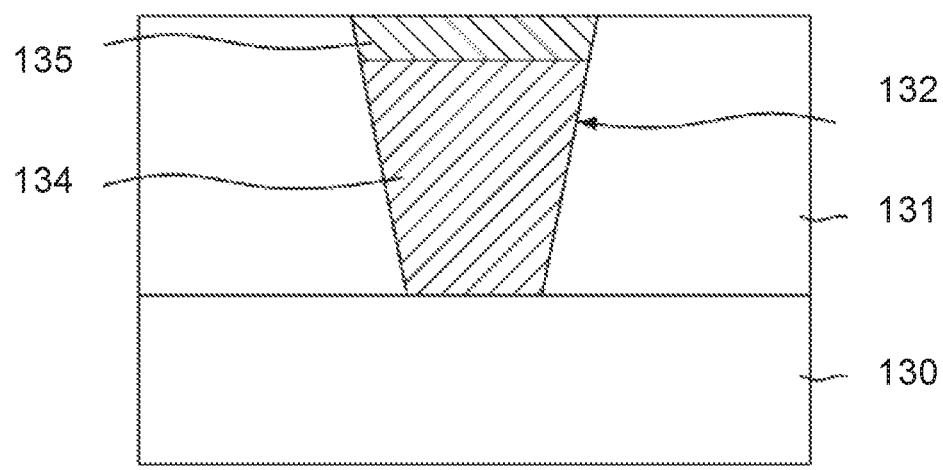

Referring to FIG. 6C, after removing the first hard mask pattern 132, a bottom contact 34 is formed to partially fill the recess 133.

A bottom layer 135 is formed on the bottom contact 134 to fill the remainder of the recess 133. The top surface of the bottom layer 135 may have the same width as the width of the top end of the recess 133.

Figure 6D:
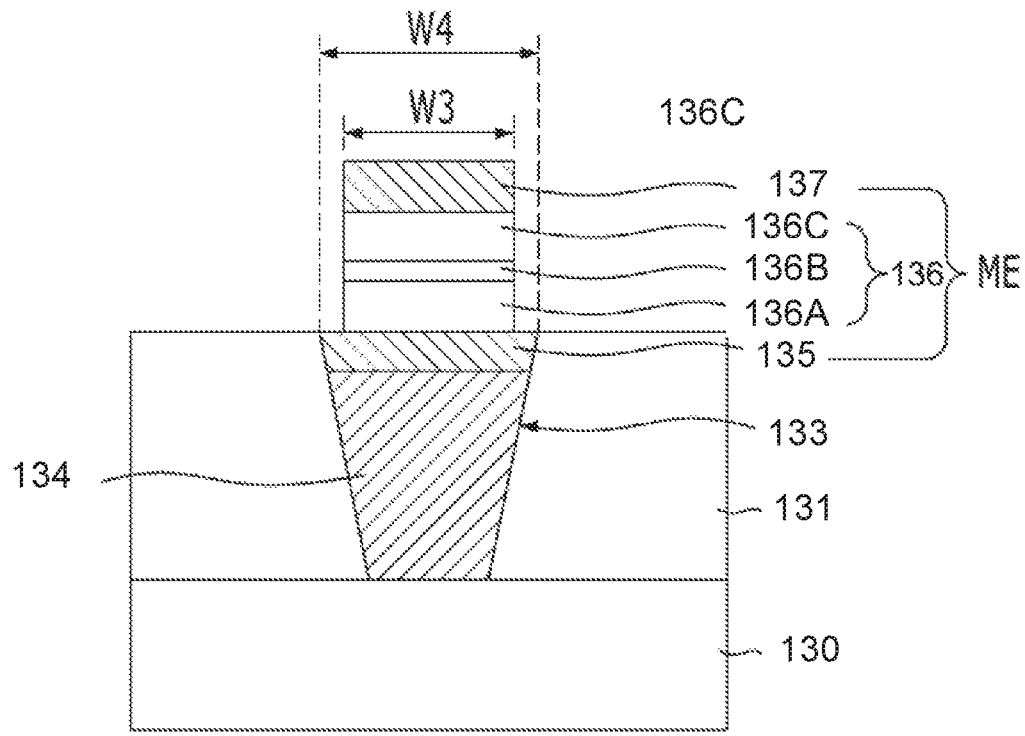

Referring to FIG. 6D, material layers for forming an MTJ structure 136 are formed on the resultant structure of FIG. 6C. Next, a top layer 137 for patterning of a magnetic resistance element is formed on the material layers. By etching the material layers using the top layer 137 as an etch barrier, the MTJ structure 136 is formed. The MTJ structure 136 may include, for example, a bottom magnetic layer 136A, a tunnel barrier layer 136B and a top magnetic layer 136C which are sequentially stacked. As a result of this process, a magnetic resistance element ME in which the bottom layer 135, the MTJ structure 136 and the top layer 137 are sequentially stacked may be formed.

The semiconductor device of FIG. 6D differs from the semiconductor device of FIG. 5F in terms of a method for forming the recess 133 and the shape of the recess 133. In the semiconductor device of FIG. 5F, the recess 123 is formed through two etching processes to have the wine glass shape. In the semiconductor device of FIG. 6D, the recess 133 is formed through one etching process to have a downwardly decreasing shape.

However, the semiconductor device of FIG. 6D and the semiconductor device of FIG. 5F are the same in that the width of the top ends of the recesses 123 and 133 is greater than the width of the bottom ends of the recesses 123 and 133 and that the bottom contact 124 or 134 and the bottom layer 125 or 135 fill different portions of the recesses 123 or 133. The effects as achieved by the semiconductor device of FIG. 5F can be provided in the semiconductor device of FIG. 6D.

While it was explained in the above implementations that the entire bottom layer of the magnetic resistance element is filled in the recess, other limitations are also possible. For example, a bottom layer may have two different portions, one of which resides in a recess and the other of which does not reside in the recess and protrudes out of an interlayer dielectric layer. The one portion of the bottom layer which resides in the recess may have the same plane shape as the top end of the recess. The other portion of the bottom layer which protrudes out of the interlayer dielectric layer may have substantially the same plane shape as the top layer since it is etched using the top layer.

The bottom layer that resides in the recess may have the thickness not less than the thickness that is obtained by subtracting a patternable thickness from the total thickness of a magnetic resistance element. The patternable thickness may be determined based on the distance between adjacent magnetic resistance elements. For example, if patterning of the magnetic resistance element ME is performed through IBE, when the distance between adjacent magnetic resistance elements ME is 100, a patternable thickness may be about 120. If the total thickness of the magnetic resistance element ME exceeds 120, a thickness exceeding the patternable thickness may be buried in the recess.

Moreover, while it was explained in the above implementations that the bottom layer of a magnetic resistance element resides in the recess, other implementations are also possible. Further, the above-described implementations may be applied to various resistance variable elements as well.

For example, a resistance variable element used in an RRAM may include a conductive bottom layer, a conductive top layer and a metal oxide interposed therebetween. The metal oxide may include, for example, a transition metal oxide, a perovskite-based material, and so forth. Such a resistance variable element may exhibit a characteristic switched between different resistant states due to, for example, creation and extinction of current filaments through behavior of vacancies.

Otherwise, a resistance variable element used in a PRAM may include a conductive bottom layer, a conductive top layer and a phase change material interposed therebetween. The phase change material may include, for example, a chalcogenide-based material. Such a resistance variable element may exhibit a characteristic switched between different resistant states, for example, as the phase change material is stabilized to any one of a crystalline state and an amorphous state by heat.

In such various resistance variable elements, the entirety or a portion of the conductive bottom layer may reside in a portion of a recess in which a bottom contact is not formed. Thus, the same effects as those of the above-described implementations may be achieved.

FIGS. 7A to 7F are cross-sectional views explaining an example of a method for forming a recess.

Figure 7A:
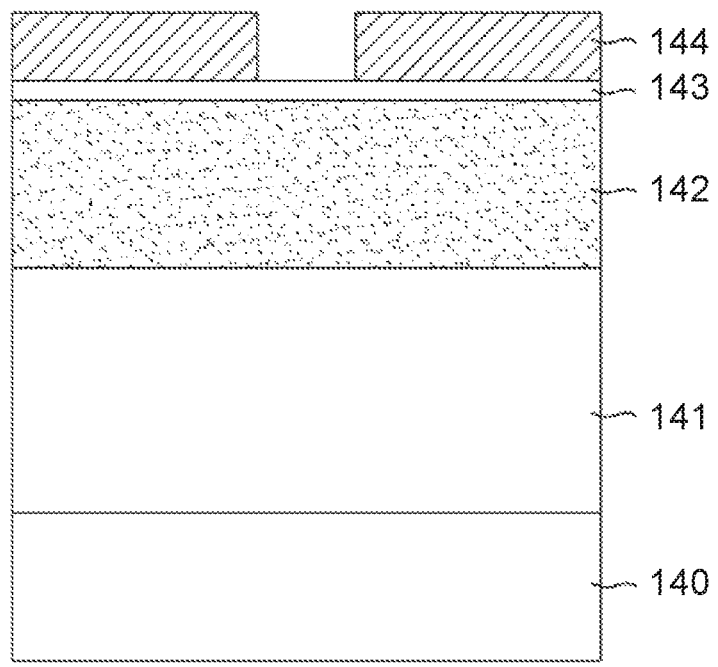
FIGS. 7A to 7F are cross-sectional views explaining an example of a method for forming a recess in a semiconductor device in accordance with an implementation of the disclosed technology in the present disclosure.

Referring to FIG. 7A, a substrate 140, which is formed with a desired predetermined structure, for example, a switching element (not shown), is provided.

An interlayer dielectric layer 141 is formed on the substrate 140. The interlayer dielectric layer 141 may be formed using various dielectric materials such as a silicon oxide and so forth.

A hard mask layer 142 is formed on the interlayer dielectric layer 141. The hard mask layer 142 may be a single layer or a multi-layer including various materials each of which has an etching selectivity with respect to the interlayer dielectric layer 141. For example, the hard mask layer 142 may be a double layer in which an amorphous carbon layer and a SiON layer are stacked.

A first anti-reflective layer 43 is formed on the hard mask layer 142. The first anti-reflective layer 143 may be a BARC (bottom anti-reflective coating) layer.

A first photoresist pattern 144 is formed on the first anti-reflective layer 143 to have an opening which exposes a region where a bottom contact will be formed. The width of the opening of the first photoresist pattern 144 may be substantially the same as a desired bottom width of the bottom contact. The first photoresist pattern 144 may be formed by applying a first photoresist on the first anti-reflective layer 143 and then performing exposure and development. In performing exposure, a portion of the first photoresist which receives light may be substituted by a material including a carboxyl group (—COOH). Development may be performed by NTD (negative-tone development). For the case of NTD, a development solution such as an organic solvent is used, and thus, a portion of the first photoresist which is not exposed may be removed and a portion of the first photoresist which is exposed may not be removed and remain. Therefore, exposure is performed such that a portion of the first photoresist which corresponds to the opening is not exposed and the remaining portion of the first photoresist is exposed.

Figure 7B:
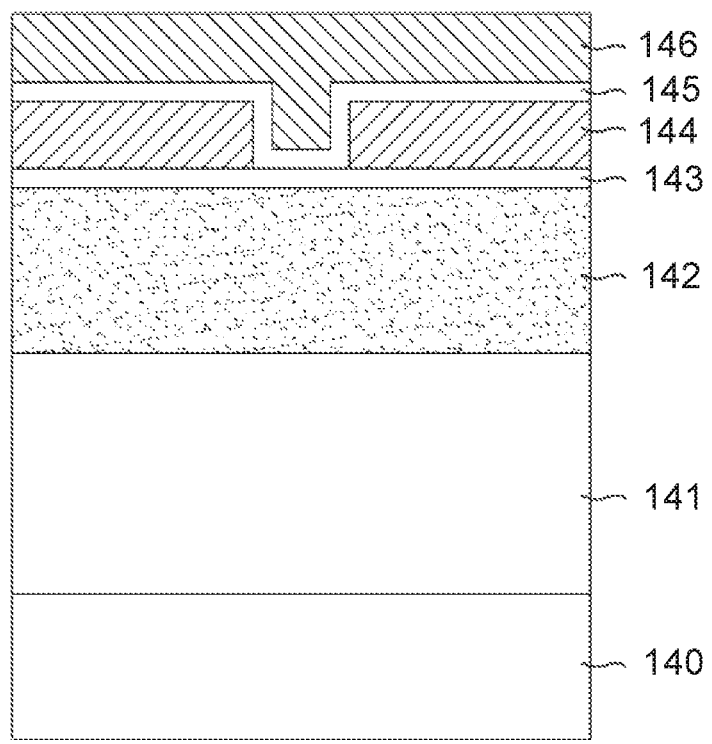

Referring to FIG. 7B, a second anti-reflective layer 145 is formed along the profile of FIG. 7A. The second anti-reflective layer 145 may be a DBARC (developer-soluble bottom anti-reflective coating) layer.

A second photoresist 146 is applied on the second anti-reflective layer 145.

Figure 7C:
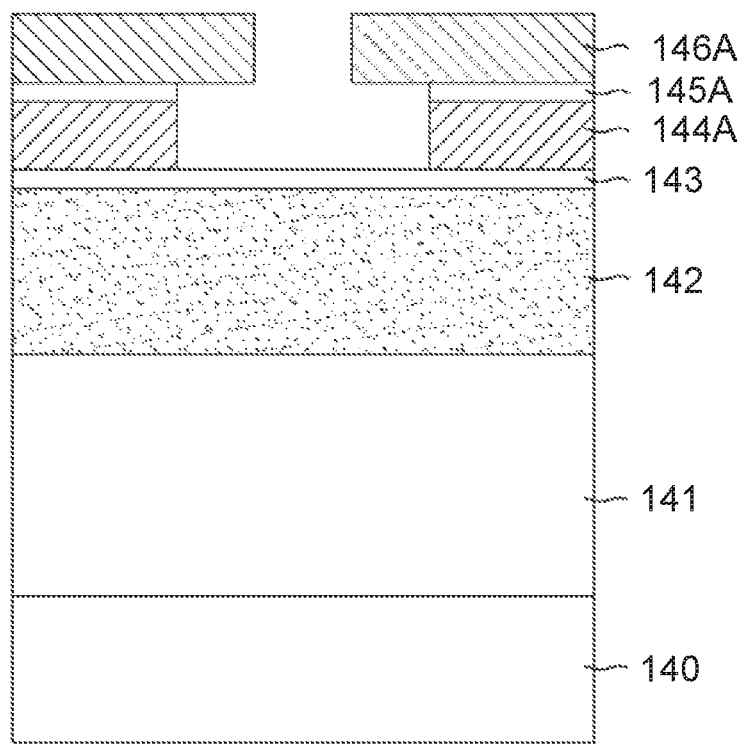

Referring to FIG. 7C, a second photoresist pattern 146A is formed by exposing and developing the second photoresist 146. The second photoresist pattern 146A has an opening which exposes a region where the bottom contact will be formed, and the width of the opening may be substantially the same as the desired bottom width of the bottom contact. Development may be performed by PTD (positive-tone development). For the case of PTD, a development solution such as a TMAH (tetra methyl ammonium hydroxide) is used, and thus, a portion of the second photoresist 46 which is exposed may be removed and a portion of the second photoresist 46 which is not exposed may not be removed and remain. Therefore, exposure is performed such that a portion of the second photoresist 146 which corresponds to the opening may be exposed and the remaining portion of the second photoresist 146 may not be exposed.

In the course of developing the second photoresist 146, a portion of the second anti-reflective layer 145 including a DBARC layer may be removed by the development solution. The second anti-reflective layer 145 which is partially removed will be referred to as a second anti-reflective layer pattern 145A.

Further, in the course of developing the second photoresist 146, a portion of the first photoresist pattern 144 may be removed by the development solution. This is because the first photoresist pattern 144 has already received light in the exposure process of the first photoresist and the development of the second photoresist 146 is performed in the scheme of PTD. The first photoresist pattern 144 which is partially removed will be referred to as a final or remaining first photoresist pattern 144A. The width of the opening of the remaining first photoresist pattern 144A is greater than the width of the opening of the first photoresist pattern 144 and the width of the opening of the second photoresist pattern 146A.

The hard mask layer 142 and the interlayer dielectric layer 141 are etched using the remaining first photoresist pattern 144A and the second photoresist pattern 146A as etch barriers until the substrate 140 is exposed. This procedure will be described in detail with reference to FIGS. 7D to 7F.

Figure 7D:
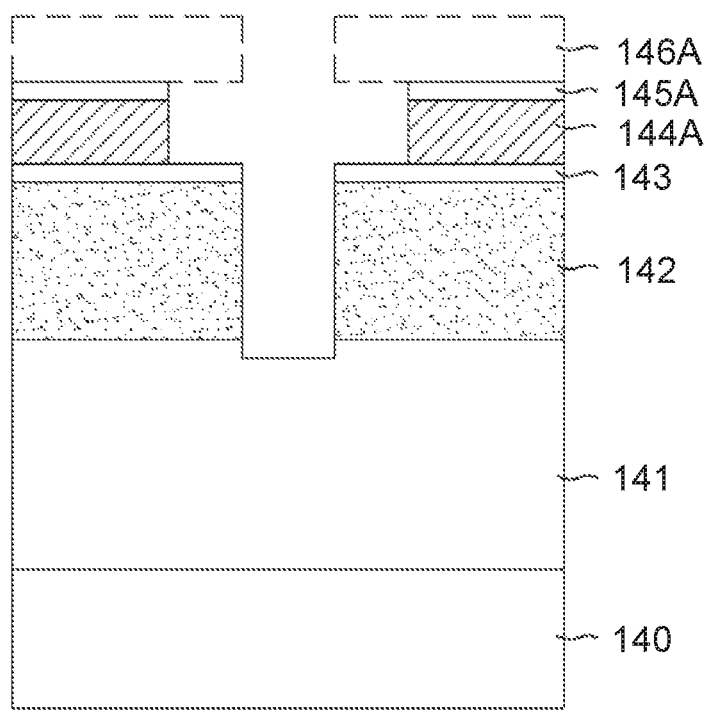

Referring to FIG. 7D, since the overlying second photoresist pattern 146A serves as an etch barrier at an initial etching stage, a hole corresponding to the opening of the second photoresist pattern 146A is formed in the hard mask layer 142 and/or a portion of the interlayer dielectric layer 141 until the second photoresist pattern 146A is entirely lost.

Figure 7E:
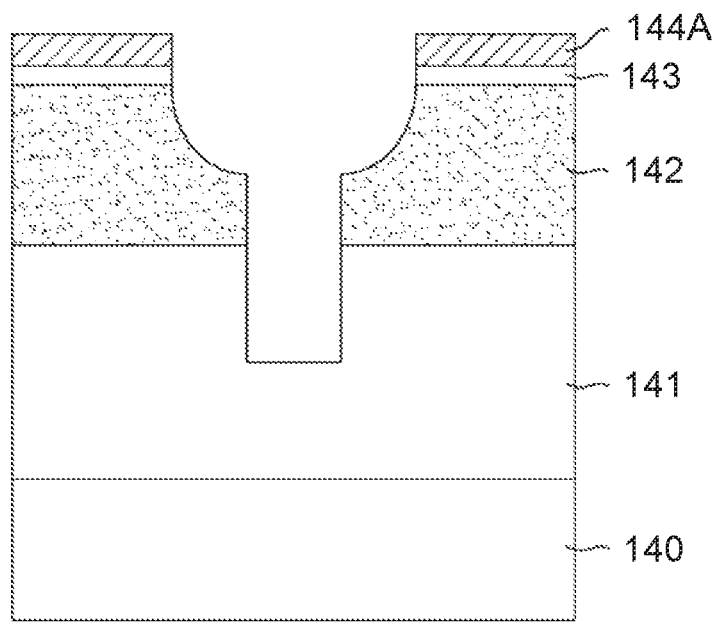

Referring to FIG. 7E, after the second photoresist pattern 146A is lost, the hard mask layer 142 and/or the interlayer dielectric layer 141 are etched using the remaining first photoresist pattern 144A as an etch barrier. The opening of the remaining first photoresist pattern 144A is greater than the opening of the second photoresist pattern 146A. Further, portions of the hard mask layer 142 and/or the interlayer dielectric layer 141 which have been already etched using the second photoresist pattern 146A are positioned lower than the other portions. Thus, a wine glass-like recess is formed to have a portion which gradually increases downward.

Figure 7F:
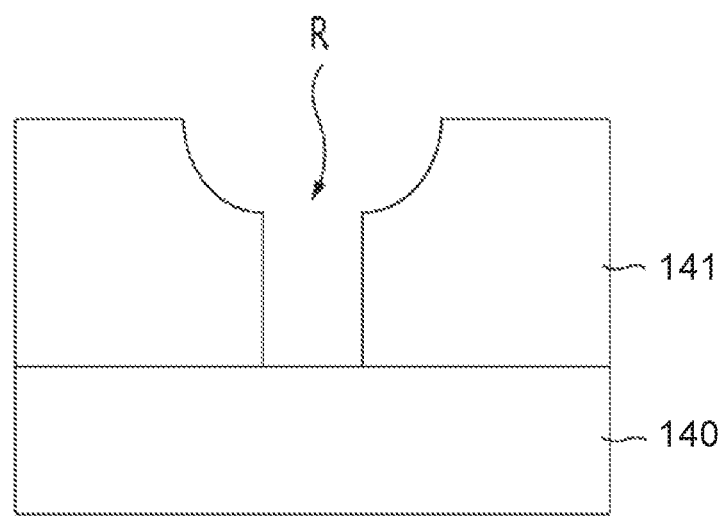

Referring to FIG. 7F, a recess R with a wine glass shape may be formed in the interlayer dielectric layer 141.

In the present implementation, unlike the aforementioned implementation, it is possible to form the recess R with a wine glass shape through one etching process.

FIGS. 8A to 8F are cross-sectional views explaining an example of a method for forming a recess.

Figure 8A:
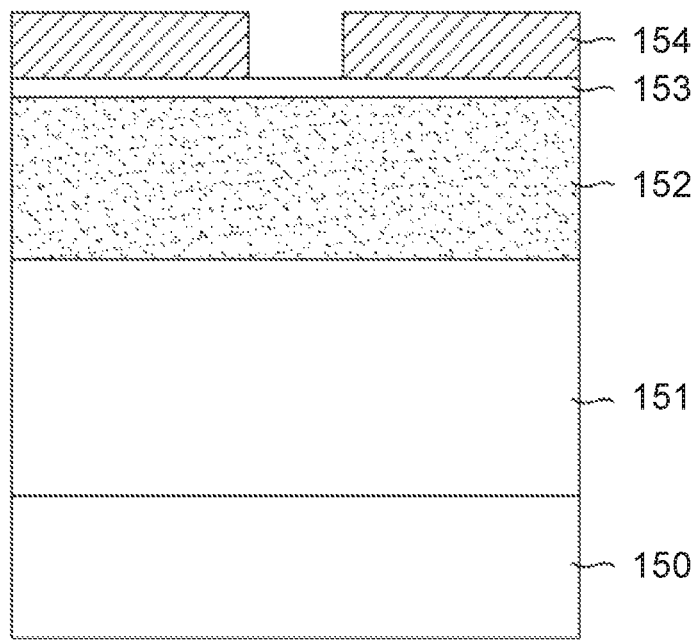
FIGS. 8A to 8F are cross-sectional views explaining an example of a method for forming a recess in a semiconductor device in accordance with an implementation of the disclosed technology in the present disclosure.

Referring to FIG. 8A, an interlayer dielectric layer 151, a hard mask layer 152 and an anti-reflective layer 153 are formed on a substrate 150, which is formed with a desired predetermined structure, for example, a switching element (not shown).

A first photoresist pattern 154 having an opening which exposes a region where a bottom contact will be formed is formed on the anti-reflective layer 153. The width of the opening of the first photoresist pattern 154 may be substantially the same as a desired bottom width of the bottom contact.

Figure 8B:
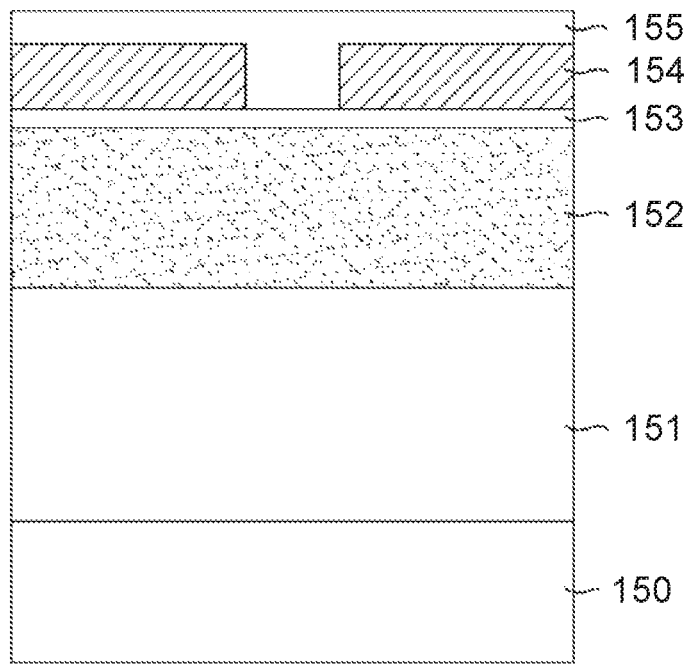

Referring to FIG. 8B, a water-soluble polymer layer 155 is formed on the resultant structure of FIG. 8A, through coating. Because the water-soluble polymer layer 155 does not react with a photoresist, it may not exert any influence on the first photoresist pattern 154 and a second photoresist pattern which will be formed through a subsequent process. In addition, the water-soluble polymer layer 155 may have a planar surface which enables to easily fill the opening of the first photoresist pattern 154. Thus, a subsequent process for forming the second photoresist pattern can be easily performed.

Figure 8C:
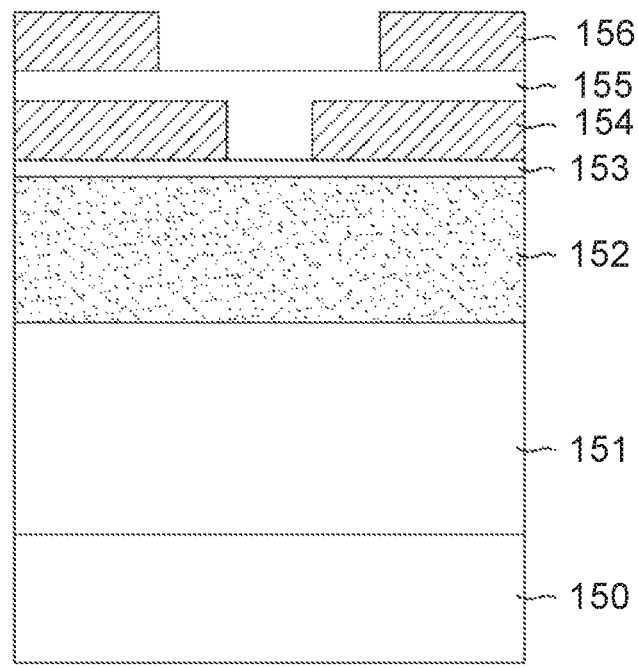

Referring to FIG. 8C, a second photoresist pattern 156 is formed on the water-soluble polymer layer 155. The opening of the second photoresist pattern 156 may have a width greater than the width of the opening of the first photoresist pattern 154 while overlapping with the opening of the first photoresist pattern 154.

Figure 8D:
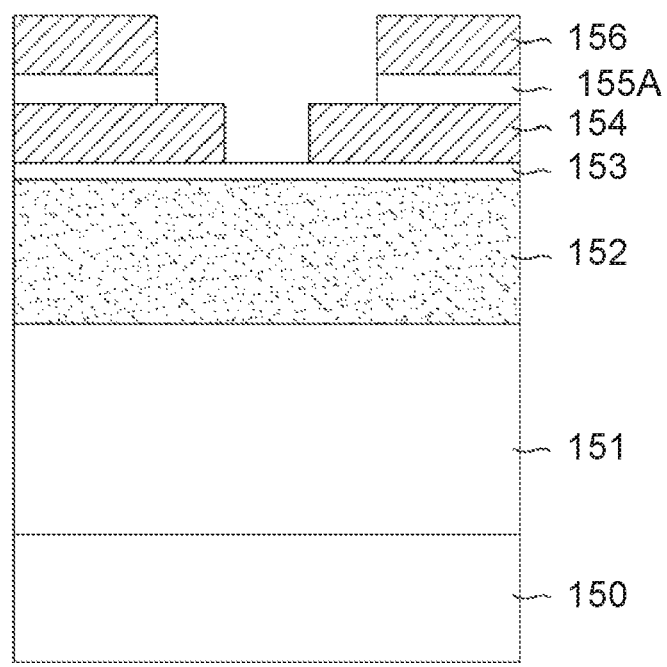

Referring to FIG. 8D, a portion of the water-soluble polymer layer 155 which is exposed through the second photoresist pattern 156 is removed. This removal process may be performed by spraying deionized (DI) water to the resultant structure of FIG. 8C. As a result, a water-soluble polymer pattern 155A is present between the second photoresist pattern 156 and the first photoresist pattern 154.

The hard mask layer 152 and the interlayer dielectric layer 151 are etched using the first photoresist pattern 154 and the second photoresist pattern 156 as etch barriers until the substrate 150 is exposed. This procedure will be explained in detail with reference to FIGS. 5E and 5F.

Figure 8E:
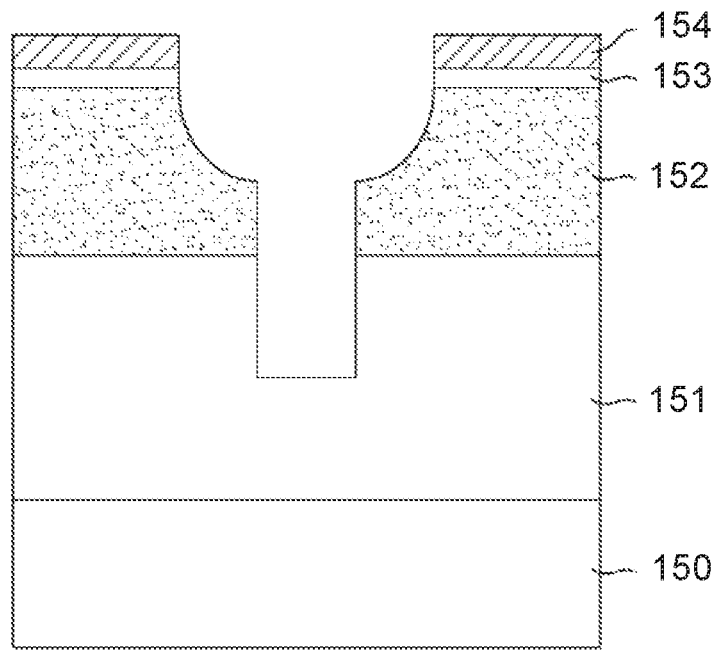

Referring to FIG. 8E, when etching the hard mask layer 152 and the interlayer dielectric layer 151, the portion of the hard mask layer 152 which is exposed through the opening of the first photoresist pattern 154 is etched first and a hole corresponding to the opening is formed. The portion of the hard mask layer 152 over which the first photoresist pattern 154 is present and the second photoresist pattern 156 is not present is etched relatively slowly. Accordingly, a recess is formed to have a wine glass shape having a portion which gradually increases downward.

Figure 8F:
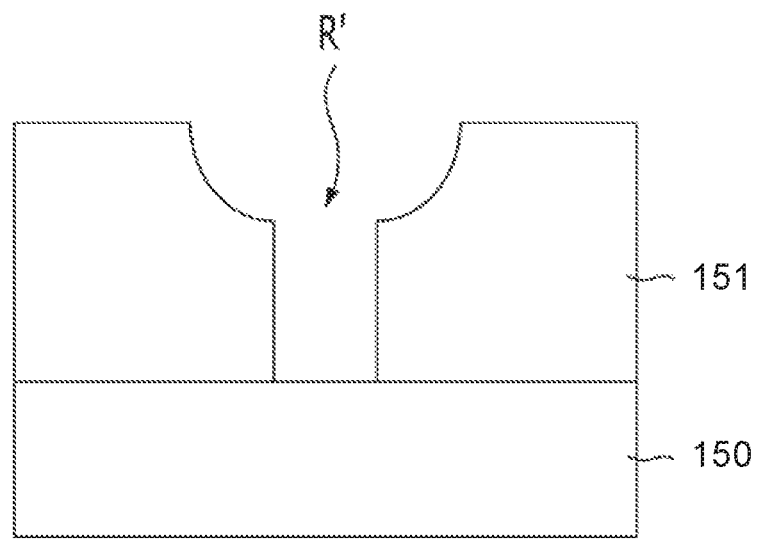

Referring to FIG. 8F, a recess R' with a wine glass shape may be formed in the interlayer dielectric layer 151.

In the present implementation, it is possible to form the recess R' with a wine glass shape through one etching process.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

Section 3: Lower Layer Including Metal with Higher Electron Affinity

Some implementations of the disclosed technology provide an electronic device including a variable resistance element having a part filled in an interlayer dielectric layer.

Figure 9A:
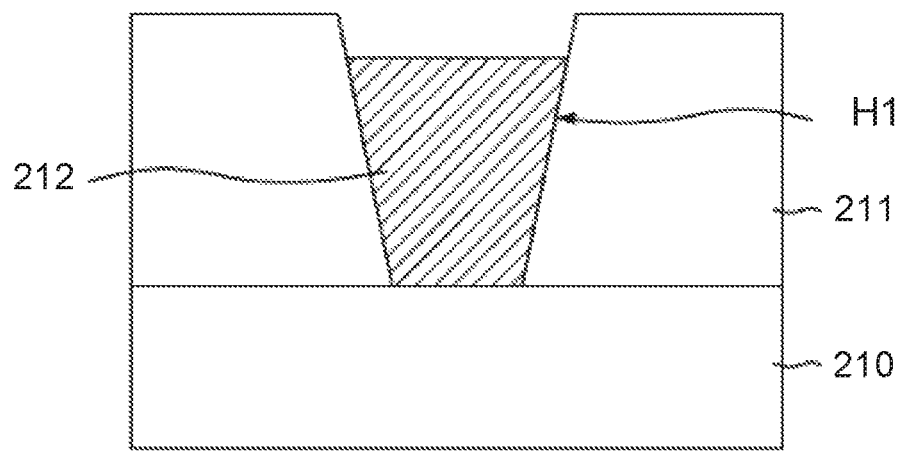
FIGS. 9A to 9D are cross-sectional views explaining a semiconductor device and an example of a method for fabricating the same in accordance with an implementation of the disclosed technology.
Figure 9B:
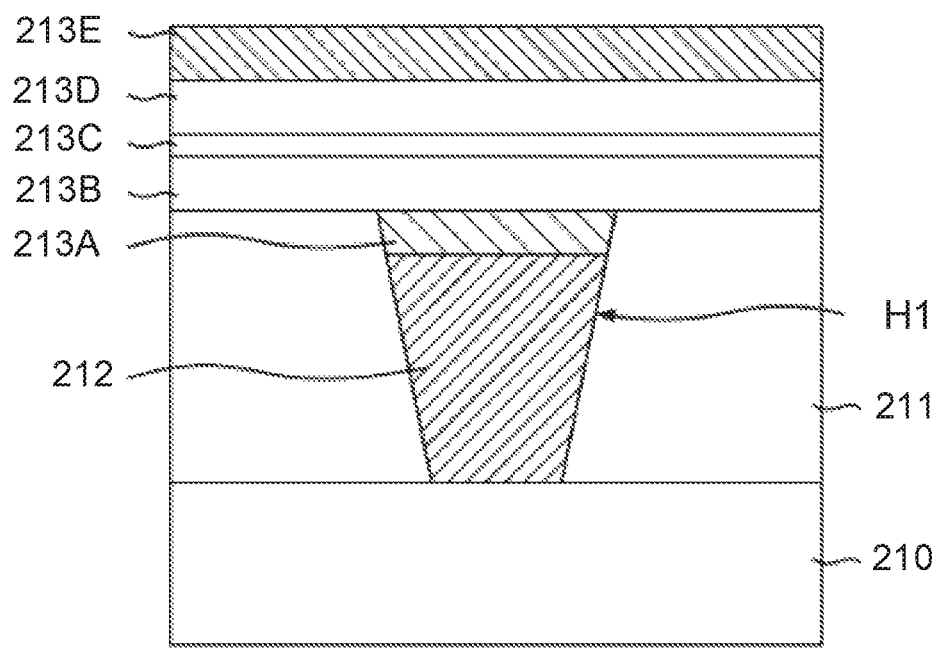
Figure 9C:
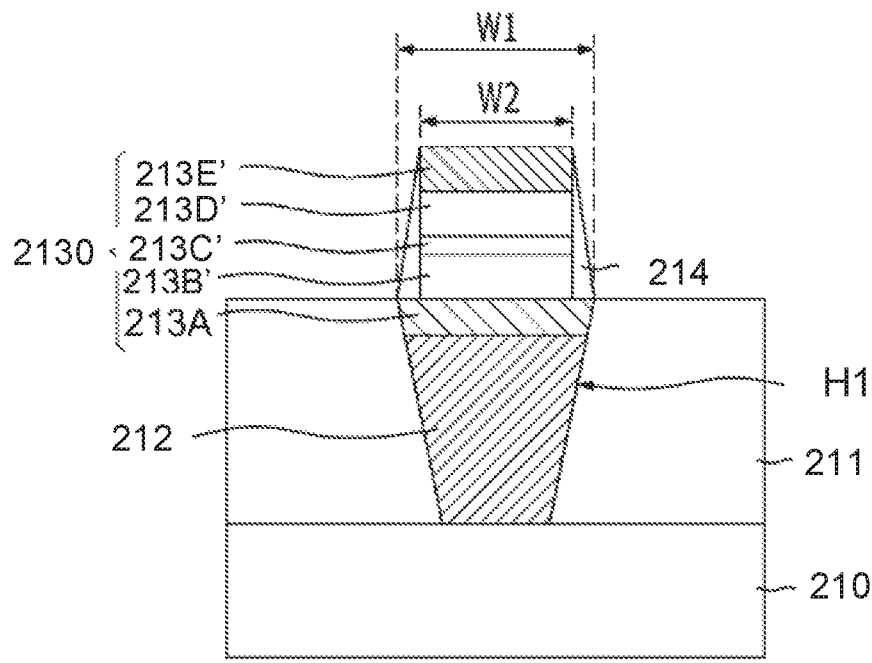
Figure 9D:
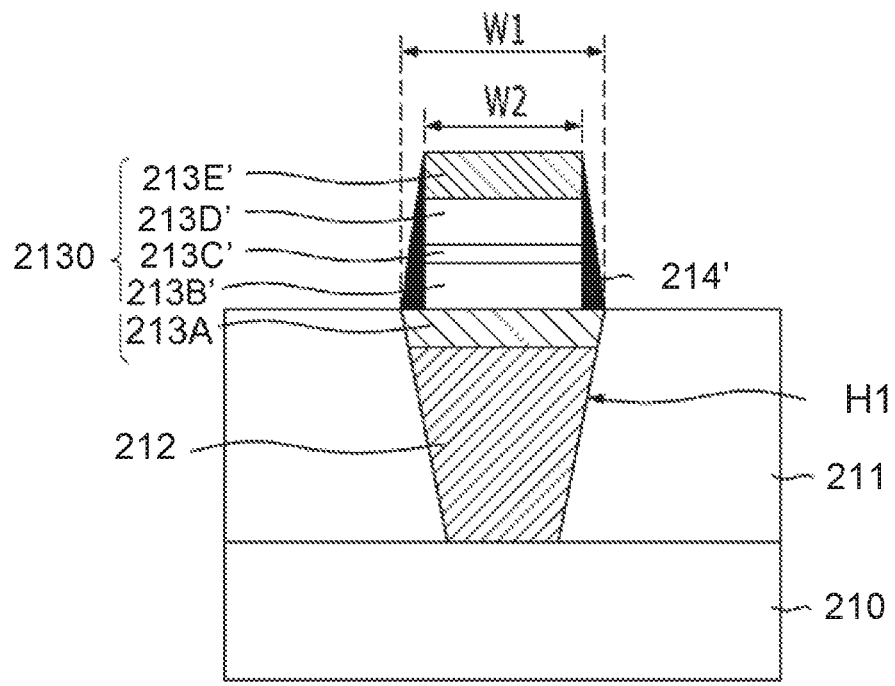

FIGS. 9A to 9D are cross-sectional views explaining a semiconductor device and an example of a method for fabricating the same in accordance with an implementation. FIG. 9D shows an example of the semiconductor device, and FIGS. 9A to 9C show intermediate processing steps for forming the semiconductor device of FIG. 9D.

First, the fabricating method will be described.

Referring to FIG. 9A, a substrate 210 including a specific structure, for example, a switching element (not shown) may be provided. The switching element, which is coupled to a variable resistance element, controls the supply of a current or voltage to the variable resistance element. The switching element may be a transistor, a diode, etc. One end of the switching element may be electrically coupled to a lower contact which will be described later, and the other end of the switching element may be electrically coupled to a line, for example, a source line.

An interlayer dielectric layer 211 may be formed over the substrate 210. The interlayer dielectric layer 211 may be or include various insulating materials, such as a silicon oxide, etc.

A contact hole H1 exposing a part of the substrate 210 may be formed by selectively etching the interlayer dielectric layer 211, and then a lower contact 212 filling a part of the contact hole H1 may be formed. The lower contact 212 may be formed by depositing a conductive material having a thickness to sufficiently fill the contact hole H1, and then performing an etch-back process to the conductive material until an upper surface of the lower contact 212 becomes lower than that of the interlayer dielectric layer 211. The lower contact 212 may be formed of a conductive material which has an excellent gap filling property and a high electrical conductivity, such as W, Ta, TiN, etc.

Referring to FIG. 9B, a multi-layer structure including layers 213A, 213B, 213C, 213D and 213E may be formed over a resultant structure of FIG. 9A. The multi-layer structure may be configured to form a variable resistance element.

In this implementation, the variable resistance element includes a Magnetic Tunnel Junction (MTJ) structure including two magnetic layers and a tunnel barrier layer interposed therebetween, and additional layers disposed under and/or over the MTJ structure having various uses, for example, improving a characteristic of the variable resistance element and/or facilitating processes. As is well known, it is difficult to satisfy a desired characteristic of the variable resistance element when using only the MTJ structure. Therefore, it is necessary to dispose one or more additional layers under and/or over the MTJ structure in certain implementations.

For the convenience of description, one or more layers disposed under the MTJ structure will be referred to as a lower layer, and one or more layers disposed over the MTJ structure will be referred to as an upper layer. Each of the lower layer and the upper layer may be a single layer or a multiple layer. The lower layer and/or the upper layer may be a part of the variable resistance element, so the lower layer and/or the upper layer may be differentiated from the lower contact 212 and upper contact (not shown) which are coupled to the variable resistance element for electrically connecting the variable resistance element with another element (now shown). For forming the variable resistance element, the multi-layer structure may include a lower magnetic layer 213B, an upper magnetic layer 213D, a tunnel barrier layer 213C interposed between the lower magnetic layer 213B and the upper magnetic layer 213D, a lower layer 213A disposed under the lower magnetic layer 213B, and an upper layer 213E disposed over the upper magnetic layer 213E.

In this implementation, the lower layer 213A may be filled in the contact hole H1 where the lower contact 212 is formed. The lower layer 213A may be formed by depositing a material layer for forming the lower layer 213A over the resultant structure of FIG. 9A, and then performing a planarization process, for example, a CMP (Chemical Mechanical Polishing) process until the interlayer dielectric layer 211 is exposed. Subsequently, the lower magnetic layer 213B, the tunnel barrier layer 213C, the upper magnetic layer 213D and the upper layer 213E may be sequentially deposited over the lower layer 213A and the interlayer dielectric layer 211.

The lower magnetic layer 213B and the upper magnetic layer 213D may include a ferromagnetic material. The ferromagnetic material may be an alloy of which a main component is Fe, Ni and/or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, etc. One of the lower magnetic layer 213B and the upper magnetic layer 213D may be a pinned layer having a pinned magnetization direction, and the other thereof may be a free layer having a variable magnetization direction.

The tunnel barrier layer 213C may change the magnetization direction of the free layer by the tunneling of electrons. The tunnel barrier layer 213C may include an oxide such as MgO, CaO, SrO, TiO, VO, NbO, etc.

The lower layer 213A may include a metal-containing layer. The metal-containing layer may include a metal which has a higher electron affinity than a component included in the lower magnetic layer 213B and the upper magnetic layer 213D. The lower magnetic layer 213B and the upper magnetic layer 213D may include Fe, Ni and/or Co, and has an insulating property when the metal is oxidized. The metal may include one or more Al, Ti, Hf, Mg, etc. The metal-containing layer may be a metal layer or a metal compound layer such as a metal oxide layer, a metal nitride layer, a metal borides layer, etc.

The below Table 1 shows a standard electrode potential of various metals. An increase of a negative value (−) means an increase of ease of oxidation. Referring to Table 1, a difference of a standard electrode potential is great between a metal included in the lower layer 213A and a metal included in the lower magnetic layer 213B and the upper magnetic layer 213D.

TABLE 1

| Metal | standard electrode potential E° |
|---|---|
| Al | −1.66 |
| Ti | −1.63 |
| Hf | −1.55 |
| Mg | −2.37 |
| Fe | −0.45 |
| Co | −0.28 |
| Ni | −0.228 |
| Ta | −0.60 |
| W | 0.10 |

The lower layer 213A may be formed as a single layer or multiple layers. The lower layer 213A formed as a single layer may include the above metal-containing layer. The lower layer 213A formed as multiple layers may include the above metal-containing layer for its uppermost layer only. In this case, one or more remaining layers except for the uppermost layer may be used in improving a characteristic of the MTJ structure. The remaining layer(s) of the lower layer 213A may perform various functions as needed. For example, the remaining layer(s) of the lower layer 213A may include a layer which increases adhesion to the lower contact 212 and/or a layer which has a magnetization direction opposite to the pinned layer of the MTJ structure and offset an influence of a magnetic field applied to the free layer by the pinned layer.

The upper layer 213E may include a single layer or a multiple layer which has various functions as needed. For example, the upper layer 213E may include a conductive layer which has a strong resistance to a physical etching and function as a hard mask in subsequent steps of etching the upper magnetic layer 213D, the tunnel barrier layer 213C and the lower magnetic layer 213B. The upper layer 13E may include a tungsten layer. For example, the upper layer 213E may include a layer which has a magnetization direction opposite to the pinned layer of the MTJ structure and offset an influence of a magnetic field applied to the free layer by the pinned layer.

Referring to FIG. 9C, an upper pattern 213E', an upper magnetic pattern 213D', a tunnel barrier pattern 213C' and a lower magnetic pattern 213B' may be formed by etching the upper layer 213E, the upper magnetic layer 213D, the tunnel barrier layer 213C and the lower magnetic layer 213B using a mask (not shown) for patterning the variable resistance element. As a result, a variable resistance element 2130 is formed to include the lower layer 213A, the lower magnetic pattern 213B', the tunnel barrier pattern 213C', the upper magnetic pattern 213D' and the upper pattern 213E'. Since the lower layer 213A has a shape defined by the contact hole H1 in the aforementioned process of FIG. 9B, this etching process may be applied for the upper layer 213E, the upper magnetic layer 213D, the tunnel barrier layer 213C and the lower magnetic layer 213B. This etching process may be performed by using a strong physical etching characteristic, for example, IBE (Ion Beam Etching) method.

As a result, the variable resistance element may be formed such that a part of the variable resistance element 2130 is filled in the interlayer dielectric layer 211 and a remaining part of the variable resistance element 2130 protrudes from the interlayer dielectric layer 211.

Here, the part of the variable resistance element 2130 that is filled in the interlayer dielectric layer 211 may include the lower layer 213A, and the remaining part of the variable resistance element 2130 that protrudes from the interlayer dielectric layer 211 may include a stacked structure of the lower magnetic pattern 213B', the tunnel barrier pattern 213C', the upper magnetic pattern 213D' and the upper pattern 213E'. The remaining part of the variable resistance element 2130 may overlap with the contact hole H1. In this case, a width W2 of a bottom surface of the remaining part of the variable resistance element 2130 is equal to or smaller than a width W1 of a top end of the contact hole H1. That is, the remaining part of the variable resistance element 2130 may be disposed over the lower layer 213A which has a planarized surface. Since the tunnel barrier pattern 213C' is over a planar surface, it is possible to avoid a degradation of characteristics of the MTJ structure. If the remaining part of the variable resistance element 2130 has a width larger than the contact hole H, the tunnel barrier pattern 213C' may be bent over a boundary between the lower layer 213A and the interlayer dielectric layer 211, thereby degrading characteristics of the MTJ structure.

When the remaining part of the variable resistance element 2130 is formed over the lower layer 213A, a part of the lower layer 213A may be exposed during etching the upper layer 213E, the upper magnetic layer 213D, the tunnel barrier layer 213C and the lower magnetic layer 13B. Thus, a conductive material included in the lower layer 213A may be re-deposited over a sidewall of the remaining part of the variable resistance element 2130. The re-deposited conductive material is represented by a reference numeral 214. As described above, since the lower layer 213A includes a metal which has a high electron affinity and an insulating property when it is oxidized, the re-deposited conductive material 214 may include the metal as well. The re-deposited conductive material 214 may allow a current to flow between the lower magnetic pattern 213B' and the upper magnetic pattern 213D' which should be insulated from each other for a normal operation of the MTJ structure. Referring to FIG. 9D, a process is explained, which may be used to prevent the re-deposited conductive material 214 from interfering with the normal operation of the MTJ structure.

In FIG. 9D, a resultant structure of FIG. 9C may be subject to an oxidation process. The oxidation process may be performed by using a plasma oxidation or by flowing an oxygen-containing gas. Here, a metal included in the re-deposited conductive material 214 may have a high electron affinity compared with a metal included in the lower magnetic pattern 213B' and the upper magnetic pattern 213D'. That is, there is a large difference in a standard electrode potential. Therefore, it is possible to perform a selective oxidation which oxidizes the re-deposited conductive material 214 only and suppresses an oxidation of the lower magnetic pattern 13B' and the upper magnetic pattern 13D'. The re-deposited conductive material that has oxidized is represented by a reference numeral 214', and referred to as an insulating spacer. Since the insulating spacer 214' includes a metal oxide which has an insulating property, for example, an oxide of Al, Ti, Hf, Mg, etc, an electrical connection between the lower magnetic pattern 213B' and the upper magnetic pattern 213C' may be prevented. Furthermore, the insulating spacer 214' may be formed over a sidewall of the remaining part of the variable resistance element 2130 and protect the variable resistance element 2130. For example, the insulating spacer 214' prevents the variable resistance element 2130 from reacting to other materials in subsequent processes. In this case, a process of forming an additional spacer for protecting the variable resistance element 2130 may be skipped, and thus, a fabricating can be simplified.

Next, required subsequent processes are performed. In one implementation, although not shown, an upper contact may be formed over the variable resistance element 2130 to be electrically coupled to the variable resistance element 2130. Further, a bit line may be formed over the upper contact to be electrically coupled to the upper contact.

Referring again to FIG. 9D, the semiconductor device is formed to include the interlayer dielectric layer 11 which is disposed over the substrate 210 and has the contact hole H1, the lower contact 212 filled in a part of the contact hole H1, the variable resistance element 130 which fills a part of the contact hole H1 over the lower contact 212 and protrudes from the interlayer dielectric layer 211, and the insulating spacer 214' disposed over a sidewall of the variable resistance element 2130.

The variable resistance element 2130 may include the lower layer 213A, the lower magnetic pattern 213B', the tunnel barrier pattern 213C', the upper magnetic pattern 213D' and the upper pattern 213E'. The variable resistance element 2130 may be operated to store data as will be described below. When a current is supplied through the lower contact 212 and the upper contact (not shown), magnetization directions of the lower magnetic pattern 213B' and the upper magnetic pattern 213D' become parallel or anti-parallel to each other. For example, When the magnetization directions are parallel to each other, the variable resistance element 2130 may exhibit a low resistant state and store data "0", and, when the magnetization directions are anti-parallel to each other, the variable resistance element 2130 may exhibit a high resistant state and store data "1".

In this implementation, the lower layer 213A may be filled in a part of the contact hole H, and the stacked structure of the lower magnetic pattern 213B', the tunnel barrier pattern 213C', the upper magnetic pattern 213D' and the upper pattern 213E' may overlap with the lower layer 213A over the lower layer 213A and protrude over the interlayer dielectric layer 211. The width W1 of a top surface of the lower layer 213A is equal to or a larger than the width W2 of a bottom surface of the stacked structure of the lower magnetic pattern 213B', the tunnel barrier pattern 213C', the upper magnetic pattern 213D' and the upper pattern 213E'.

The lower layer 213A may include a metal which has a higher electron affinity than a component included in the lower magnetic layer 213B and the upper magnetic layer 213D. Such a metal with a high electron affinity may include a main component such as Fe, Ni and/or Co, and has an insulating property when the metal is oxidized. It is possible to form the insulating spacer 214' which has an insulating property and includes an oxide of a metal included in the lower layer 213A, over a sidewall of the stacked structure of the lower magnetic pattern 213B', the tunnel barrier pattern 13C', the upper magnetic pattern 213D' and the upper pattern 213E'.

The above implementations may be used to achieve one or more following advantages.

First, because the lower layer 213A as a part of the variable resistance element 2130 is filled in the contact hole H together with the lower contact 212, etching is not required to form the lower layer 213A. Therefore, an etching thickness may be reduced when patterning the other layers of variable resistance element 2130 above the lower layer 213A, thereby facilitating or simplifying an etching process.

Also, the width of the top surface of the lower layer 213A can be designed to be equal to or larger than the width of the bottom surface of the remaining part of the variable resistance element 2130. This configuration can advantageously increase an alignment margin between the lower layer 213A and the remaining part of the variable resistance element 2130 and to improve the level of the flatness of the tunnel barrier pattern 213C'.

Furthermore, by controlling the above widths, although the part of the lower layer 213A is exposed during the patterning of the variable resistance element 2130, and the conductive material included in the lower layer 213A is re-deposited over the sidewall of the remaining part of the variable resistance element 2130, the conductive material may be changed into the insulating spacer 214' using a simple oxidation process. Thus, the variable resistance element 2130 may be protected, and a defect may be prevented.

Figure 10A:
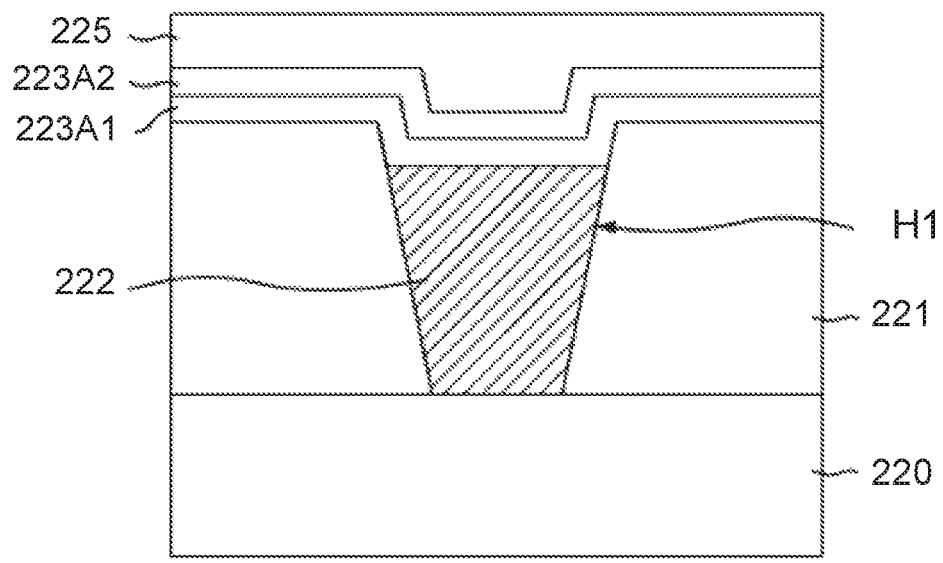
FIGS. 10A to 10E are cross-sectional views explaining a semiconductor device and an example of a method for fabricating the same in accordance with an implementation of the disclosed technology.
Figure 10B:
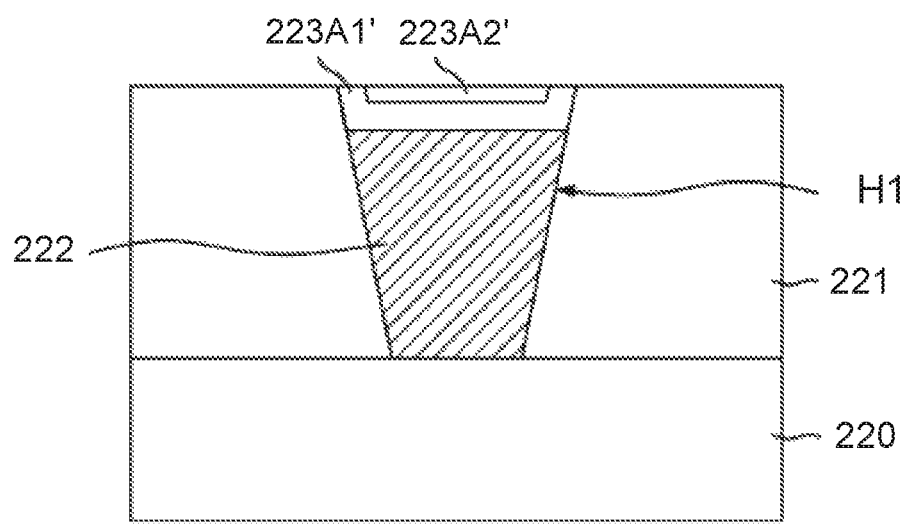
Figure 10C:
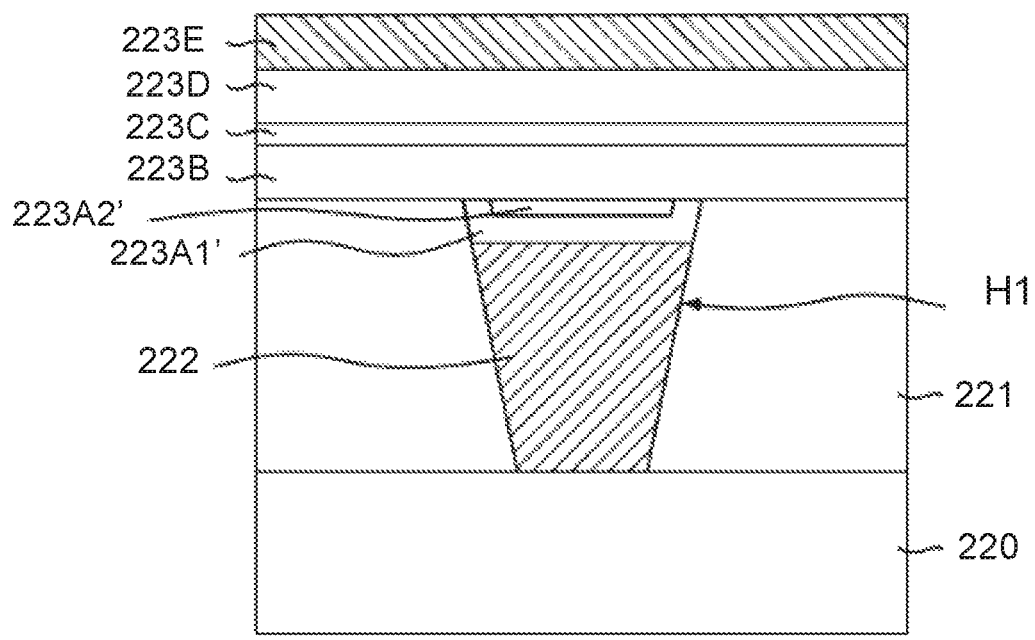
Figure 10D:
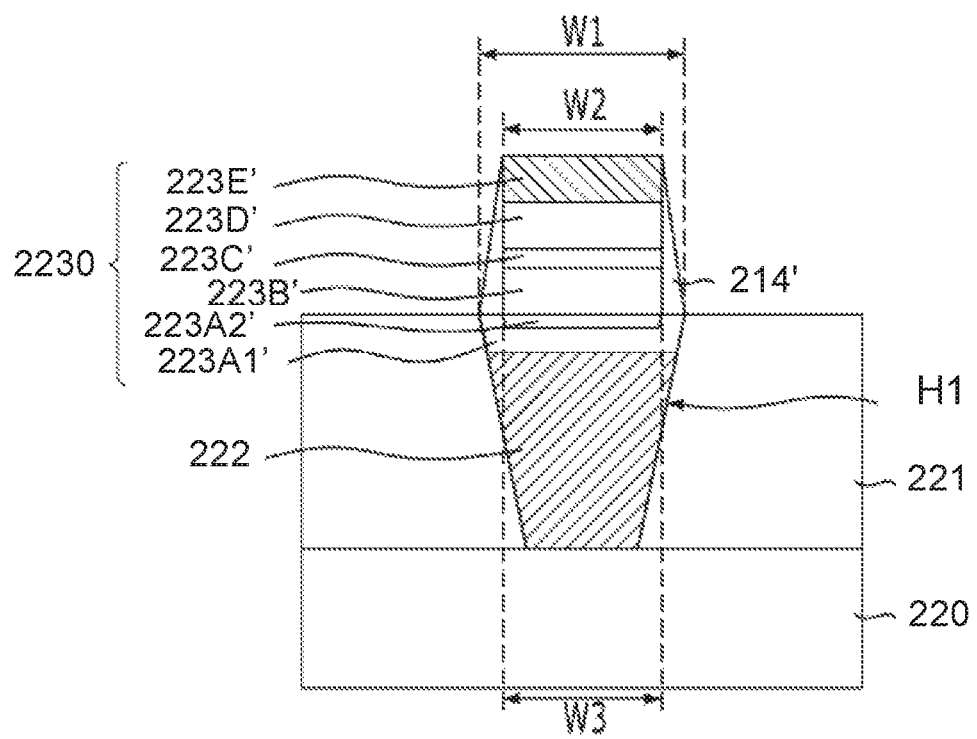
Figure 10E:
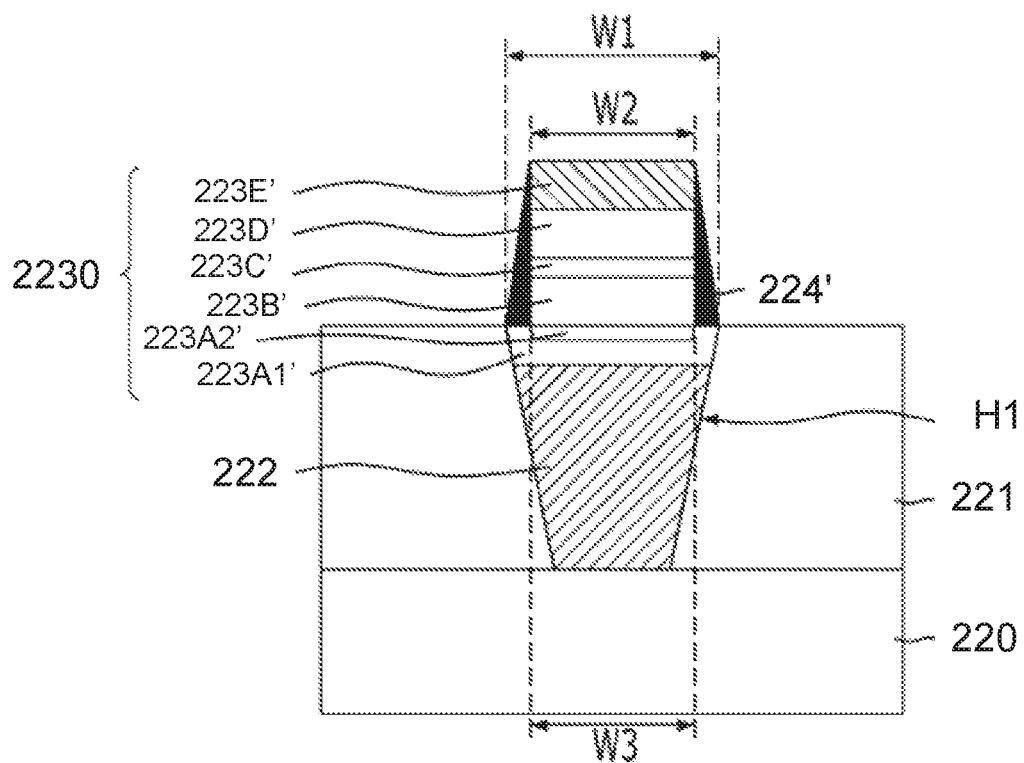

FIGS. 10A to 10E are cross-sectional views explaining a semiconductor device and an example of a method for fabricating the same in accordance with another implementation. FIG. 10E shows an example of the semiconductor device, and FIGS. 10A to 10D show intermediate processing steps for forming the semiconductor device of FIG. 10E. A difference from the aforementioned implementation will be mainly described below.

Referring to FIG. 10A, an interlayer dielectric layer 221 having a contact hole H1 may be formed over a substrate 220, and then, a lower contact 222 may be formed to fill a part of the contact hole H.

A first lower layer 223A1 and a second lower layer 223A2 may be formed over the resultant structure having the lower contact 222 and along a profile of the resultant structure. The first lower layer 223A1 may include a metal having a higher electron affinity than a component included in a magnetic layer which will be described layer. Further, the metal has an insulating property when it is oxidized. For example, the magnetic layer may include Fe, Ni and/or Co, and the metal may include one or more Al, Ti, Hf, Mg, etc. The second lower layer 223A2 may include a different material from the first lower layer 223A1 and function to improve a characteristic of a MTJ structure. Furthermore, the second lower layer 223A2 may be in direct contact with the MTJ structure as needed. For example, the second lower layer 223A2 may include a material which contacts with both ends of the MTJ structure and functions as an electrode including, such as Ta. When Ta is used for an electrode, it is possible to prevent an abnormal increase in a resistance of the MTJ structure, for example, an increase of a value of HRD (High resistance depth). Thus, it is advantageous to improve a characteristic of the MTJ structure. While it is explained in this implementation that the second lower layer 223A2 is used as an electrode including Ta, other implementations are also possible. For example, the second lower layer 223A2 may include other materials which are in direct contact with the MTJ structure to improve the characteristic of the MTJ structure.

A sacrificial layer 225 may be formed over the second lower layer 223A2. When the first lower layer 223A1 and the second lower layer 223A2 are polished in a subsequent process, since the first lower layer 223A1 and the second lower layer 223A2 include different materials from each other, they are likely to be dent or corroded due to a difference in polishing characteristics between different materials. The sacrificial layer 225 operates to prevent this damage from occurring. For example, the sacrificial layer 225 may include a silicon nitride.

Referring to FIG. 10B, a first lower pattern 223A1' and a second lower pattern 223A2' are formed to fill a remaining space of the contact hole H1. In one implementation, the lower contact 221 may be formed by polishing the first lower layer 223A1 and the second lower layer 223A2 until the interlayer dielectric layer 221 is exposed.

The first lower pattern 223A1' may be formed along a sidewall and a surface of the remaining space of the contact hole H1. The second lower pattern 223A2' may be disposed over the first lower pattern 223A1' and surrounded by the first lower pattern 223A1' except for a top surface of the second lower pattern 223A2'.

Referring to FIG. 10C, the lower magnetic layer 223B, the tunnel barrier layer 223C, the upper magnetic layer 223D and the upper layer 223E may be sequentially deposited over the first lower pattern 223A1', the second lower pattern 223A2' and the interlayer dielectric layer 221.

Referring to FIG. 10D, an upper pattern 223E', an upper magnetic pattern 223D', a tunnel barrier pattern 223C' and a lower magnetic pattern 223B' may be formed by etching the upper layer 223E, the upper magnetic layer 223D, the tunnel barrier layer 223C and the lower magnetic layer 223B using a mask (not shown) for patterning the variable resistance element. As a result, a variable resistance element 2230 is formed to include a part filled in the contact hole H1 and another part protruding from the interlayer dielectric layer 221. In FIG. 10D, the first and second lower patterns 223A1', 223A2' are filled in the contact hole H1, and a stacked structure including the lower magnetic pattern 223B', the tunnel barrier pattern 223C', the upper magnetic pattern 223D' and the upper pattern 223E' protrudes over the interlayer dielectric layer 221.

The stacked structure of the variable resistance element 2230 may overlap with the contact hole H1. The width W2 of the bottom surface of the stacked structure is equal to or smaller than the width W1 of the top surface of the contact hole H1. Furthermore, the width W2 of the bottom surface of the stacked structure is equal to or larger than the width W3 of the top surface of the second lower pattern 223A2'. That is, the stacked structure of the variable resistance element 2230 may cover the second lower pattern 223A2' and expose at least a part of the first lower pattern 223A1'. Thus, a conductive material included in the first lower pattern 223A1' may be re-deposited over a sidewall of the stacked structure of the variable resistance element 2230. The re-deposited conductive material is represented by a reference numeral 224. Since the second lower pattern 223A2' is not exposed, a conductive material included in the second lower pattern 223A2' may not be re-deposited.

Referring to FIG. 10E, the re-deposited conductive material 224 may be changed into an insulating spacer 224' by performing an oxidation process to the resultant structure of FIG. 10D.

By the aforementioned processes, the semiconductor device of FIG. 10E may be fabricated. In FIG. 10E, the MTJ structure includes lower layers including the first lower pattern 223A1' and the second lower pattern 223A2'. The second lower pattern 223A2' has a top surface contacting with the MTJ structure, and the first lower pattern 223A1' surrounds the surfaces of the second lower pattern 223A2' except for its top surface.

In the semiconductor device of FIG. 9D, since the lower layer 213A (or at least the uppermost layer of the lower layer 213A) includes a specific metal which has a high electron affinity and of which oxidation has an insulating property, a bottom end of the MTJ structure contacts with the layer containing the metal only and does not contact with other layers including various materials. Differently from the semiconductor device of FIG. 9D, in the semiconductor device of FIG. 10D the bottom end of the MTJ structure can contact with various layers to improve the characteristic of the MTJ structure. For example, a Ta layer which can be used as an electrode may contact with the bottom end of the MTJ structure. Further, the semiconductor device of FIG. 9D accomplishes all the advantages as provided from the semiconductor device of FIG. 9D.

Meanwhile, in the aforementioned implementations of FIGS. 9A to 10E, the whole part of the lower layer of the variable resistance element is filled in the contact hole. However, in another implementation, only a part of the lower layer of the variable resistance element may be filled in the contact hole and the remaining part of the lower layer of the variable resistance element may protrude over the interlayer dielectric layer. This implementation will be described exemplarily referring to FIGS. 11A and 11B.

Figure 11A:
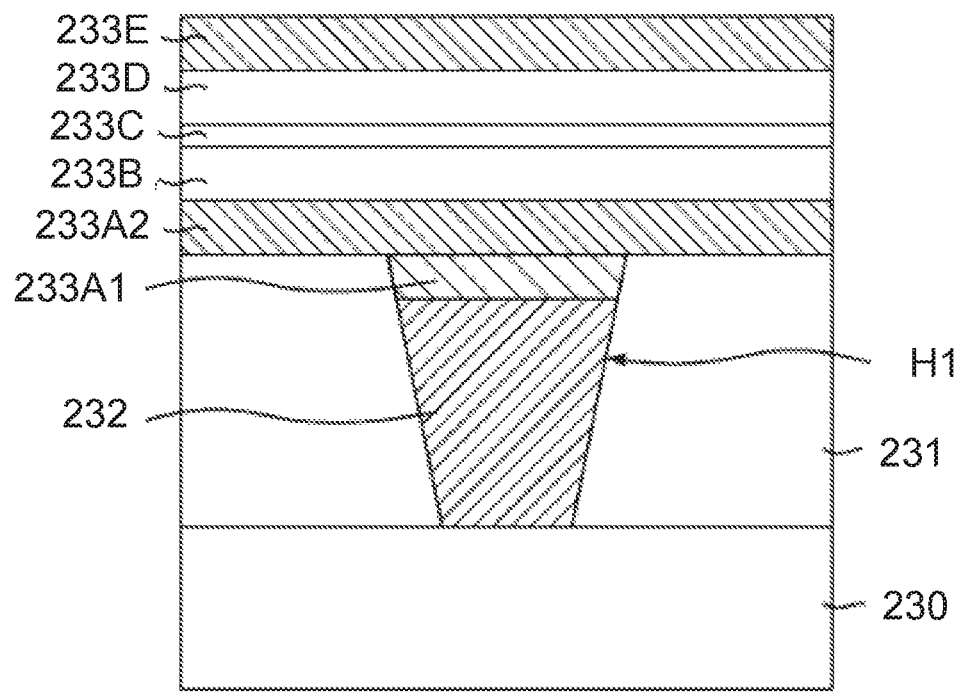
FIGS. 11A and 11B are cross-sectional views explaining a semiconductor device and an example of a method for fabricating the same in accordance with an implementation of the disclosed technology.
Figure 11B:
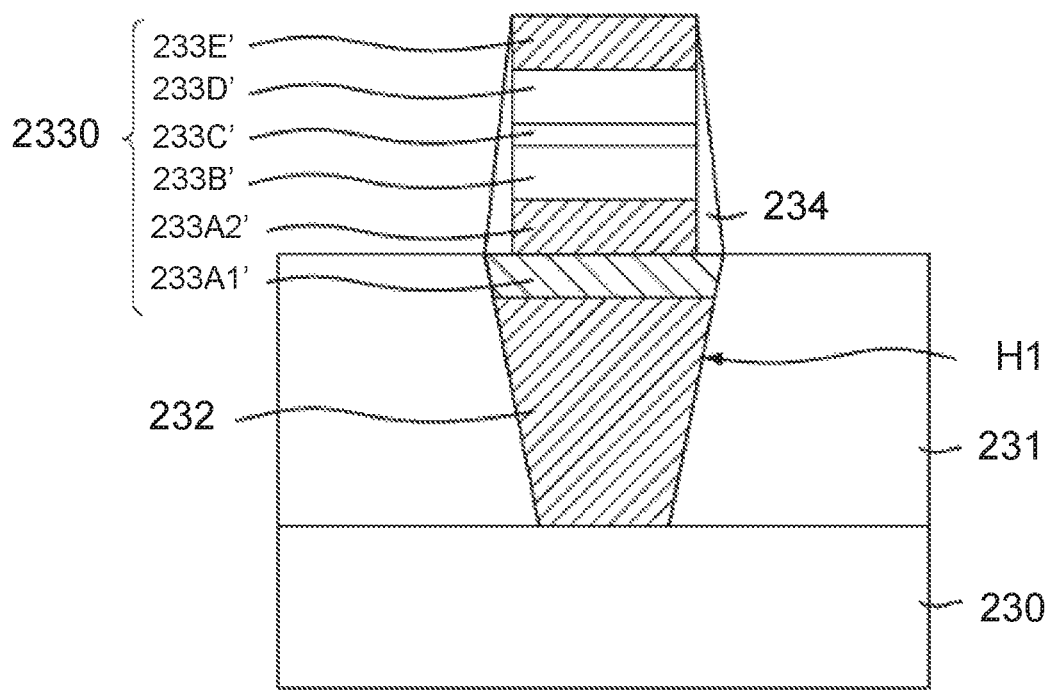

FIGS. 11A and 11B are cross-sectional views explaining a semiconductor device and an example of a method for fabricating the same in accordance with another implementation. A difference from the aforementioned implementations will be mainly described below.

Referring to FIG. 11A, an interlayer dielectric layer 231 having a contact hole H1 may be formed over a substrate 230. Then, a lower contact 232 may be formed to fill a part of the contact hole H1.

A first lower layer 233A1 may be formed to fill a remaining space of the contact hole H where the lower contact 232 is formed. The first lower layer 233A1 may be substantially same as the lower layer 213A of FIGS. 9A to 9D. Alternatively, the first lower layer 233A1 may be substantially same as the first and second lower patterns 223A1' and 223A2' of FIGS. 10A to 10E.

The second lower layer 233A2, the lower magnetic layer 233B, the tunnel barrier layer 233C, the upper magnetic layer 233D and the upper layer 233E may be sequentially deposited over the first lower layer 233A1 and the interlayer dielectric layer 231. The second lower layer 233A2 may include various materials to improve the characteristic of the MTJ structure, and be formed as a single layer or multiple layers.

Referring to FIG. 11B, a variable resistance element 2330 may be formed by etching the second lower layer 233A2, the lower magnetic layer 233B, the tunnel barrier layer 233C, the upper magnetic layer 233D and the upper layer 233E using a mask (now shown) for patterning the variable resistance element 2330. The variable resistance element may include a part filled in the contact hole H1 and another part protruding from the interlayer dielectric layer 231. The first lower layer 233A1 is filled in the contact hole H1, while a stacked structure including a second lower pattern 233A2', a lower magnetic pattern 233B', a tunnel barrier pattern 233C', an upper magnetic pattern 233D' and an upper pattern 233E' protrudes over the interlayer dielectric layer 231.

A conductive material included in the first lower layer 233A1 may be re-deposited over a sidewall of the stacked structure of the variable resistance element 2330. The re-deposited conductive material is represented by a reference numeral 234.

Then, although not shown, the re-deposited conductive material may be changed into an insulating spacer by an oxidation process.

By the aforementioned processes, the semiconductor device of FIG. 11B may be fabricated. The semiconductor device of FIG. 11B includes the lower layer disposed under the MTJ structure and including a part protruding over the interlayer dielectric layer 231. In this implementation, although an etching thickness during the patterning of the variable resistance element is slightly increased, all the advantages of the aforementioned implementations can be still accomplished.

Meanwhile, in FIGS. 9A to 11B, a part of the variable resistance element is filled in the contact hole. However, in another implementation, a whole variable resistance element may be disposed over an interlayer dielectric layer, while only a lower contact may be filled in the contact hole. In this case, if the width of the bottom surface of the variable resistance element is smaller than that of the top surface of the lower contact, it is required to control a material included in the lower contact. This implementation will be described exemplarily referring to FIGS. 12A and 12B.

Figure 12A:
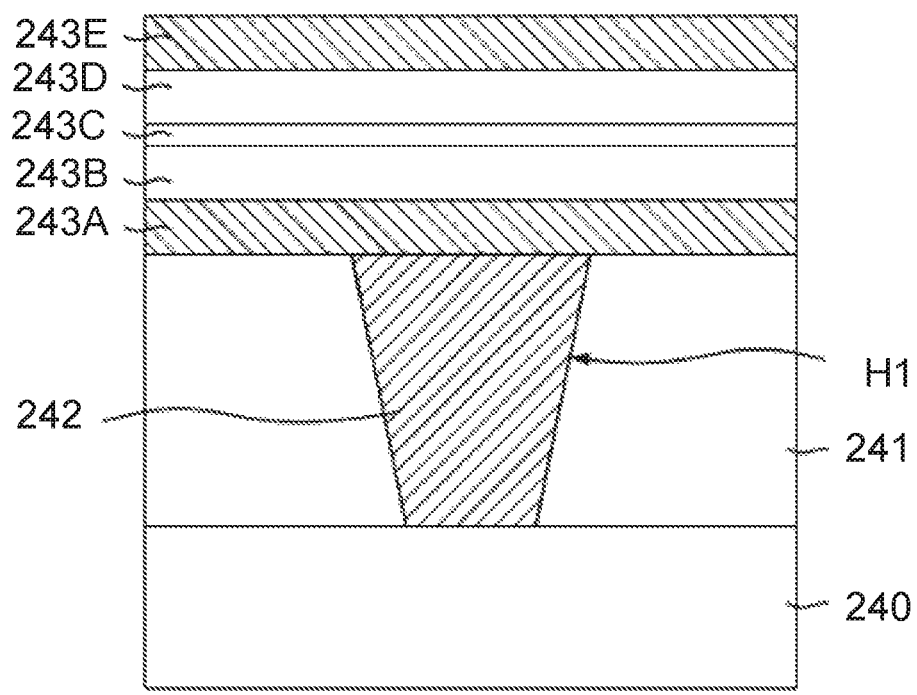
FIGS. 12A and 12B are cross-sectional views explaining a semiconductor device and an example of a method for fabricating the same in accordance with an implementation of the disclosed technology.
Figure 12B:
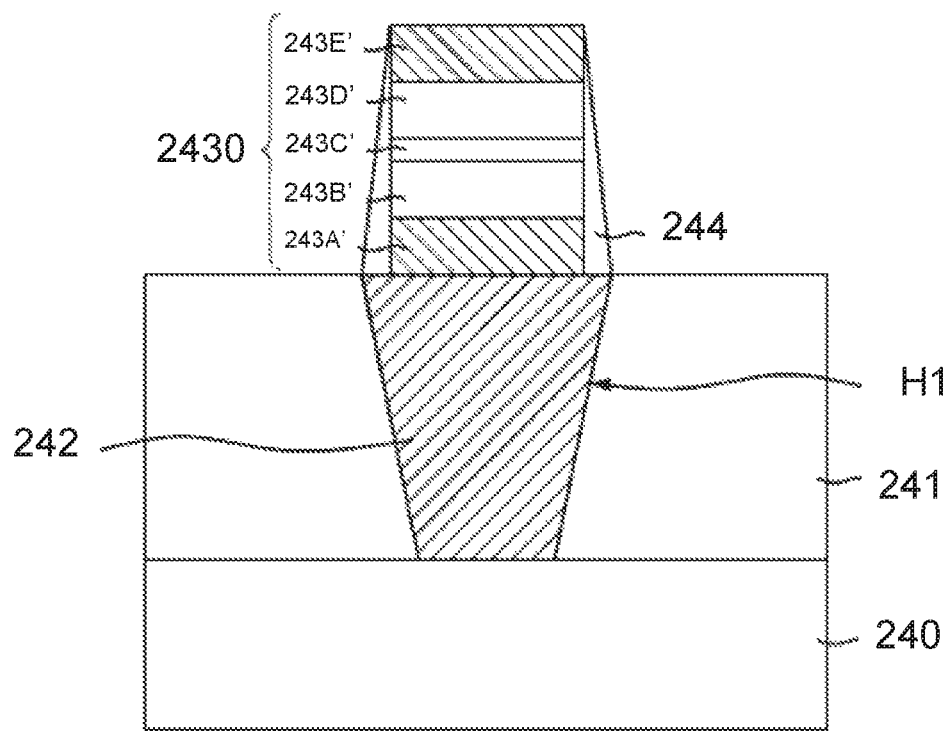

FIGS. 12A and 12B are cross-sectional views explaining a semiconductor device and an example of a method for fabricating the same in accordance with another implementation.

Referring to FIG. 12A, an interlayer dielectric layer 241 having a contact hole H may be formed over a substrate 240. Then, a lower contact 242 may be formed to fill a whole of the contact hole H1. The lower contact 242 may be formed by depositing a conductive material having a thickness to sufficiently fill the contact hole H1, and then performing a planarization process until the interlayer dielectric layer 241 is exposed.

The lower contact 242 may include a conductive material for electrically connecting a variable resistance element with another element. The conductive material may include a metal which has a higher electron affinity than a component included in a magnetic layer of the variable resistance element and of which oxidization has an insulating property. For example, The magnetic layer may include Fe, Ni and/or Co, and the metal may include one or more Al, Ti, Hf, Mg, etc.

A lower layer 243A, a lower magnetic layer 243B, a tunnel barrier layer 243C, an upper magnetic layer 243D and an upper layer 243E may be sequentially deposited over the lower contact 242 and the interlayer dielectric layer 241. The lower layer 243A may include various materials to improve the characteristic of the MTJ structure, and may be formed as a single layer or multiple layers.

Referring to FIG. 12B, a variable resistance element 2430 may be formed by etching the lower layer 243A, the lower magnetic layer 243B, the tunnel barrier layer 243C, the upper magnetic layer 243D and the upper layer 243E using a mask (now shown) for patterning the variable resistance element 2430. The variable resistance element 2430 may be formed to include a stacked structure including a lower pattern 243A', a lower magnetic pattern 243B', a tunnel barrier pattern 243C', an upper magnetic pattern 243D' and an upper pattern 243E'. The stacked structure protrudes over the interlayer dielectric layer 241

A conductive material included in the lower contact 242 may be re-deposited over a sidewall of the stacked structure of the variable resistance element 2430. The re-deposited conductive material is represented by a reference numeral 244.

Then, although not shown, the re-deposited conductive material 244 may be changed into an insulating spacer by an oxidation process.

By the aforementioned processes, the semiconductor device of FIG. 12B may be fabricated. In FIG. 12B, a whole of the variable resistance element 2430 protrudes over the interlayer dielectric layer 241. In this implementation, although an etching thickness during the patterning of the variable resistance element is slightly increased , all the advantages of the aforementioned implementations can be still accomplished.

Figure 13A:
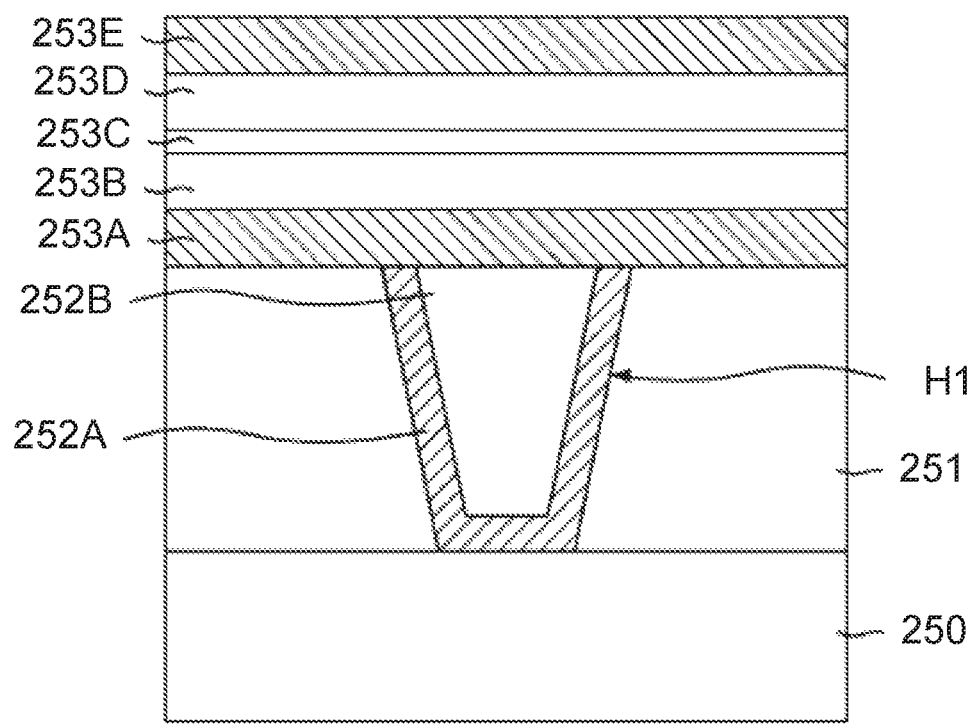
FIGS. 13A and 13B are cross-sectional views explaining a semiconductor device and an example of a method for fabricating the same in accordance with an implementation of the disclosed technology
Figure 13B:
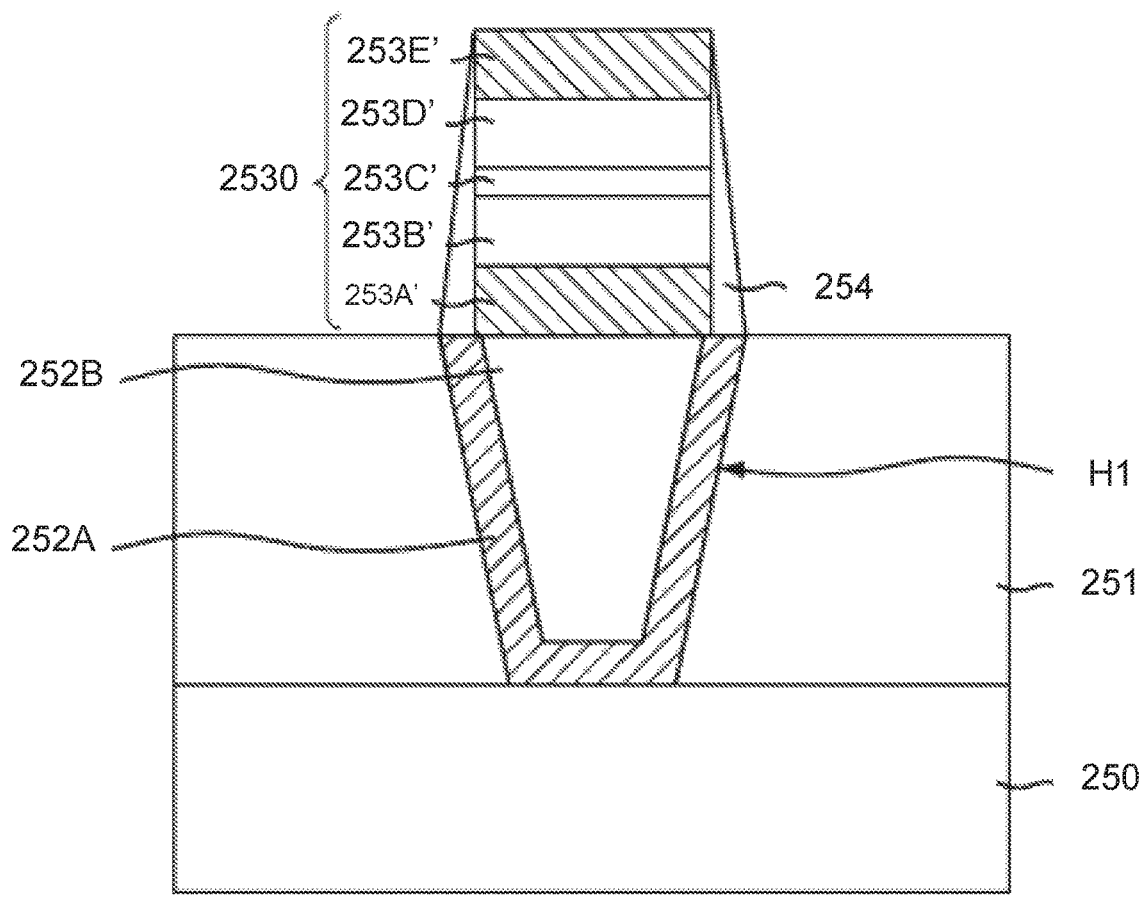

FIGS. 13A and 13B are cross-sectional views explaining a semiconductor device and an example of a method for fabricating the same in accordance with another implementation.

Referring to FIG. 13A, an interlayer dielectric layer 251 having a contact hole H1 may be formed over a substrate 250. Then, a first lower contact 252A may be formed along a sidewall and a bottom surface of the contact hole H1 and a second lower contact 252B may be formed to fill a remaining space of the contact hole H1 where the first lower contact 252A is formed. Surfaces of the second lower contact 252B except for the top surface may be surrounded by the first lower contact 252A.

The first lower contact 252A may include a metal which has a higher electron affinity than a component included in a magnetic layer of a variable resistance element. Further, the metal has an insulating property when it is oxidized. For example, the magnetic layer may include Fe, Ni and/or Co, and the metal may include one or more Al, Ti, Hf, Mg, etc. The second lower contact 252B may include a conductive material different from the material of the first lower contact 252A. The conductive material included in the second lower contact 252B may satisfy a characteristic necessary for a contact. For example, the conductive material may have an excellent gap filling property and/or a high electrical conductivity. The second lower contact 252B may include such as W, Ta, TiN, etc.

A lower layer 253A, a lower magnetic layer 253B, a tunnel barrier layer 253C, an upper magnetic layer 253D and an upper layer 253E may be sequentially deposited over the first lower contact 252A, the second lower contact 252B and the interlayer dielectric layer 251. The lower layer 253A may include various materials to improve the characteristic of the MTJ structure, and may be formed as a single layer or multiple layers.

Referring to FIG. 13B, a variable resistance element 2530 may be formed by etching the lower layer 253A, the lower magnetic layer 253B, the tunnel barrier layer 253C, the upper magnetic layer 253D and the upper layer 253E using a mask (now shown) for patterning the variable resistance element 2530. The variable resistance element 2530 may include a stacked structure which includes a lower pattern 253A', a lower magnetic pattern 253B', a tunnel barrier pattern 253C', an upper magnetic pattern 253D' and an upper pattern 253E'. The stacked structure protrudes over the interlayer dielectric layer 251. The variable resistance element 2530 may overlap with the contact hole H1. The width of the bottom surface of the variable resistance element 2530 is equal to or smaller than the width of the top surface of the contact hole H1. Furthermore, the width of the bottom surface of the variable resistance element 2530 is equal to or larger than the width of the top surface of the second lower contact 252B.

A conductive material included in the first lower contact 252A may be re-deposited over the sidewall of the variable resistance element 2530. The re-deposited conductive material is represented by a reference numeral 254.

Then, although not shown, the re-deposited conductive material 254 may be changed into an insulating spacer by an oxidation process.

By the aforementioned processes, the semiconductor device of FIG. 13B may be fabricated. In FIG. 13B, a whole of the variable resistance element 2530 protrudes over the interlayer dielectric layer 251. In this implementation, although an etching thickness during the patterning of the variable resistance element is slightly increased, all the advantages of the aforementioned implementations of FIGS.

9A to 11B can be still achieved. Furthermore, an additional material may be used to provide a desired characteristic of a lower contact.

While it is explained in the aforementioned implementations that the variable resistance element includes a MTJ structure, other limitations are also possible.

Various implementations of the present disclosure may be applied to the variable resistance element having a part filled in the interlayer dielectric layer and a remaining part protruding over the interlayer dielectric layer. In this case, the width of the protruding part is smaller than the width of the filled-in part so that a material included in the filled-in part is re-deposited over a sidewall of the protruding part. The filled-in part may include a metal which has a higher electron affinity than a component, for example, a main component, included in the protruding part. Further, the metal has an insulating property when it is oxidized, thereby preventing a defect due to a re-deposited material.

Alternately, various implementations of the present disclosure may be applied to the variable resistance element which is coupled to a lower contact filled in an interlayer dielectric layer and protrudes over the interlayer dielectric layer. In this case, the width of the variable resistance element is smaller than the width of the lower contact so that a material included in the lower contact is re-deposited over a sidewall of the variable resistance element. The lower contact may include a metal which has a higher electron affinity than a component, for example, a main component, included in the variable resistance element. Further, the metal has an insulating property when it is oxidized, thereby preventing a defect due to a re-deposited material.

Section 4: Under Layer Including Barrier Layer with Dual Phase Structure

Figure 14:
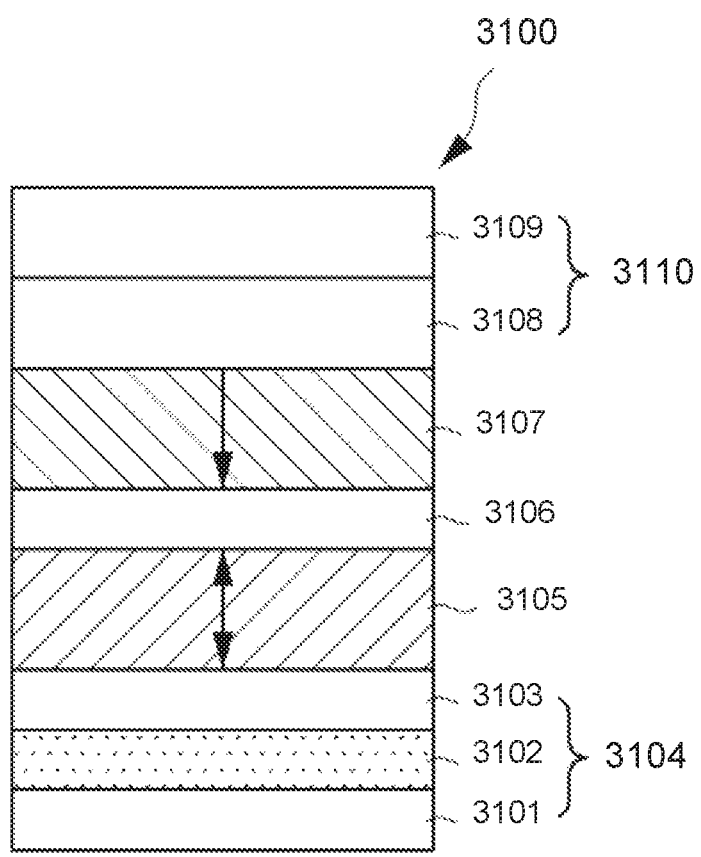
FIG. 14 is a cross-sectional view of an exemplary variable resistance element in accordance with an implementation of the disclosed technology.

Some implementations of the disclosed technology provide a variable resistance element including an under layer including a barrier layer with a dual phase structure. FIG. 14 is a cross-sectional view of a variable resistance element in accordance with an implementation.

As illustrated in FIG. 14, the variable resistance element 3100 may include an MTJ (Magnetic Tunnel Junction) structure which includes a first magnetic layer 3105 having a variable magnetization direction which can change its magnetization direction in response to a bias such as an applied voltage or current, a second magnetic layer 3107 having a pinned magnetization direction that is fixed in its direction, and a tunnel barrier layer 3106 interposed between the first and second magnetic layers 3105 and 3107. Therefore, the variable resistance element 3100 exhibits different resistance states showing different resistance values across the MTJ depending on the relative direction between the magnetization direction of the first magnetic layer 3105 and the pinned magnetization direction of the second magnetic layer 3107. The different resistance states are used for storing data.

The first and second magnetic layers 3105 and 3107 may include a ferromagnetic material. The ferromagnetic material may include an alloy based on Fe, Ni, or Co, for example, Fe—Pt alloy, Fe—Pd alloy, Co—Pd alloy, Co—Pt alloy, Fe—Ni—Pt alloy, or Co—Fe—Pt alloy.

The first and second magnetic layers 3105 and 3107 may have a magnetization direction perpendicular to the surfaces of the first and second magnetic layers 3105 and 3107. For example, as indicated by arrows of FIG. 14, the magnetization direction of the first magnetic layer 3105 may be changed between the direction from top to bottom and the direction from bottom to top, and the magnetization direction of the second magnetic layer 3107 may be pinned to the direction from top to bottom. Other implementations are also possible regarding the magnetization directions of the first and second magnetic layers 3105 and 3107.

The tunnel barrier layer 3106 may include any insulating oxides, for example, MgO, CaO, SrO, TiO, VO, or NbO. The tunnel barrier layer 3106 may change the magnetization direction of the first magnetic layer 3105 through electron tunneling.

The variable resistance element 3100 may further include layers 3104 and 3110 for improving the characteristic of the MTJ structure or facilitating a fabrication process. For example, the variable resistance element 3100 may further include an under layer 3104 arranged under the MTJ structure and an upper layer 3110 arranged over the MTJ structure. The upper layer 3110 may include a magnetism correction layer 108 and/or a capping layer 3109 positioned at the uppermost part of the variable resistance element 3100.

In the present implementation, the under layer 3104 may include a first metal layer 3101, a second metal layer 3103, and a barrier layer 3102 interposed between the first and second metal layers 3101 and 3103 and having a dual phase structure.

The first metal layer 3101 may have an HCP (Hexagonal Closed Packed) structure or a crystal structure of sodium chloride (NaCl), thus improving the crystal orientations of the barrier layer 3102 and the second metal layer 3103 which are positioned over the first metal layer 3101. The first metal layer 3101 may include any metal layer having an HCP structure, for example, Hf, Zr, Mg, Ru, or Os. Alternatively, the first metal layer 3101 may include any nitride having a crystal structure of NaCl, for example, zirconium nitride (ZrN), hafnium nitride (HfN), or titanium nitride (TiN).

The second metal layer 3103 may include a light metal, and serve to reduce an attenuation constant of the first magnetic layer 3105 positioned over the second metal layer 3103. The light metal in the metal layer 3103 may include Ti and/or a metal having a smaller specific gravity than Ti, for example, Al.

In the present implementation, the under layer 3104 of the variable resistance element may include the barrier layer 3102 having a dual phase structure which includes two different crystal phases or crystal structures. This dual phase structure further stabilizes the crystal orientation of the second metal layer 3103 positioned over the barrier layer 3102, within the under layer 3104. As a result, the barrier layer 3102 having such a dual phase structure may improve the thermal stability of the first magnetic layer 3105 which interfaces with the under layer 3104 and is on top of the under layer 3104. This improved thermal stability of the first magnetic layer can stabilize the magnetic characteristic of the first magnetic layer 3105.

As a specific example for the dual phase structure, the barrier layer 3102 may include a material layer in which a first material having a first phase as an FCC (Face Centered Cubic) structure and a second material having a second phase as a wurtzite structure are mixed. As the barrier layer 3102 is formed of or includes an alloy of the first and second materials or formed through co-sputtering, the barrier layer 3102 may have a dual phase structure in which an FCC structure and a wurtzite structure are mixed. The first material may include any material including HfN, TiN, MoN, ZrN, or MgO, for example. The second material may include any material including AlN, AgI, ZnO, CdS, CdSe, a-SiC, GaN, or BN, for example.

The magnetism correction layer 3108 in FIG. 14 is located above the pinned magnetic layer 3107 of the variable resistance element and may serve to offset the influence of a stray field generated by the second magnetic layer 3107 at the magnetic layer 3105 having a variable magnetization direction. In implementations, the magnetism correction layer 3108 may include an anti-ferromagnetic material or a ferromagnetic material having a magnetization direction anti-parallel to the magnetization direction of the second magnetic layer 3107. In this case, the influence of the stray field of the second magnetic layer 3107 having a pinned magnetization on the first magnetic layer 3105 having a variable magnetization may be offset to reduce a bias magnetic field in the first magnetic layer 3105. In the present implementation, the magnetism correction layer 3108 may be positioned over the MTJ structure. However, other implementations are also possible such that the position of the magnetism correction layer 108 may be modified in various manners.

The capping layer 3109 may serve as a hard mask when the variable resistance element 3100 is patterned, and include various conductive materials such as metal. In particular, the capping layer 3109 may be formed of or include a metal-based material which includes a small number of pin holes and has great resistance to wet and/or dry etching.

Therefore, in the above structure in FIG. 14, the under layer 3104 is designed to include the dual-phase barrier layer 3102 to stabilize the crystal structure of the metal layer 3103 on the top part of the under layer 3104. This stabilized metal layer 3103 interfaces with the variable magnetic layer 3105 of the variable resistance element, thus providing a stabilization mechanism for the variable resistance element. In addition, in some implementations, FIG. 14 further illustrates a combination of two stabilization mechanisms to stabilize magnetic properties of the variable resistance element formed by the layers 3107, 3106 and 3105. The second stabilization mechanism is the magnetism correction layer 3108 located above the pinned magnetic layer 3107 of the variable resistance element to reduce any undesired magnetic influence of the pinned magnetic layer 3107 to the variable magnetic layer 3105. This combination of the two stabilization mechanisms is integrated in the design in FIG. 14 so that the two mechanisms are used to collectively improve the performance of the variable resistance element in FIG. 14.

Figure 15:
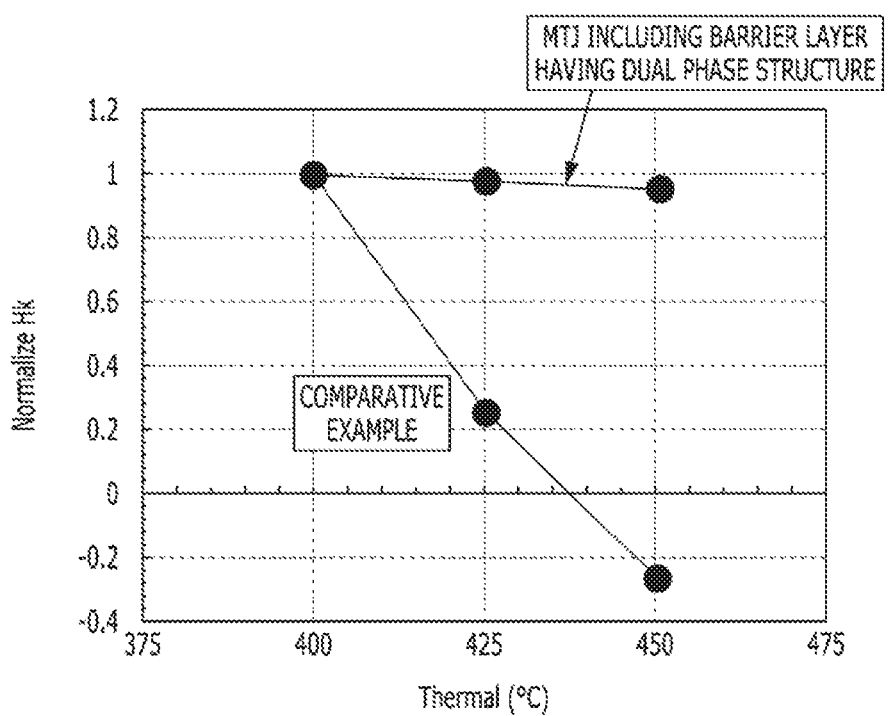
FIG. 15 is a graph illustrating the characteristics of a variable resistance element in accordance with a comparative example and the variable resistance element in accordance with one implementation of the disclosed technology.

FIG. 15 is a graph illustrating the characteristics of a variable resistance element in accordance with a comparative example and the variable resistance element in accordance with one implementation of the disclosed technology.

Referring to FIG. 15, the characteristics of the variable resistance elements of the comparative example and the present implementation may be compared to each other in accordance with a change of temperature. In FIG. 15, the horizontal axis may indicate the temperature, and the vertical axis may indicate a normalized Hk (perpendicular anisotropy field) value. The variable resistance element in accordance with the comparative example may indicate a general variable resistance element which does not include a barrier layer having a dual phase structure. The variable resistance element in accordance with the present implementation may include the barrier layer having a dual phase structure including, for example, a Hf—Al—N layer which is an alloy of HfN and AlN.

Referring to the graph in FIG. 15, the Hk value of the variable resistance element in accordance with the comparative example rapidly decreases as the temperature increases. In the variable resistance element in accordance with the present implementation, however, the Hk value does not change much and remains as almost constant. Base on FIG. 15, the thermal stability of the variable resistance element of the present implementation, which includes the barrier layer having a dual phase structure, has been improved as compared to the variable resistance element of the comparative example. Thus, the barrier layer having a dual phase structure may stabilize the magnetic characteristic of the variable resistance element.

Figure 16:
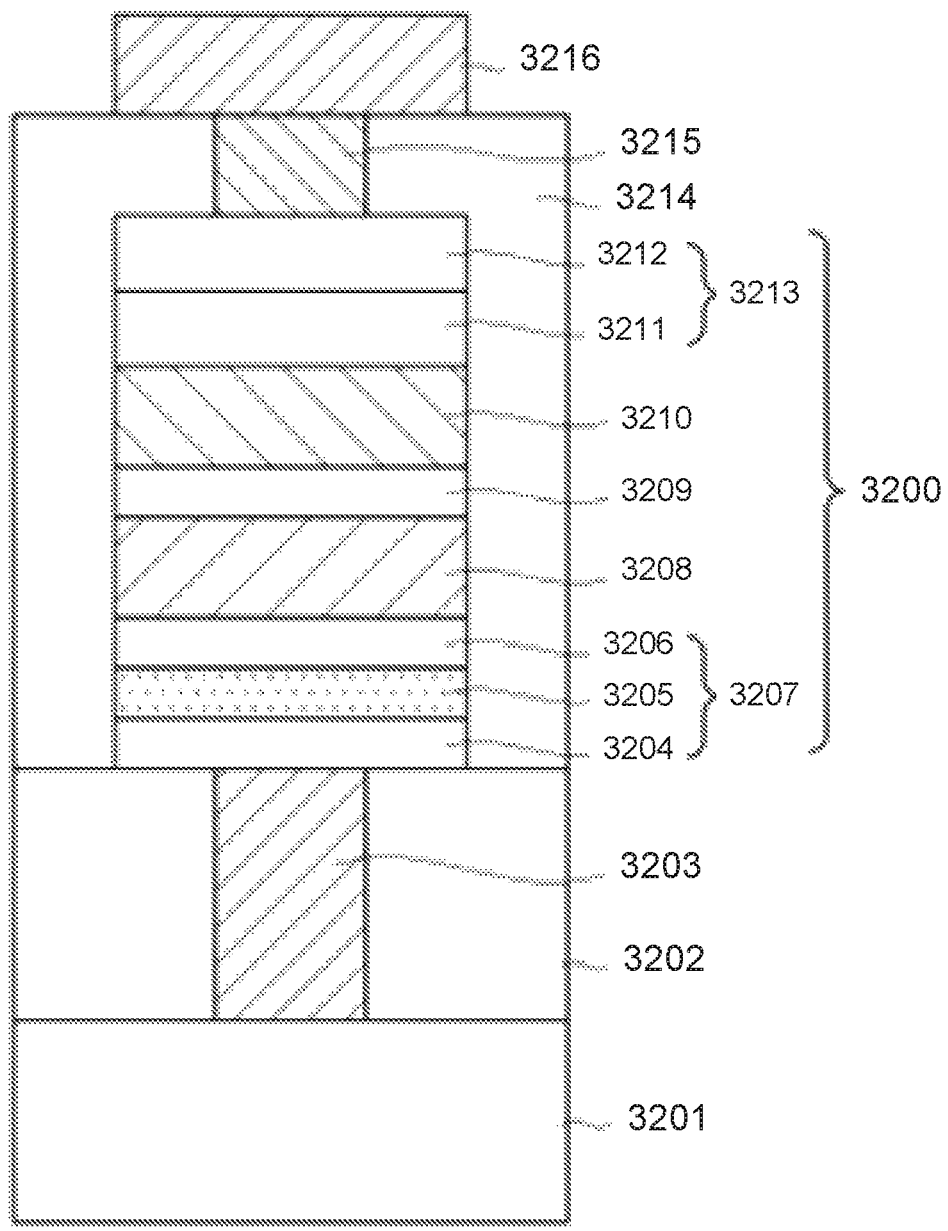
FIG. 16 is a cross-sectional view of an exemplary electronic device in accordance with an implementation.

FIG. 16 is a cross-sectional view of an exemplary electronic device in accordance with an implementation.

As illustrated in FIG. 16, the electronic device may include a substrate 3201, a first interlayer dielectric layer 3202, a bottom electrode contact 3203, a variable resistance element 3200, a second interlayer dielectric layer 3214, a top electrode contact 3215, and a conductive line 3216. The substrate 3201 may include a predetermined structure (not illustrated). The first interlayer dielectric layer 3202 may be formed over the substrate 3201. The bottom electrode contact 3203 may be coupled to the substrate 3201 through the first interlayer dielectric layer 3202. The variable resistance element 3200 may be formed over the bottom electrode contact 3203. The second interlayer dielectric layer 3214 may be buried between the variable resistance elements 3200 or surround at least a portion of the variable resistance element 3200. The top electrode contact 3215 may be formed in contact with the top of the variable resistance element 3200. The conductive line 3216 may be formed over the second interlayer dielectric layer 3214 so as to be in contact with the top electrode contact 3215.

The predetermined structure included in the substrate 3201 may include a switching element for selecting a specific unit cell from a plurality of unit cells included in a semiconductor device. The switching element may include a transistor, or a diode and the like. One terminal of the switching element may be electrically coupled to the bottom electrode contact 3203, and the other terminal of the switching element may be electrically coupled to a source line (not illustrated) through a source line contact (not illustrated).

The first and second interlayer dielectric layers 3202 and 3214 may include an insulating material. The first and second interlayer dielectric layers 3202 and 3214 may include a single layer including oxide, nitride, or oxynitride or a stacked structure thereof.

The bottom electrode contact 3203 may be positioned under the variable resistance element 3200 and serve as a path for supplying a voltage or current to the variable resistance element 3200. The bottom electrode contact 3203 may include various conductive materials such as metal or metal nitride.

The variable resistance element 3200 may include the same structure as the variable resistance element 3100 illustrated in FIG. 14. For example, the variable resistance element 3200 may include an MTJ structure including a first magnetic layer 3208 having a variable magnetization direction, a second magnetic layer 3210 having a pinned magnetization direction, and a tunnel barrier layer 3209 interposed between the first and second magnetic layers 3208 and 3210. Furthermore, the variable resistance element 3200 may further include layers 3207 and 3213 for improving the characteristic of the MTJ structure or facilitating the fabrication process.

The variable resistance element 3200 may further include an under layer 3207 arranged under the MTJ structure and an upper layer 3213 arranged over the MTJ structure. The under layer 3207 may include a first metal layer 3204, a second metal layer 3206, and a barrier layer 3205 interposed between the first and second metal layers 3204 and 3206 and having a dual phase structure. The upper layer 3213 may include a magnetism correction layer 3211 and/or a capping layer 3212 positioned at the uppermost part of the variable resistance element 200.

In the present implementation, the under layer 3207 may be positioned over the first interlayer dielectric layer 3202. However, other implementations are also possible. In another implementation, the under layer 3207 and the bottom electrode contact 3203 may be buried or formed together in the first interlayer dielectric layer 3202.

The top electrode contact 3215 may serve to electrically couple the conductive line 3216 and the variable resistance element 3200, and simultaneously serve as an electrode for the variable resistance element 3200. The top electrode contact 3215 may be formed of or include the same material as the bottom electrode contact 3203.

The conductive line 3216 may include a metal layer. The metal layer may indicate a conductive layer including a metal element, and include a metal, a metal oxide, a metal oxynitride, a metal silicide or the like.

FIGS. 17A to 17E are cross-sectional views illustrating an example of a method for fabricating an electronic device in accordance with an implementation.

Figure 17A:
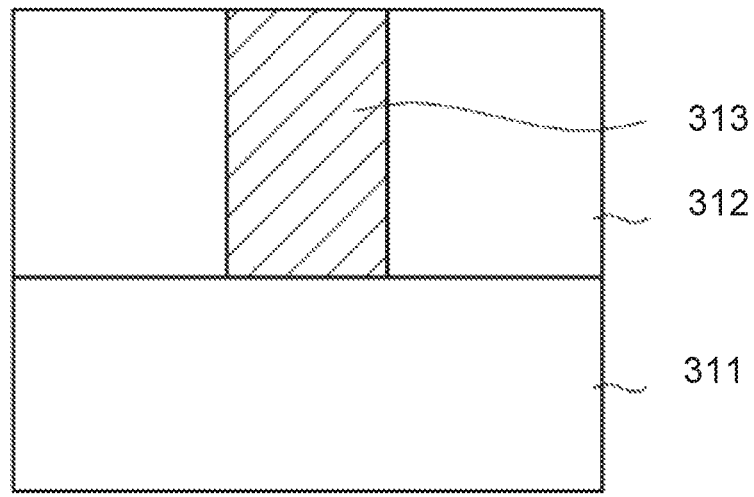
FIGS. 17A through 17E are cross-sectional views illustrating an example of a method for fabricating an electronic device in accordance with an implementation.

As illustrated in FIG. 17A, a first interlayer dielectric layer 312 may be formed over a substrate 311 including a predetermined structure. The predetermined structure may include a switching element and the like. The substrate 311 may include a semiconductor substrate or silicon substrate. The first interlayer dielectric layer 312 may include any single layer including oxide, nitride, or oxynitride or a stacked structure thereof.

Then, a bottom electrode contact 313 may be formed in contact with the substrate 311 through the first interlayer dielectric layer 312. The bottom electrode contact 13 may be formed through the following series of processes: a contact hole is formed to expose the substrate 311 through the first interlayer dielectric layer 312, a conductive material is formed on the surface (e.g., the entire surface of the resultant structure so as to fill the contact hole, and the adjacent bottom electrode contacts 313 are electrically isolated from one another. The isolation process may be performed by etching or polishing the conductive material formed on the surface (e.g., the entire surface using a blanket etch process (for example, etch-back process) or a chemical-mechanical polishing process, until the first interlayer dielectric layer 312 is exposed.

Figure 17B:
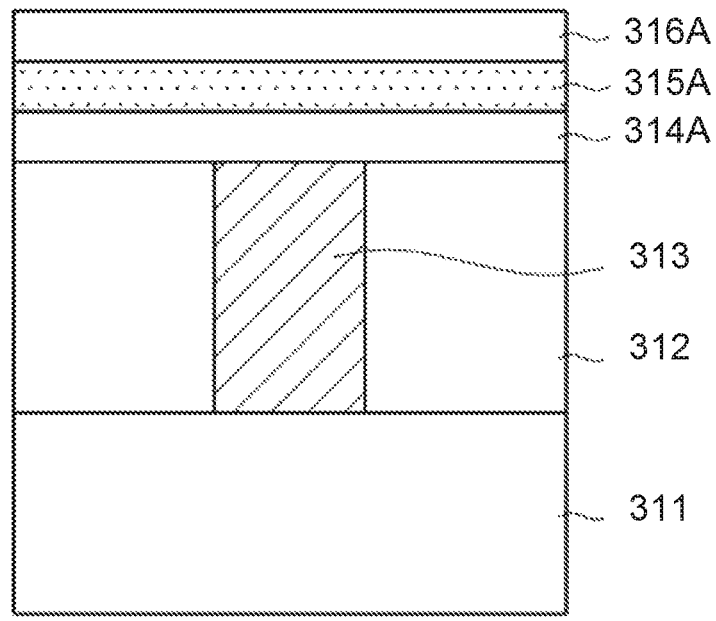

As illustrated in FIG. 17B, a first metal layer 314A, a barrier layer 315A having a dual phase structure, and a second metal layer 316A may be sequentially formed over the first interlayer dielectric layer 312 including the bottom electrode contact 313.

The first metal layer 314A may have an HCP structure or a crystal structure of NaCl, and thus improve the crystal orientations of the barrier layer 315A and the second metal layer 16A which are positioned over the first metal layer 314A. The first metal layer 314A may include any metal layer having an HCP structure, for example, Hf, Zr, Mg, Ru, or Os. Alternatively, the first metal layer 14A may include any nitride having a crystal structure of NaCl, for example, ZrN, HfN, or TiN.

The second metal layer 316A may include a light metal, and serve to reduce an attenuation constant of a first magnetic layer to be formed through a subsequent process. The light metal may include Ti and/or a metal having a smaller specific gravity than Ti, for example, Al.

The barrier layer 315A having a dual phase structure may include a material layer in which a first material having an FCC structure and a second material having a wurtzite structure are mixed, and further stabilize the crystal orientation of the second metal layer 316A positioned over the barrier layer 315A. As a result, the barrier layer 315A may increase the thermal stability of the first magnetic layer to be formed through a subsequent process, and stabilize the magnetic characteristic of the first magnetic layer.

In some implementations, the barrier layer 315A may be formed of or include an alloy of the first and second materials or formed through co-sputtering, and have a dual phase structure in which the FCC structure and the wurtzite structure are mixed. The first material may include any one material including HfN, TiN, MoN, ZrN, or MgO. The second material may include any material including AlN, AgI, ZnO, CdS, CdSe, a-SiC, GaN, or BN.

Figure 17C:
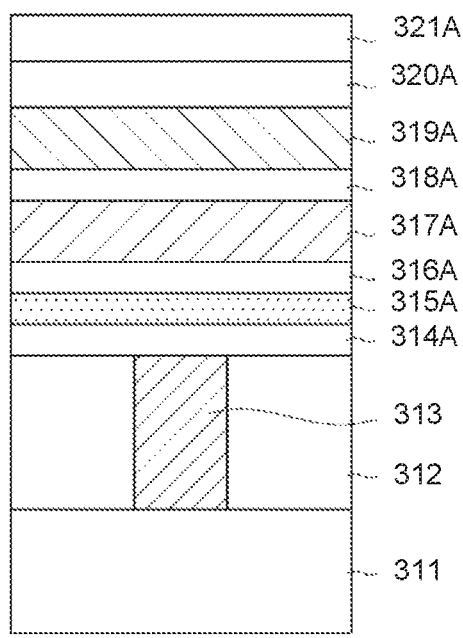

As illustrated in FIG. 17C, a first magnetic layer 317A, a tunnel barrier layer 318A, a second magnetic layer 319A, a magnetism correction layer 320A, and a capping layer 321A may be sequentially formed over the second metal layer 316A.

The first and second magnetic layers 317A and 319A may include a ferromagnetic material. The ferromagnetic material may include an alloy including Fe, Ni, or Co, for example, Fe—Pt alloy, Fe—Pd alloy, Co—Pd alloy, Co—Pt alloy, Fe—Ni—Pt alloy, Co—Fe—Pt alloy, or Co—Ni—Pt alloy. The first and second magnetic layers 317A and 319A may have a magnetization direction perpendicular to the surface of the first and second magnetic layers 317A and 319A.

The tunnel barrier layer 318A may include any insulating oxides, for example, MgO, CaO, SrO, TiO, VO, or NbO. The tunnel barrier layer 318A may change the magnetization direction of the first magnetic layer 317A through electron tunneling.

The magnetism correction layer 320A may serve to offset the influence of a stray field generated by the second magnetic layer 319A, and include an anti-ferromagnetic material or a ferromagnetic material having a magnetization direction anti-parallel to the magnetization direction of the second magnetic layer 319A. In this case, the influence of the stray field of the second magnetic layer 319A on the first magnetic layer 317A may be offset to reduce a bias magnetic field in the first magnetic layer 317A. In the present implementation, the magnetism correction layer 320A may be positioned over the MTJ structure. However, other implementations are also possible, and the position of the magnetism correction layer 320A may be modified in various manners.

The capping layer 321A may serve as a hard mask when the variable resistance element 3200 is patterned, and include various conductive materials such as a metal. In particular, the capping layer 321A may be formed of or include a metal-based material which includes a small number of pin holes and has great resistance to wet and/or dry etching.

Figure 17D:
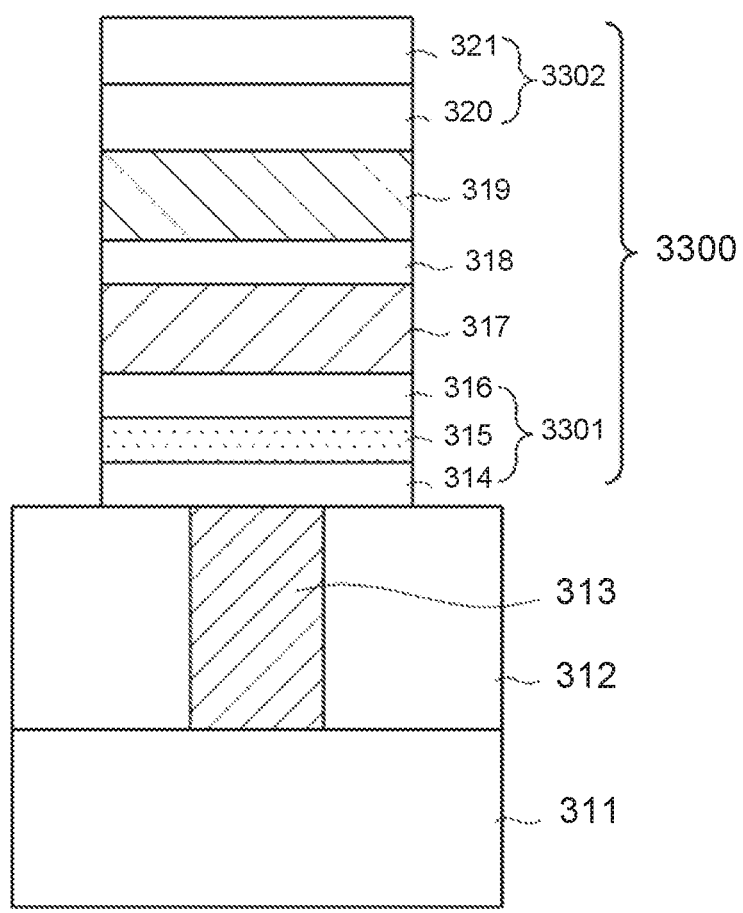

As illustrated in FIG. 17D, the sequentially deposited layers may be patterned to form a variable resistance element 3300. The following series of processes may be performed to provide a desired structure: a mask pattern is formed over the capping layer 321A (refer to FIG. 17C), the capping layer 321A is etched, and the under layers are sequentially etched using the capping layer as an etching barrier.

The variable resistance element 3300 formed through the patterning process may have the same structure as the variable resistance element 3100 or 3200 illustrated in FIG. 14 or 15.

Figure 17E:
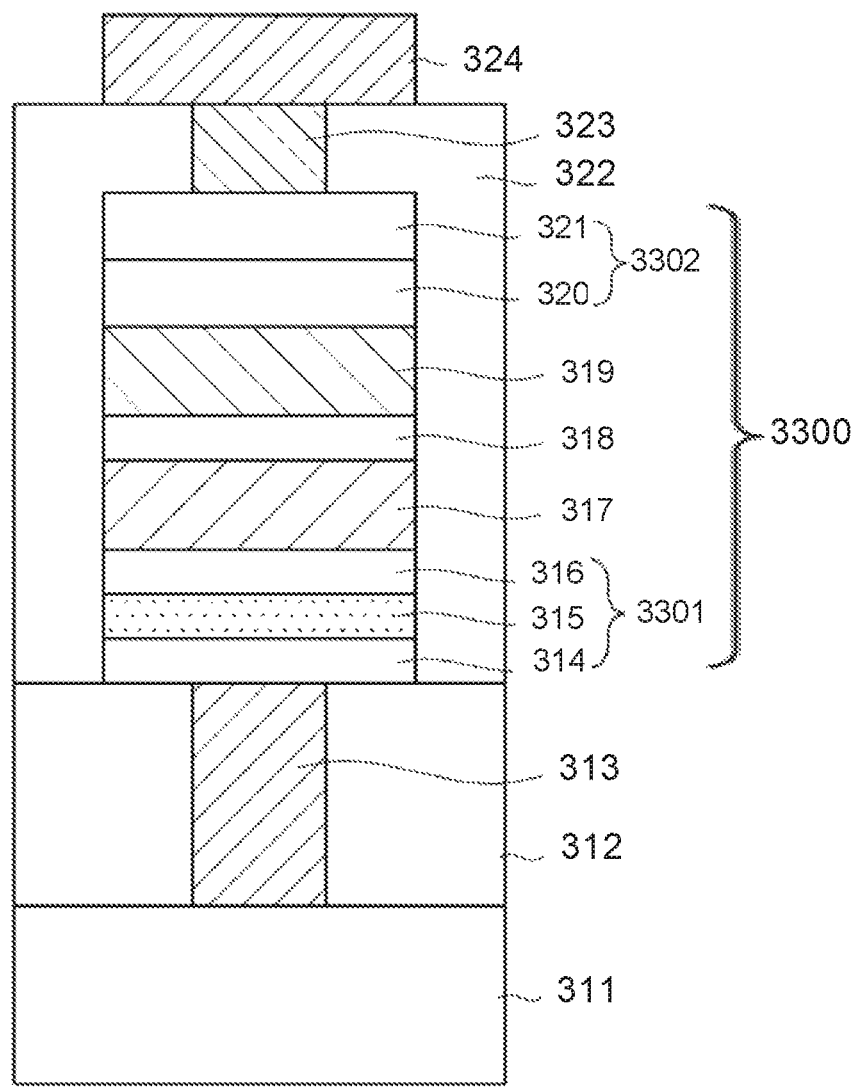

As illustrated in FIG. 17E, a second interlayer dielectric layer 322 may be formed over the first interlayer dielectric layer 312. The second interlayer dielectric layer 322 may be formed to a thickness to fill the space between the variable resistance elements 3300 or surround at least a portion of the variable resistance element. For example, the second interlayer dielectric layer 322 may be formed to have a higher level than the top surface of the variable resistance element 3300. The height of the second interlayer dielectric layer may be determined in consideration of the height of a top electrode contact, which will be formed in a following process, to surround the top electrode contact. The second interlayer dielectric layer 322 may include any single layer including oxide, nitride, or oxynitride or a stacked structure thereof.

Then, a top electrode contact 323 may be formed to be coupled to the variable resistance element 3300 through the second interlayer dielectric layer 322 over the variable resistance element 3300. The top electrode contact 323 may be formed by the following process: the second interlayer dielectric layer 322 is etched to form a contact hole exposing the top of the variable resistance element 3300, and a conductive material is buried in the contact hole. The top electrode contact 323 may serve to electrically couple the variable resistance element 3300 and a conductive line 324 to be formed through a subsequence process, and simultaneously serve as an electrode for the variable resistance element 3300. The top electrode contact 323 may be formed of or include the same material as the bottom electrode contact 313.

Then, the conductive line 324 may be formed over the second interlayer dielectric layer 322. The conductive line 324 may be electrically coupled to the variable resistance element 300 through the top electrode contact 323. The conductive line 324 coupled to the variable resistance element 3300 may serve as a bit line. The conductive line 324 may include a metal layer. The metal layer may indicate a conductive layer including a metal element, and include a metal, a metal oxide, a metal oxynitride, or a metal silicide and the like.

In accordance with various implementations of the disclosed technology, the electronic device and the method for fabricating the same can improve the characteristic of the variable resistance element.

Section 5: Other Embodiments

Various features disclosed in connection with specific implementations as discussed above in FIGS. 1-17E can be selectively combined in different ways, configurations or combinations to achieve desired characteristics of variable resistance elements or to facilitate the fabrication of the variable resistance elements. For example, the embodiments of the variable resistance element including the seed layer, which are shown in FIGS. 1 and 2, can be combined with various embodiments including at least one of the bottom layer as shown in FIG. 5F or 6D, the lower layer as shown in FIG. 9D or 12B, the lower patterns as shown in FIG. 10E or 13B, or the under layer as shown in FIG. 14, 16 or 17E. Further, the embodiment of the variable resistance element including the seed layer, which are shown in FIGS. 1 and 2, can be combined with the insulating spacer as shown in FIG. 9D, 10E, 11B or 12B or 13B. Further, other combinations also can be made such that the bottom layer as shown in FIG. 5F or 6D or the lower layer in FIG. 9D or 12B has the dual phase structure as shown in FIG. 14, 16 or 17E. Also, additional or other combinations of different implementations are still possible and the present disclosure can be read to cover all possible combinations of various implementations discussed here.

The above and other memory circuits or semiconductor devices based on the disclosed technology can be used in a range of devices or systems. FIGS. 18-22 provide some examples of devices or systems that can implement the memory circuits disclosed herein.

Figure 18:
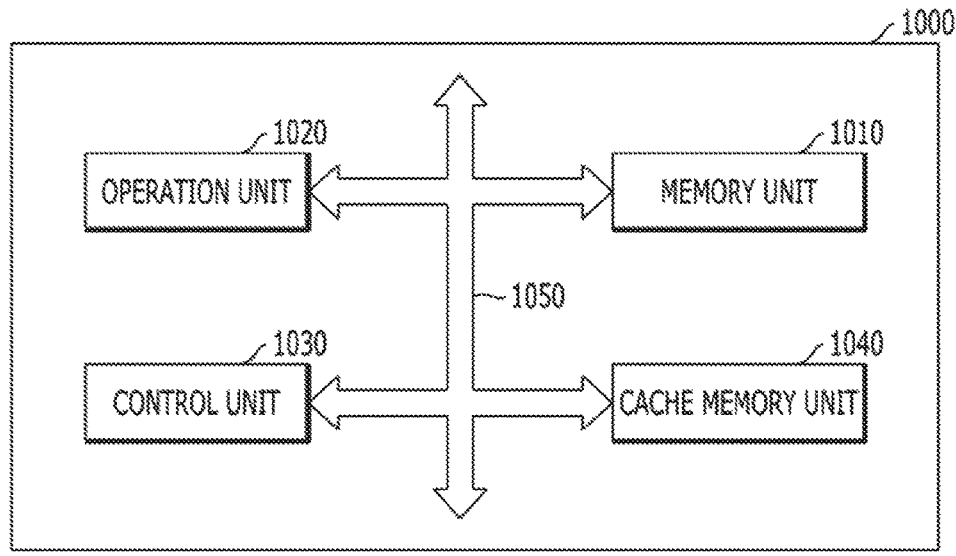
FIG. 18 is an example of configuration diagram of a microprocessor implementing memory circuitry based on the disclosed technology.

FIG. 18 is an example of configuration diagram of a microprocessor implementing memory circuitry based on the disclosed technology.

Referring to FIG. 18, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 19:
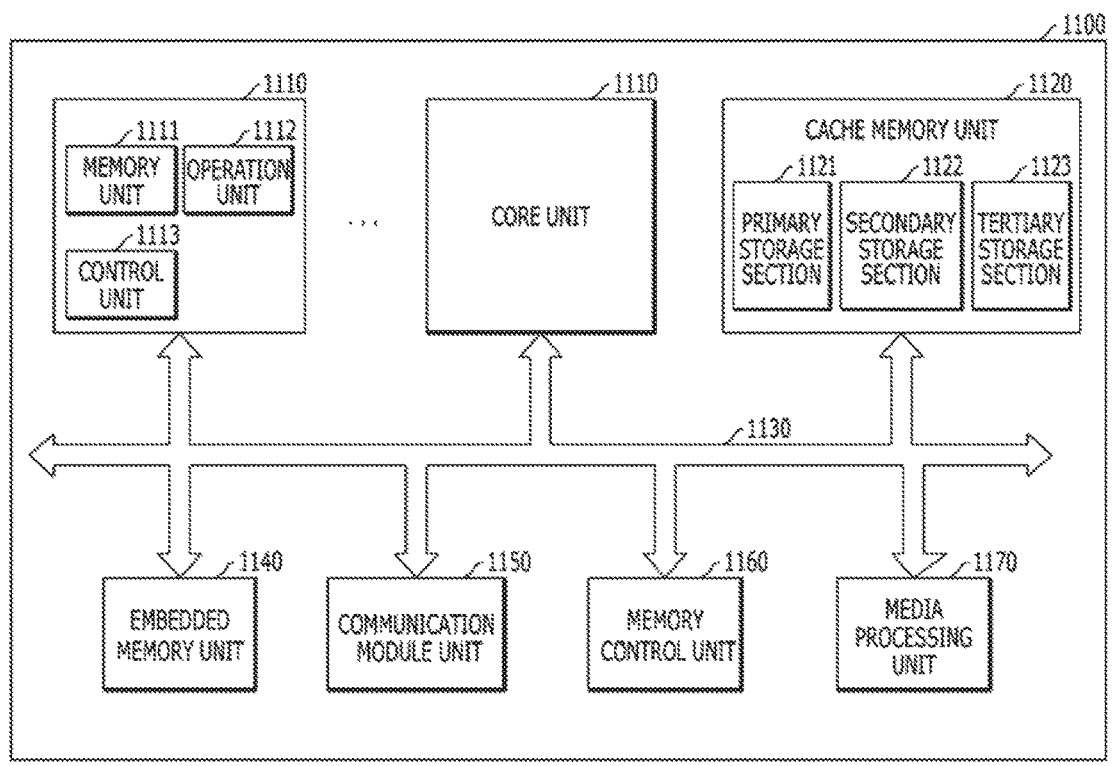
FIG. 19 is an example of configuration diagram of a processor implementing memory circuitry based on the disclosed technology.

FIG. 19 is an example of configuration diagram of a processor implementing memory circuitry based on the disclosed technology.

Referring to FIG. 19, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 19 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 20:
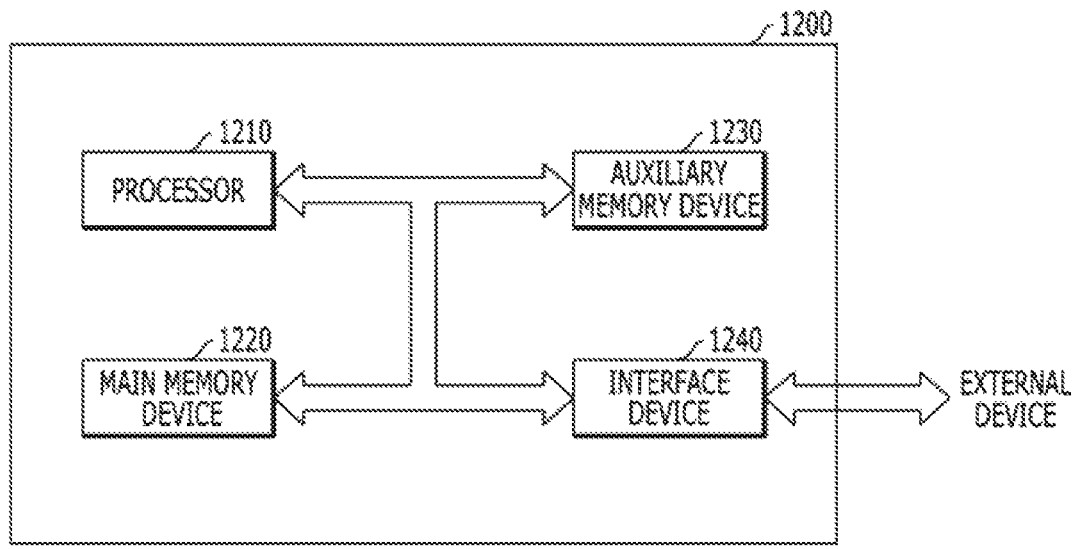
FIG. 20 is an example of configuration diagram of a system implementing memory circuitry based on the disclosed technology.

FIG. 20 is an example of configuration diagram of a system implementing memory circuitry based on the disclosed technology.

Referring to FIG. 20, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 21) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 21) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 21:
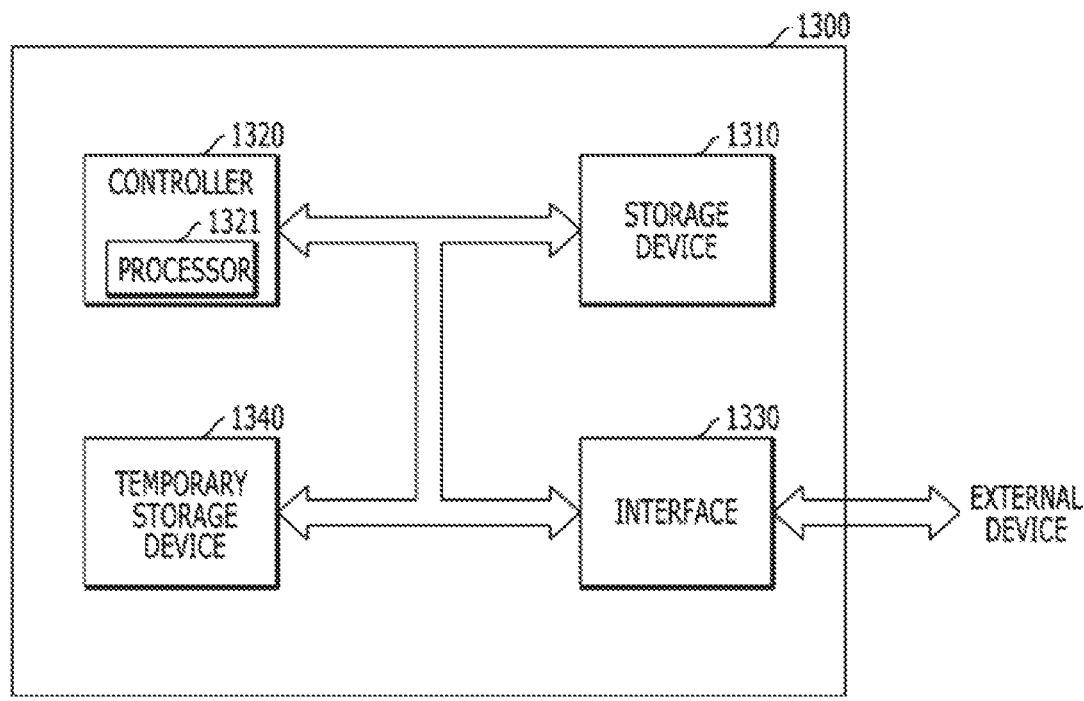
FIG. 21 is an example of configuration diagram of a data storage system implementing memory circuitry based on the disclosed technology.

FIG. 21 is an example of configuration diagram of a data storage system implementing memory circuitry based on the disclosed technology.

Referring to FIG. 21, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 22:
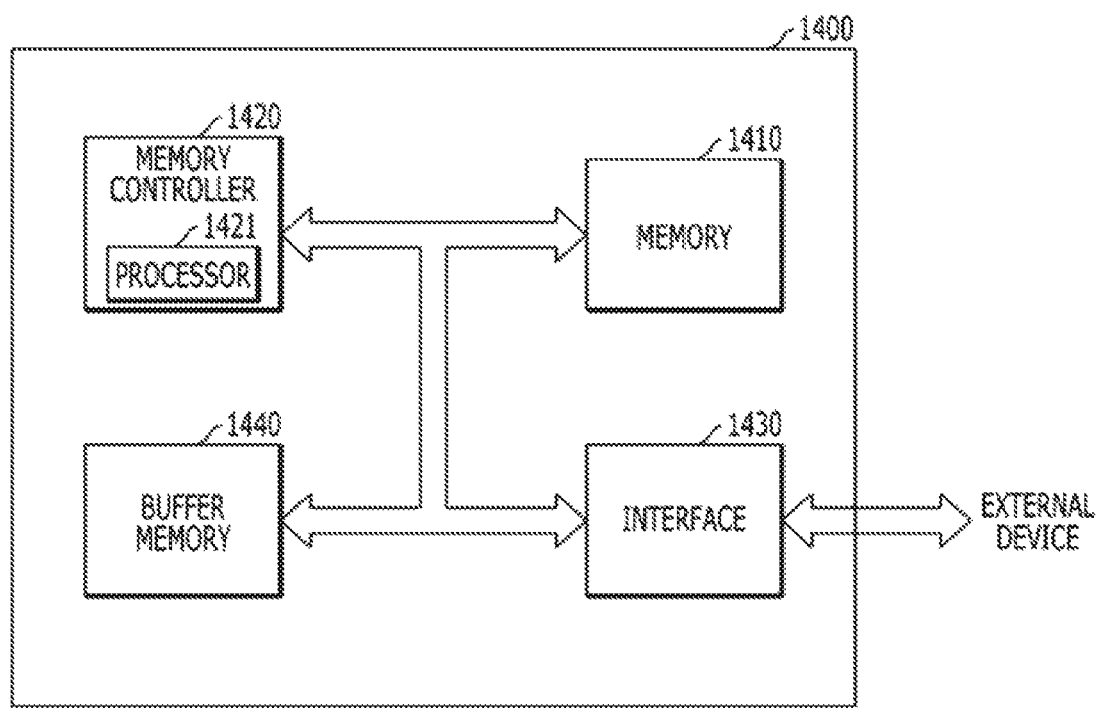
FIG. 22 is an example of configuration diagram of a memory system implementing memory circuitry based on the disclosed technology.

FIG. 22 is an example of configuration diagram of a memory system implementing memory circuitry based on the disclosed technology.

Referring to FIG. 22, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an under layer including first and second metal layers; a first magnetic layer positioned over the under layer and having a variable magnetization direction; a tunnel barrier layer positioned over the first magnetic layer; and a second magnetic layer positioned over the tunnel barrier layer and having a pinned magnetization direction, and the under layer may further include a barrier layer having a dual phase structure between the first and second metal layers. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 18-22 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed are techniques and structures as described and shown, including:

1. An electronic device comprising a semiconductor memory unit that includes:
   a substrate;
   an interlayer dielectric layer disposed over the substrate and having a recess;
   a contact formed in the recess; and
   a variable resistance element including a seed layer formed over the interlayer dielectric layer, a first magnetic layer formed over the seed layer, a tunnel barrier layer formed over the first magnetic layer, and a second magnetic layer formed over the tunnel barrier layer,
   wherein the seed layer to improve the anisotropy energy of the first magnetic layer includes a conductive material having a metallic property and an oxygen content of 1% to approximately 10%.

2. The electronic device of claim 1, wherein the seed layer includes conductive hafnium silicate.

3. The electronic device of claim 1, wherein the variable resistance element further includes a bottom layer formed within the interlayer dielectric layer.

4. The electronic device of claim 3, wherein the bottom layer includes first and second material layers and a barrier layer interposed between the first and second material layers and the barrier layer has a dual phase structure.

5. The electronic device of claim 4, wherein the first material layer including HfN, TiN, MoN, ZrN, or MgO and the second material layer including AlN, AgI, ZnO, CdS, CdSe, a-SiC, GaN, or BN.

6. The electronic device of claim 1, wherein the semiconductor memory further includes: a spacer formed on a sidewall of the variable resistance element.

7. The electronic device of claim 6, wherein the spacer including a metal having a higher electron affinity than a component included in the tunnel barrier layer, the first magnetic layer and second magnetic layer.

* * * * *